United States Patent
Yasumoto et al.

(10) Patent No.: US 11,355,382 B2
(45) Date of Patent: Jun. 7, 2022

(54) PEELING METHOD, SEMICONDUCTOR DEVICE, AND PEELING APPARATUS

(71) Applicant: Semiconductor Energy Laboratory Co., Ltd., Atsugi (JP)

(72) Inventors: Seiji Yasumoto, Tochigi (JP); Masataka Sato, Tochigi (JP); Shingo Eguchi, Atsugi (JP); Kunihiko Suzuki, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 229 days.

(21) Appl. No.: 16/850,185

(22) Filed: Apr. 16, 2020

(65) Prior Publication Data

US 2020/0243371 A1 Jul. 30, 2020

Related U.S. Application Data

(62) Division of application No. 15/909,173, filed on Mar. 1, 2018, now Pat. No. 10,636,692, which is a division
(Continued)

(30) Foreign Application Priority Data

Feb. 20, 2013 (JP) .................................. 2013-031401

(51) Int. Cl.
*H01L 21/683* (2006.01)
*H01L 21/67* (2006.01)
(Continued)

(52) U.S. Cl.
CPC .... *H01L 21/6836* (2013.01); *H01L 21/67132* (2013.01); *H01L 21/6835* (2013.01);
(Continued)

(58) Field of Classification Search
CPC ........... H01L 21/6836; H01L 21/67132; H01L 21/6835; H01L 29/786; H01L 51/003;
(Continued)

(56) References Cited

U.S. PATENT DOCUMENTS 4,722,765 A 2/1988 Ambros et al.
4,883,561 A 11/1989 Gmitter et al.
(Continued)

FOREIGN PATENT DOCUMENTS

CN 001397984 A 2/2003
CN 001893139 A 1/2007
(Continued)

OTHER PUBLICATIONS

International Search Report (Application No. PCT/JP2014/053958) dated Jun. 3, 2014.
(Continued)

*Primary Examiner* — Vu A Vu
(74) *Attorney, Agent, or Firm* — Robinson Intellectual Property Law Office; Eric J. Robinson

(57) ABSTRACT

To improve peelability, yield in a peeling step, and yield in manufacturing a flexible device. A peeling method is employed which includes a first step of forming a peeling layer containing tungsten over a support substrate; a second step of forming, over the peeling layer, a layer to be peeled formed of a stack including a first layer containing silicon oxynitride and a second layer containing silicon nitride in this order and forming an oxide layer containing tungsten oxide between the peeling layer and the layer to be peeled; a third step of forming a compound containing tungsten and nitrogen in the oxide layer by heat treatment; and a fourth step of peeling the peeling layer from the layer to be peeled at the oxide layer.

5 Claims, 30 Drawing Sheets

Related U.S. Application Data of application No. 14/182,834, filed on Feb. 18, 2014, now Pat. No. 9,947,568.

(51) Int. Cl.
- *H01L 51/00* (2006.01)
- *H01L 29/786* (2006.01)
- *B32B 38/10* (2006.01)
- *H01L 51/50* (2006.01)

(52) U.S. Cl.
CPC .......... *H01L 29/786* (2013.01); *H01L 51/003* (2013.01); *B32B 38/10* (2013.01); *H01L 51/0097* (2013.01); *H01L 51/50* (2013.01); *H01L 2221/6835* (2013.01); *H01L 2221/68318* (2013.01); *H01L 2221/68363* (2013.01); *H01L 2221/68381* (2013.01); *H01L 2221/68386* (2013.01); *Y10T 156/1712* (2015.01)

(58) Field of Classification Search
CPC ................. H01L 51/0097; H01L 51/50; H01L 2221/68318; H01L 2221/6835; H01L 2221/68363; H01L 2221/68381; H01L 2221/68386; B32B 38/10; Y10T 156/1712; Y02E 10/549; Y02P 70/50
USPC .......................................................... 257/43
See application file for complete search history.

(56) References Cited

U.S. PATENT DOCUMENTS

| | | |
|---|---|---|
| 5,107,175 A | 4/1992 | Hirano et al. |
| 5,124,204 A | 6/1992 | Yamashita et al. |
| 5,156,720 A | 10/1992 | Rosenfeld et al. |
| 5,189,405 A | 2/1993 | Yamashita et al. |
| 5,206,749 A | 4/1993 | Zavracky et al. |
| 5,256,562 A | 10/1993 | Vu et al. |
| 5,258,320 A | 11/1993 | Zavracky et al. |
| 5,258,325 A | 11/1993 | Spitzer et al. |
| 5,273,475 A | 12/1993 | Oshikawa |
| 5,291,098 A | 3/1994 | Okita et al. |
| 5,300,166 A | 4/1994 | Aihara et al. |
| 5,300,788 A | 4/1994 | Fan et al. |
| 5,317,236 A | 5/1994 | Zavracky et al. |
| 5,317,436 A | 5/1994 | Spitzer et al. |
| 5,331,149 A | 7/1994 | Spitzer et al. |
| 5,341,015 A | 8/1994 | Kohno |
| 5,362,671 A | 11/1994 | Zavracky et al. |
| 5,376,561 A | 12/1994 | Vu et al. |
| 5,376,979 A | 12/1994 | Zavracky et al. |
| 5,377,031 A | 12/1994 | Vu et al. |
| 5,391,257 A | 2/1995 | Sullivan et al. |
| 5,396,304 A | 3/1995 | Salerno et al. |
| 5,397,713 A | 3/1995 | Hamamoto et al. |
| 5,420,055 A | 5/1995 | Vu et al. |
| 5,438,241 A | 8/1995 | Zavracky et al. |
| 5,444,557 A | 8/1995 | Spitzer et al. |
| 5,453,405 A | 9/1995 | Fan et al. |
| 5,459,335 A | 10/1995 | Matsushita et al. |
| 5,467,154 A | 11/1995 | Gale et al. |
| 5,475,514 A | 12/1995 | Salerno et al. |
| 5,499,124 A | 3/1996 | Vu et al. |
| 5,528,397 A | 6/1996 | Zavracky et al. |
| 5,539,550 A | 7/1996 | Spitzer et al. |
| 5,578,865 A | 11/1996 | Vu et al. |
| 5,581,385 A | 12/1996 | Spitzer et al. |
| 5,583,335 A | 12/1996 | Spitzer et al. |
| 5,589,406 A | 12/1996 | Kato et al. |
| 5,650,363 A | 7/1997 | Endroes et al. |
| 5,654,811 A | 8/1997 | Spitzer et al. |
| 5,661,371 A | 8/1997 | Salerno et al. |
| 5,666,175 A | 9/1997 | Spitzer et al. |
| 5,674,304 A | 10/1997 | Fukada et al. |
| 5,686,360 A | 11/1997 | Harvey et al. |
| 5,692,820 A | 12/1997 | Gale et al. |
| 5,693,956 A | 12/1997 | Shi et al. |
| 5,702,963 A | 12/1997 | Vu et al. |
| 5,705,424 A | 1/1998 | Zavracky et al. |
| 5,713,652 A | 2/1998 | Zavracky et al. |
| 5,736,768 A | 4/1998 | Zavracky et al. |
| 5,743,614 A | 4/1998 | Salerno et al. |
| 5,751,261 A | 5/1998 | Zavracky et al. |
| 5,757,126 A | 5/1998 | Harvey, III et al. |
| 5,757,445 A | 5/1998 | Vu et al. |
| 5,757,456 A | 5/1998 | Yamazaki et al. |
| 5,771,562 A | 6/1998 | Harvey, III et al. |
| 5,781,164 A | 7/1998 | Jacobsen et al. |
| 5,789,763 A | 8/1998 | Kato et al. |
| 5,807,440 A | 9/1998 | Kubota et al. |
| 5,811,177 A | 9/1998 | Shi et al. |
| 5,815,223 A | 9/1998 | Watanabe et al. |
| 5,817,548 A | 10/1998 | Noguchi et al. |
| 5,821,138 A | 10/1998 | Yamazaki et al. |
| 5,834,327 A | 11/1998 | Yamazaki et al. |
| 5,851,862 A | 12/1998 | Ohtani et al. |
| 5,861,929 A | 1/1999 | Spitzer |
| 5,879,741 A | 3/1999 | Itoh |
| 5,883,437 A | 3/1999 | Maruyama et al. |
| 5,888,712 A | 3/1999 | Lelental et al. |
| 5,895,228 A | 4/1999 | Biebuyck et al. |
| 5,929,961 A | 7/1999 | Nishi et al. |
| 5,943,593 A | 8/1999 | Noguchi et al. |
| 5,952,778 A | 9/1999 | Haskal et al. |
| 5,956,181 A | 9/1999 | Lin |
| 5,981,306 A | 11/1999 | Burrows et al. |
| 5,990,542 A | 11/1999 | Yamazaki |
| 6,013,346 A | 1/2000 | Lewis et al. |
| 6,013,982 A | 1/2000 | Thompson et al. |
| 6,020,271 A | 2/2000 | Yanagida |
| 6,027,958 A | 2/2000 | Vu et al. |
| 6,033,974 A | 3/2000 | Henley et al. |
| 6,043,800 A | 3/2000 | Spitzer et al. |
| 6,059,913 A | 5/2000 | Asmussen et al. |
| 6,072,445 A | 6/2000 | Spitzer et al. |
| 6,080,663 A | 6/2000 | Chen et al. |
| 6,096,581 A | 8/2000 | Zhang et al. |
| 6,100,166 A | 8/2000 | Sakaguchi et al. |
| 6,118,502 A | 9/2000 | Yamazaki et al. |
| 6,121,950 A | 9/2000 | Zavracky et al. |
| 6,127,199 A | 10/2000 | Inoue et al. |
| 6,133,071 A | 10/2000 | Nagai |
| 6,140,980 A | 10/2000 | Spitzer et al. |
| 6,143,582 A | 11/2000 | Vu et al. |
| 6,146,225 A | 11/2000 | Sheats et al. |
| 6,150,187 A | 11/2000 | Zyung et al. |
| 6,152,068 A | 11/2000 | Colson et al. |
| 6,160,346 A | 12/2000 | Vleggaar et al. |
| 6,190,937 B1 | 2/2001 | Nakagawa et al. |
| 6,198,217 B1 | 3/2001 | Suzuki et al. |
| 6,198,220 B1 | 3/2001 | Jones et al. |
| 6,204,610 B1 | 3/2001 | Komiya |
| 6,221,738 B1 | 4/2001 | Sakaguchi et al. |
| 6,232,136 B1 | 5/2001 | Zavracky et al. |
| 6,239,470 B1 | 5/2001 | Yamazaki |
| 6,245,393 B1 | 6/2001 | Thompson et al. |
| 6,246,169 B1 | 6/2001 | Pruvot |
| 6,258,666 B1 | 7/2001 | Mizutani et al. |
| 6,261,634 B1 | 7/2001 | Itoh |
| 6,268,695 B1 | 7/2001 | Affinito |
| 6,300,612 B1 | 10/2001 | Yu |
| 6,310,362 B1 | 10/2001 | Takemura |
| 6,317,175 B1 | 11/2001 | Salerno et al. |
| 6,320,568 B1 | 11/2001 | Zavracky |
| 6,320,640 B2 | 11/2001 | Nishi et al. |
| 6,339,010 B2 | 1/2002 | Sameshima |
| 6,340,641 B1 | 1/2002 | Muraguchi et al. |
| 6,362,866 B1 | 3/2002 | Yamazaki et al. |
| 6,372,608 B1 | 4/2002 | Shimoda et al. |
| 6,376,333 B1 | 4/2002 | Yamazaki et al. |
| 6,391,220 B1 | 5/2002 | Zhang et al. |
| 6,403,985 B1 | 6/2002 | Fan et al. |
| 6,413,645 B1 | 7/2002 | Graff et al. |
| 6,414,783 B2 | 7/2002 | Zavracky et al. |

(56) References Cited

U.S. PATENT DOCUMENTS

| | | |
|---|---|---|
| 6,420,283 B1 | 7/2002 | Ogawa et al. |
| 6,423,614 B1 | 7/2002 | Doyle |
| 6,424,020 B1 | 7/2002 | Vu et al. |
| 6,429,095 B1 | 8/2002 | Sakaguchi et al. |
| 6,432,516 B1 | 8/2002 | Terasaki et al. |
| 6,441,468 B1 | 8/2002 | Yamazaki |
| 6,448,152 B1 | 9/2002 | Henley et al. |
| 6,455,397 B1 | 9/2002 | Belford |
| 6,486,041 B2 | 11/2002 | Henley et al. |
| 6,486,929 B1 | 11/2002 | Vu et al. |
| 6,492,026 B1 | 12/2002 | Graff et al. |
| 6,504,524 B1 | 1/2003 | Gates et al. |
| 6,506,664 B1 | 1/2003 | Beyne et al. |
| 6,509,282 B1 | 1/2003 | Ngo et al. |
| 6,511,187 B1 | 1/2003 | Salerno et al. |
| 6,512,624 B2 | 1/2003 | Tonar et al. |
| 6,515,417 B1 | 2/2003 | Duggal et al. |
| 6,521,511 B1 | 2/2003 | Inoue et al. |
| 6,521,940 B1 | 2/2003 | Vu et al. |
| 6,522,067 B1 | 2/2003 | Graff et al. |
| 6,531,997 B1 | 3/2003 | Gates et al. |
| 6,534,382 B1 | 3/2003 | Sakaguchi et al. |
| 6,544,430 B2 | 4/2003 | Mccormack et al. |
| 6,558,008 B1 | 5/2003 | Salerno et al. |
| 6,566,808 B1 | 5/2003 | Duggal et al. |
| 6,572,780 B2 | 6/2003 | Mccormack et al. |
| 6,582,996 B1 | 6/2003 | Hara et al. |
| 6,593,978 B2 | 7/2003 | Vu et al. |
| 6,608,654 B2 | 8/2003 | Zavracky et al. |
| 6,627,518 B1 | 9/2003 | Inoue et al. |
| 6,627,953 B1 | 9/2003 | Vu et al. |
| 6,632,708 B2 | 10/2003 | Sakama et al. |
| 6,636,185 B1 | 10/2003 | Spitzer et al. |
| 6,642,542 B1 | 11/2003 | Shimoda et al. |
| 6,645,830 B2 | 11/2003 | Shimoda et al. |
| 6,649,433 B2 | 11/2003 | Mikhael et al. |
| 6,661,029 B1 | 12/2003 | Duggal |
| 6,664,169 B1 | 12/2003 | Iwasaki et al. |
| 6,664,730 B2 | 12/2003 | Weaver |
| 6,680,577 B1 | 1/2004 | Inukai et al. |
| 6,682,963 B1 | 1/2004 | Ishikawa |
| 6,682,990 B1 | 1/2004 | Iwane et al. |
| 6,683,333 B2 | 1/2004 | Kazlas et al. |
| RE38,466 E | 3/2004 | Inoue et al. |
| 6,700,322 B1 | 3/2004 | Duggal et al. |
| 6,700,631 B1 | 3/2004 | Inoue et al. |
| 6,707,160 B2 | 3/2004 | Yamaji |
| 6,737,285 B2 | 5/2004 | Iketani et al. |
| 6,737,753 B2 | 5/2004 | Kumar et al. |
| 6,753,212 B2 | 6/2004 | Yamazaki et al. |
| 6,774,010 B2 | 8/2004 | Chu et al. |
| 6,777,871 B2 | 8/2004 | Duggal et al. |
| 6,781,152 B2 | 8/2004 | Yamazaki |
| 6,784,113 B2 | 8/2004 | Hembree |
| 6,790,747 B2 | 9/2004 | Henley et al. |
| 6,800,999 B1 | 10/2004 | Duggal et al. |
| 6,802,926 B2 | 10/2004 | Mizutani et al. |
| 6,814,832 B2 | 11/2004 | Utsunomiya |
| 6,815,240 B2 | 11/2004 | Hayashi |
| 6,818,530 B2 | 11/2004 | Shimoda et al. |
| 6,821,553 B2 | 11/2004 | Miyashita et al. |
| 6,830,494 B1 | 12/2004 | Yamazaki et al. |
| 6,833,156 B2 | 12/2004 | Miyashita et al. |
| 6,838,192 B2 | 1/2005 | Miyashita et al. |
| 6,841,949 B2 | 1/2005 | Duggal |
| 6,863,961 B2 | 3/2005 | Miyashita et al. |
| 6,867,539 B1 | 3/2005 | Mccormick et al. |
| 6,875,671 B2 | 4/2005 | Faris |
| 6,878,607 B2 | 4/2005 | Inoue et al. |
| 6,882,102 B2 | 4/2005 | Yamazaki |
| 6,885,389 B2 | 4/2005 | Inoue et al. |
| 6,919,935 B2 | 7/2005 | Vu et al. |
| 6,940,223 B2 | 9/2005 | Yamazaki |
| 6,943,369 B2 | 9/2005 | Hayashi |
| 6,945,678 B2 | 9/2005 | Sugihara et al. |
| 6,946,361 B2 | 9/2005 | Takayama et al. |
| 6,953,735 B2 | 10/2005 | Yamazaki et al. |
| 6,965,195 B2 | 11/2005 | Yamazaki et al. |
| 6,967,114 B2 | 11/2005 | Shimoda et al. |
| 6,974,731 B2 | 12/2005 | Yamazaki et al. |
| 6,982,209 B2 | 1/2006 | Chen et al. |
| 6,998,282 B1 | 2/2006 | Yamazaki et al. |
| 7,045,438 B2 | 5/2006 | Yamazaki et al. |
| 7,045,442 B2 | 5/2006 | Maruyama et al. |
| 7,050,138 B1 | 5/2006 | Yamazaki et al. |
| 7,052,978 B2 | 5/2006 | Shaheen et al. |
| 7,060,153 B2 | 6/2006 | Yamazaki et al. |
| 7,061,186 B2 | 6/2006 | Inukai et al. |
| 7,075,501 B1 | 7/2006 | Spitzer et al. |
| 7,091,070 B2 | 8/2006 | Imai et al. |
| 7,094,665 B2 | 8/2006 | Shimoda et al. |
| 7,119,364 B2 | 10/2006 | Yamazaki |
| 7,122,445 B2 | 10/2006 | Takayama et al. |
| 7,147,740 B2 | 12/2006 | Takayama et al. |
| 7,180,091 B2 | 2/2007 | Yamazaki et al. |
| 7,189,631 B2 | 3/2007 | Yamazaki et al. |
| 7,198,533 B2 | 4/2007 | Duggal et al. |
| 7,214,555 B2 | 5/2007 | Yamazaki et al. |
| 7,271,858 B2 | 9/2007 | Yamazaki et al. |
| 7,285,476 B2 | 10/2007 | Shimoda et al. |
| 7,332,381 B2 | 2/2008 | Maruyama et al. |
| 7,335,573 B2 * | 2/2008 | Takayama ......... H01L 21/76251 438/455 |
| 7,351,300 B2 | 4/2008 | Takayama et al. |
| 7,361,519 B2 | 4/2008 | Yamazaki et al. |
| 7,375,782 B2 | 5/2008 | Yamazaki et al. |
| 7,407,870 B2 | 8/2008 | Maruyama et al. |
| 7,425,931 B1 | 9/2008 | Yamazaki et al. |
| 7,442,957 B2 | 10/2008 | Yamazaki et al. |
| 7,446,843 B2 | 11/2008 | Yamazaki et al. |
| RE40,601 E | 12/2008 | Inoue et al. |
| 7,465,674 B2 | 12/2008 | Tamura et al. |
| 7,468,308 B2 | 12/2008 | Shimoda |
| 7,479,442 B2 | 1/2009 | Noguchi et al. |
| 7,482,248 B2 | 1/2009 | Tamura |
| 7,483,091 B1 | 1/2009 | Yamazaki et al. |
| 7,521,383 B2 | 4/2009 | Morisue et al. |
| 7,612,753 B2 | 11/2009 | Koyama |
| 7,660,145 B2 | 2/2010 | Nomura |
| 7,723,209 B2 * | 5/2010 | Maruyama ............... H01L 33/62 438/458 |
| 7,745,991 B2 | 6/2010 | Yamazaki et al. |
| 7,777,409 B2 | 8/2010 | Yamazaki et al. |
| 7,825,002 B2 | 11/2010 | Takayama et al. |
| 7,855,153 B2 | 12/2010 | Ichijo et al. |
| 7,973,313 B2 | 7/2011 | Arai et al. |
| 8,040,469 B2 | 10/2011 | Nakamura et al. |
| 8,043,936 B2 | 10/2011 | Eguchi et al. |
| 8,048,770 B2 | 11/2011 | Eguchi et al. |
| 8,048,777 B2 | 11/2011 | Eguchi et al. |
| 8,137,417 B2 | 3/2012 | Eguchi et al. |
| 8,193,532 B2 | 6/2012 | Arai et al. |
| 8,247,246 B2 * | 8/2012 | Maruyama .......... H01L 27/1266 438/26 |
| 8,324,699 B2 | 12/2012 | Ichijo et al. |
| 8,344,992 B2 | 1/2013 | Koyama |
| 8,367,440 B2 | 2/2013 | Takayama et al. |
| 8,371,891 B2 | 2/2013 | Nakamura et al. |
| 8,415,208 B2 | 4/2013 | Takayama et al. |
| 8,691,604 B2 | 4/2014 | Maruyama et al. |
| 8,911,583 B2 | 12/2014 | Jakob |
| 9,053,401 B2 | 6/2015 | Watanabe et al. |
| 9,054,141 B2 | 6/2015 | Eguchi et al. |
| 9,269,817 B2 | 2/2016 | Maruyama et al. |
| 9,472,429 B2 | 10/2016 | Eguchi et al. |
| 9,543,337 B2 | 1/2017 | Maruyama et al. |
| 9,676,175 B2 | 6/2017 | Adachi et al. |
| 2001/0001050 A1 | 5/2001 | Miyashita et al. |
| 2001/0004121 A1 | 6/2001 | Sakama et al. |
| 2001/0009691 A1 | 7/2001 | Thompson et al. |
| 2001/0012677 A1 | 8/2001 | Sameshima |
| 2001/0022362 A1 | 9/2001 | Hayashi |
| 2001/0025692 A1 | 10/2001 | Lien |
| 2001/0030020 A1 | 10/2001 | Nandy et al. |

(56) References Cited

U.S. PATENT DOCUMENTS

| | | |
|---|---|---|
| 2001/0030871 A1 | 10/2001 | Anderson, Jr. et al. |
| 2001/0033135 A1 | 10/2001 | Duggal et al. |
| 2001/0033347 A1 | 10/2001 | Kitahora et al. |
| 2001/0035863 A1 | 11/2001 | Kimura |
| 2001/0040645 A1 | 11/2001 | Yamazaki |
| 2002/0003201 A1 | 1/2002 | Yu |
| 2002/0004250 A1 | 1/2002 | Iketani et al. |
| 2002/0004292 A1 | 1/2002 | Yamazaki et al. |
| 2002/0030189 A1 | 3/2002 | Ishikawa |
| 2002/0041926 A1 | 4/2002 | Miyashita et al. |
| 2002/0048864 A1 | 4/2002 | Yamazaki et al. |
| 2002/0050958 A1 | 5/2002 | Matthies et al. |
| 2002/0106522 A1 | 8/2002 | Mccormack et al. |
| 2002/0117256 A1 | 8/2002 | Mccormack et al. |
| 2002/0136823 A1 | 9/2002 | Miyashita et al. |
| 2002/0146893 A1 | 10/2002 | Shimoda et al. |
| 2002/0155215 A1 | 10/2002 | Miyashita et al. |
| 2002/0190661 A1 | 12/2002 | Duggal et al. |
| 2003/0008437 A1 | 1/2003 | Inoue et al. |
| 2003/0020084 A1 | 1/2003 | Fan et al. |
| 2003/0024635 A1 | 2/2003 | Utsunomiya |
| 2003/0025118 A1 | 2/2003 | Yamazaki et al. |
| 2003/0025146 A1 | 2/2003 | Narwankar et al. |
| 2003/0032210 A1 | 2/2003 | Takayama et al. |
| 2003/0040164 A1 | 2/2003 | Inoue et al. |
| 2003/0041894 A1 | 3/2003 | Sverdrup, Jr. et al. |
| 2003/0047280 A1 | 3/2003 | Takayama et al. |
| 2003/0047732 A1 | 3/2003 | Yamazaki et al. |
| 2003/0054186 A1 | 3/2003 | Miyashita et al. |
| 2003/0057425 A1 | 3/2003 | Zavracky et al. |
| 2003/0059990 A1 | 3/2003 | Yamazaki |
| 2003/0062845 A1 | 4/2003 | Yamazaki et al. |
| 2003/0064569 A1 | 4/2003 | Takayama et al. |
| 2003/0068525 A1 | 4/2003 | Bellmann et al. |
| 2003/0071953 A1 | 4/2003 | Yamazaki et al. |
| 2003/0075733 A1 | 4/2003 | Yamazaki et al. |
| 2003/0082889 A1 | 5/2003 | Maruyama et al. |
| 2003/0100169 A1 | 5/2003 | Tanaka et al. |
| 2003/0117369 A1 | 6/2003 | Spitzer et al. |
| 2003/0197197 A1 | 10/2003 | Brown et al. |
| 2003/0203547 A1 | 10/2003 | Sakaguchi et al. |
| 2003/0224582 A1 | 12/2003 | Shimoda et al. |
| 2004/0014252 A1 | 1/2004 | Shimoda et al. |
| 2004/0056180 A1 | 3/2004 | Yu |
| 2004/0085292 A1 | 5/2004 | Spitzer et al. |
| 2004/0087110 A1 | 5/2004 | Takayama et al. |
| 2004/0106237 A1 | 6/2004 | Yamazaki |
| 2004/0129960 A1 | 7/2004 | Maruyama et al. |
| 2004/0219762 A1 | 11/2004 | Shimoda et al. |
| 2005/0006647 A1 | 1/2005 | Utsunomiya |
| 2005/0017255 A1 | 1/2005 | Yamazaki |
| 2005/0042477 A1 | 2/2005 | Miyashita et al. |
| 2005/0070038 A1 | 3/2005 | Yamazaki et al. |
| 2005/0090075 A1 | 4/2005 | Takayama et al. |
| 2006/0055314 A1 | 3/2006 | Nakamura et al. |
| 2006/0068533 A1 | 3/2006 | Utsunomiya |
| 2006/0110863 A1 | 5/2006 | Yamamoto et al. |
| 2006/0125410 A1 | 6/2006 | Duggal et al. |
| 2006/0181205 A1 | 8/2006 | Pi et al. |
| 2007/0001167 A1 | 1/2007 | Nomura |
| 2007/0037337 A1 | 2/2007 | Takahashi et al. |
| 2007/0056682 A1 | 3/2007 | Yamada et al. |
| 2007/0082430 A1 | 4/2007 | Yamazaki |
| 2007/0147129 A1 | 6/2007 | Kato |
| 2007/0212853 A1 | 9/2007 | Maruyama et al. |
| 2007/0222397 A1 | 9/2007 | Shiang et al. |
| 2008/0049437 A1 | 2/2008 | Takayama et al. |
| 2008/0074273 A1 | 3/2008 | Endo et al. |
| 2008/0113486 A1 | 5/2008 | Eguchi et al. |
| 2008/0169349 A1 | 7/2008 | Suzuki et al. |
| 2008/0188022 A1 | 8/2008 | Yamazaki et al. |
| 2008/0309585 A1 | 12/2008 | Yamazaki et al. |
| 2009/0020751 A1 | 1/2009 | Seki et al. |
| 2009/0023251 A1 | 1/2009 | Eguchi et al. |
| 2009/0185130 A1 | 7/2009 | Yamazaki et al. |
| 2009/0203174 A1 | 8/2009 | Ichijo et al. |
| 2009/0291516 A1 | 11/2009 | Takayama et al. |
| 2009/0315457 A1 | 12/2009 | Furukawa et al. |
| 2010/0072611 A1 | 3/2010 | Oikawa et al. |
| 2010/0293782 A1 | 11/2010 | Yamazaki et al. |
| 2011/0175102 A1 | 7/2011 | Hatano |
| 2012/0168066 A1 | 7/2012 | Eguchi et al. |
| 2013/0119408 A1 | 5/2013 | Koyama |
| 2013/0214324 A1 | 8/2013 | Takayama et al. |
| 2013/0228774 A1 | 9/2013 | Okazaki et al. |
| 2016/0300865 A1 | 10/2016 | Yamazaki et al. |
| 2017/0243895 A1 | 8/2017 | Maruyama et al. |
| 2017/0278878 A1 | 9/2017 | Kuwabara et al. |

FOREIGN PATENT DOCUMENTS

| | | |
|---|---|---|
| CN | 101154561 A | 4/2008 |
| EP | 1434263 A | 6/2004 |
| EP | 1435653 A | 7/2004 |
| JP | 04-101952 A | 4/1992 |
| JP | 10-125931 A | 5/1998 |
| JP | 2003-174153 A | 6/2003 |
| JP | 2003-324142 A | 11/2003 |
| JP | 2003-337411 A | 11/2003 |
| JP | 2004-214281 A | 7/2004 |
| JP | 2004-221561 A | 8/2004 |
| JP | 2006-066899 A | 3/2006 |
| JP | 2006-108077 A | 4/2006 |
| JP | 2007-012917 A | 1/2007 |
| JP | 2007-079201 A | 3/2007 |
| JP | 2007-157787 A | 6/2007 |
| JP | 2008-109123 A | 5/2008 |
| JP | 2008-109124 A | 5/2008 |
| JP | 2009-117688 A | 5/2009 |
| JP | 2009-528688 | 8/2009 |
| JP | 2009-212509 A | 9/2009 |
| JP | 2010-283355 A | 12/2010 |
| KR | 2003-0007208 A | 1/2003 |
| KR | 2009-0086340 A | 8/2009 |
| TW | 564471 | 12/2003 |
| TW | 200921905 | 5/2009 |
| TW | 200949944 | 12/2009 |
| WO | WO-2006/011665 | 2/2006 |

OTHER PUBLICATIONS

Written Opinion (Application No. PCT/JP2014/053958) dated Jun. 3, 2014.

Taiwanese Office Action (Application No. 103105282) dated Jul. 17, 2017.

Taiwanese Office Action (Application No. 108100276) dated Nov. 12, 2019.

* cited by examiner

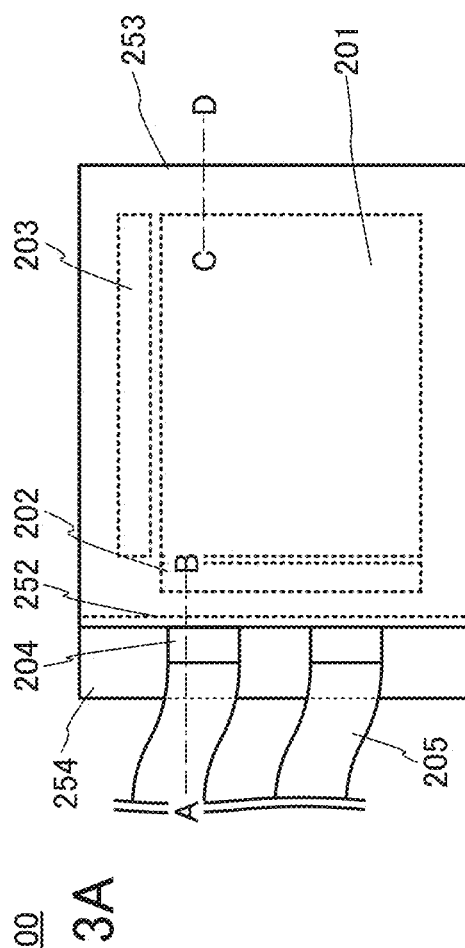
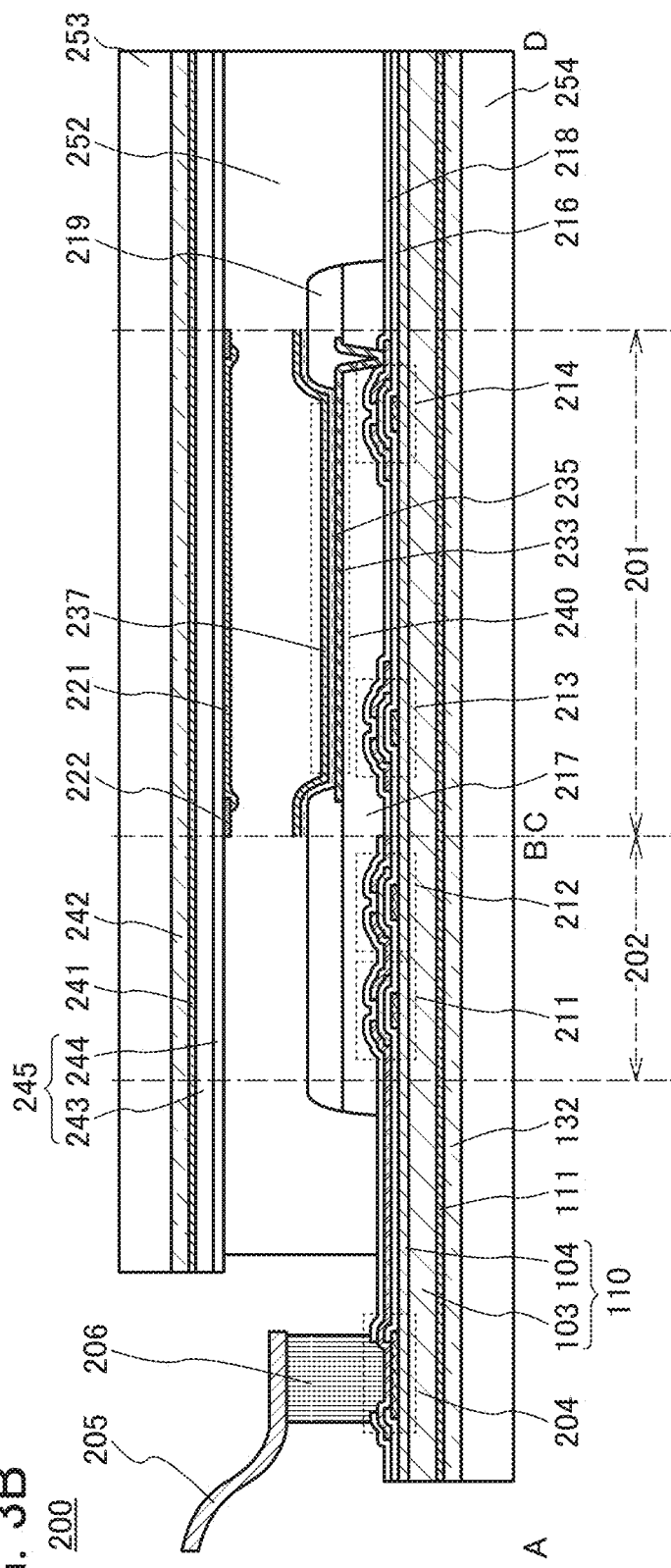

| Structure | (1)SiO₂/WO₂ | | (2)SiO₂/WO₃ | | (3)WO₂/WO₂ | | (4)WO₃/WO₃ | |
|---|---|---|---|---|---|---|---|---|
| | A | B | A | B | A | B | A | B |
| Bond energy [eV] | 2.74 | 4.88 | 5.06 | 3.73 | 1.99 | | | 3.77 |

| Structure | (5)WO₂/WO₃ | | (6)WO₂/W | (7)WO₃/W |
|---|---|---|---|---|
| | A | B | A | A |
| Bond energy [eV] | 4.56 | 1.09 | 1.46 | 2.31 |

Legend: ○ H, ▦ O, ▩ Si, ● W

FIG. 9

| Structure | W(VI)–O, W(VI)–N | W(IV)–O, W(IV)–N |
|---|---|---|
| Bond energy [eV] | A: 2.54, B: 2.89 | A: 3.26, B: 3.56 |

| Structure | (3)WO$_2$/WO$_2$ | (4)WO$_3$/WO$_3$ | (5)WO$_2$/WO$_3$ |
|---|---|---|---|
| Bond energy [eV] | A: 2.06 | A: 2.97, B: — | A: 3.65, B: 0.42 |

Legend: ○ H, ◐ O, ◑ N, ● W

PEELING METHOD, SEMICONDUCTOR DEVICE, AND PEELING APPARATUS

TECHNICAL FIELD

The present invention relates to an object, a method, or a manufacturing method. The present invention also relates to a process, a machine, manufacture, or a composition of matter. In particular, one embodiment of the present invention relates to a semiconductor device, a display device, a light-emitting device, a driving method thereof, or a manufacturing method thereof. In particular, one embodiment of the present invention relates to a manufacturing method of a flexible device.

BACKGROUND ART

In recent years, a flexible device in which a semiconductor element, a light-emitting element, and the like are provided over a flexible substrate has been developed. Typical examples of the flexible device include, as well as a lighting device and an image display device, a variety of semiconductor circuits including a semiconductor element such as a transistor.

As a manufacturing method of a semiconductor device including a flexible substrate, a technique has been developed in which after a semiconductor element such as a thin film transistor is formed over a support substrate such as a glass substrate or a quartz substrate, the semiconductor element is transferred to a flexible substrate. In this technique, a step of peeling a layer including the semiconductor element from the support substrate is needed.

For example, Patent Document 1 discloses the following peeling technique using laser ablation: a separation layer formed of amorphous silicon or the like is formed over a substrate, a layer to be peeled which is formed of a thin film element is formed over the separation layer, and the layer to be peeled is bonded to a transfer body with the use of a bonding layer. The separation layer is ablated by laser light irradiation, so that peeling is generated in the separation layer.

In addition, Patent Document 2 discloses the following peeling technique: a metal layer is formed between a substrate and an oxide layer and separation is generated at an interface between the oxide layer and the metal layer by utilizing weak bonding at the interface between the oxide layer and the metal layer, so that a layer to be peeled and the substrate are separated from each other.

[Patent Document 1] Japanese Published Patent Application No. H10-125931
[Patent Document 2] Japanese Published Patent Application No. 2003-174153

DISCLOSURE OF INVENTION

When a peeling interface has low ease of peeling, or peelability at the time of peeling of a semiconductor element from a support substrate, high stress is applied to the semiconductor element, breaking the semiconductor element in some cases.

In view of the above, an object of one embodiment of the present invention is to provide a peeling method with improved peelability, or the like. Another object is to increase yield in a peeling step. Another object is to increase yield in manufacturing a flexible device or the like. Another object is to provide a highly reliable semiconductor device or the like. Another object is to provide a highly reliable semiconductor device provided with a flexible substrate. Another object is to provide a novel semiconductor device or the like. Another object is to provide a method for manufacturing a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a peeling method including a first step of forming a peeling layer containing tungsten over a support substrate; a second step of forming, over the peeling layer, a layer to be peeled in which a first layer containing silicon oxynitride and a second layer containing silicon nitride are sequentially stacked and an oxide layer containing tungsten oxide between the peeling layer and the layer to be peeled; a third step of forming a compound containing tungsten and nitrogen in the oxide layer by heat treatment; and a fourth step of peeling the peeling layer from the layer to be peeled at the oxide layer.

In addition, a fifth step of performing plasma treatment on a surface of the peeling layer in an atmosphere containing dinitrogen monoxide is preferably performed between the first step and the second step.

In the second step, the first layer containing silicon oxynitride satisfying the following conditions is preferably formed: the silicon oxynitride includes a region in which the nitrogen content measured by secondary ion mass spectrometry (SIMS) is greater than or equal to $5.0\times10^{20}$ molecules/cm$^3$ and less than or equal to $1.0\times10^{23}$ molecules/cm$^3$ and a region in which the hydrogen content is greater than or equal to $1.0\times10^{20}$ molecules/cm$^3$ and less than or equal to $1.0\times10^{22}$ molecules/cm$^3$.

In the second step, the first layer containing silicon oxynitride satisfying the following conditions is preferably formed: the amount of nitrogen released from the silicon oxynitride is greater than or equal to $5\times10^{17}$ molecules/cm$^3$ when converted into nitrogen molecules, at temperatures ranging from 100° C. to 450° C. in a spectrum obtained by thermal desorption spectrometry (TDS) at a mass-to-charge ratio of 28, and the amount of hydrogen released from the silicon oxynitride is greater than or equal to $5\times10^{19}$ molecules/cm$^3$ when converted into hydrogen molecules, at temperatures ranging from 100° C. to 450° C. in a spectrum obtained by TDS at a mass-to-charge ratio of 2.

Further, in the second step, the second layer containing silicon nitride satisfying the following conditions is preferably formed: the amount of nitrogen released from the silicon nitride is less than or equal to $5\times10^{19}$ molecules/cm$^3$ when converted into nitrogen molecules, at temperatures ranging from 100° C. to 450° C. in a spectrum obtained by TDS at a mass-to-charge ratio of 28, and the amount of hydrogen released from the silicon nitride is greater than or equal to $1\times10^{20}$ molecules/cm$^3$ when converted into hydrogen molecules, at temperatures ranging from 100° C. to 450° C. in a spectrum obtained by TDS at a mass-to-charge ratio of 2.

It is preferable that the peeling in the fourth step be performed while water or an aqueous solution is made to penetrate between the peeling layer and the layer to be peeled.

Another embodiment of the present invention is a semiconductor device including a bonding layer over a flexible substrate; an oxide layer containing tungsten oxide over the bonding layer; a first layer containing silicon oxynitride over the oxide layer; a second layer containing silicon nitride over the first layer; and a transistor over the second layer. The oxide layer includes a region in which the nitrogen content measured by SIMS is higher than that of the first layer and a region in which the hydrogen content measured by SIMS is higher than that of the first layer.

In the above-described semiconductor device, the concentrations of nitrogen and hydrogen in the first layer, which are measured by SIMS, preferably decrease from the second layer side to the oxide layer side.

According to the present invention, a peeling method with improved peelability can be provided. The yield in a peeling step can also be increased. The yield in manufacturing a flexible device can also be increased. A highly reliable semiconductor device can also be provided. A highly reliable semiconductor device provided with a flexible substrate can also be provided.

BRIEF DESCRIPTION OF DRAWINGS

FIGS. 3A and 3B illustrate a structure example of a display device of an embodiment.

FIG. 9 shows calculation results of bond energies of an embodiment.

BEST MODE FOR CARRYING OUT THE INVENTION

Figure 1A:
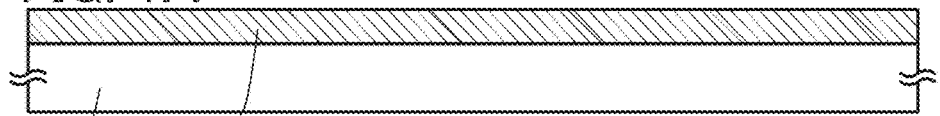
FIGS. 1A to 1E illustrate a peeling method of an embodiment.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the present invention to be described below, the same portions or portions having similar functions are denoted by the same reference numerals in different drawings, and description of such portions will not be repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the scale of each structure is not necessarily limited to that illustrated in the drawings Note that in this specification and the like, ordinal numbers such as "first", "second", and the like are used in order to avoid confusion among components and do not limit the number.

Embodiment 1

In this embodiment, an example of a peeling method of one embodiment of the present invention is described with reference to drawings.

[Example of Manufacturing Method]
<Formation of Peeling Layer>

First, a peeling layer 102 is formed over a support substrate 101 (FIG. 1A).

A substrate which has resistance high enough to withstand at least heat in a later step is used as the support substrate 101. Examples of the support substrate 101 include a semiconductor substrate, a metal substrate, and a ceramic substrate in addition to a glass substrate and a resin substrate.

A high melting point metal such as tungsten, titanium, or molybdenum can be used for the peeling layer 102. Tungsten is preferably used.

The peeling layer 102 can be formed by, for example, a sputtering method. The thickness of the peeling layer 102 is greater than or equal to 10 nm and less than or equal to 200 nm, preferably greater than or equal to 20 nm and less than or equal to 100 nm.

<Formation of Layer to Be Peeled and Oxide Layer>

Figure 1B:
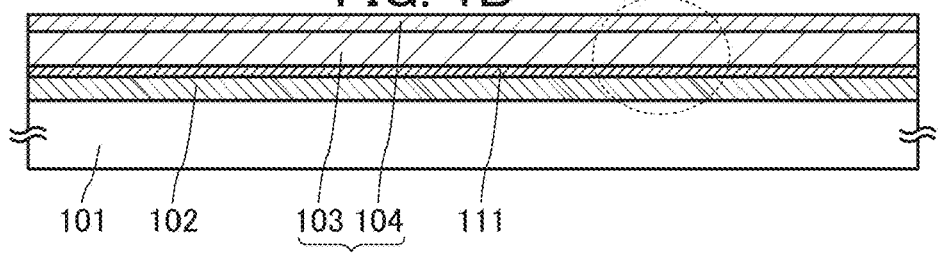

Next, a layer 110 to be peeled is formed over the peeling layer 102 and an oxide layer 111 is formed between the peeling layer 102 and the layer 110 to be peeled (FIG. 1B).

The layer 110 to be peeled has a layered structure including a first layer 103 containing silicon oxynitride and a second layer 104 containing silicon nitride in this order.

Note that in this specification and the like, "silicon oxynitride" contains more oxygen than nitrogen, meanwhile, "silicon nitride oxide" contains more nitrogen than oxygen.

The first layer 103 can release hydrogen and nitrogen in a later heating step. The second layer 104 has a function of releasing hydrogen in a later heating step and inhibiting the release of nitrogen from the first layer 103 to the outside (i.e., blocking the release of nitrogen).

It is preferable that the first layer 103 include a silicon oxynitride film which includes a region in which the nitrogen content which is detected by SIMS is greater than or equal to $5.0 \times 10^{20}$ molecules/cm$^3$ and less than or equal to $1.0 \times 10^{23}$ molecules/cm$^3$, preferably greater than or equal to $1.0 \times 10^{21}$ molecules/cm$^3$ and less than or equal to $5.0 \times 10^{22}$ molecules/cm$^3$ and a region in which the hydrogen content is greater than or equal to $1.0 \times 10^{20}$ molecules/cm$^3$ and less than or equal to $1.0 \times 10^{22}$ molecules/cm$^3$, preferably greater than or equal to $5.0 \times 10^{20}$ molecules/cm$^3$ and less than or equal to $5.0 \times 10^{21}$ molecules/cm$^3$.

It is also preferable that the first layer 103 include a silicon oxynitride film satisfying the following conditions: the amount of nitrogen released from the silicon oxynitride film is greater than or equal to $5 \times 10^{17}$ molecules/cm$^3$, preferably greater than or equal to $1 \times 10^{18}$ molecules/cm$^3$ when converted into nitrogen molecules, at temperatures ranging from 100° C. to 450° C. in a spectrum obtained by TDS at a mass-to-charge ratio of 28, and the amount of hydrogen released from the silicon oxynitride film is greater than or equal to $5 \times 10^{19}$ molecules/cm$^3$, preferably greater than or equal to $1 \times 10^{20}$ molecules/cm$^3$ when converted into hydrogen molecules, at temperatures ranging from 100° C. to 450° C. in a spectrum obtained by TDS at a mass-to-charge ratio of 2.

It is also preferable that the second layer 104 include a silicon nitride film satisfying the following conditions: the amount of nitrogen released from the silicon nitride film is less than or equal to $5 \times 10^{19}$ molecules/cm$^3$, preferably less than or equal to $1 \times 10^{19}$ molecules/cm$^3$ when converted into nitrogen molecules, at temperatures ranging from 100° C. to 450° C. in a spectrum obtained by TDS at a mass-to-charge ratio of 28, and the amount of hydrogen released from the silicon nitride film is greater than or equal to $1 \times 10^{20}$ molecules/cm$^3$, preferably greater than or equal to $5 \times 10^{20}$ molecules/cm$^3$ when converted into nitrogen molecules, at temperatures ranging from 100° C. to 450° C. in a spectrum obtained by TDS at a mass-to-charge ratio of 2.

The first layer 103 can be formed by a sputtering method, a plasma CVD method, or the like. In particular, the silicon oxynitride film included in the first layer 103 is preferably formed by a plasma CVD method using a deposition gas containing a silane gas and a dinitrogen monoxide gas, in which case a large amount of hydrogen and nitrogen can be contained in the film. In addition, the proportion of the silane gas in the deposition gas is preferably higher, in which case the amount of hydrogen released from the film in a later heating step is increased.

The second layer 104 can be formed by a sputtering method, a plasma CVD method, or the like. In particular, when the silicon nitride film included in the second layer 104 is formed by a plasma CVD method using a deposition gas containing a silane gas, a nitrogen gas, and an ammonia gas, a large amount of hydrogen can be contained in the film.

The thickness of the first layer 103 is preferably large for an increase in the amount of released hydrogen and nitrogen; however, the thickness is preferably determined in consideration of productivity. Meanwhile, when the thickness of the first layer 103 is too small, the amount of released hydrogen and nitrogen is insufficient. It is preferable that the thickness of the first layer 103 be greater than or equal to 200 nm and less than or equal to 1 μm, more preferably greater than or equal to 400 nm and less than or equal to 800 nm.

The thickness of the second layer 104 is not particularly limited as long as at least the release of nitrogen can be blocked. It is preferable that the thickness be, for example, greater than or equal to 50 nm and less than or equal to 600 nm, more preferably greater than or equal to 100 nm and less than or equal to 300 nm.

A surface of the peeling layer 102 is oxidized at the time of the formation of the first layer 103, so that the oxide layer 111 is formed between the peeling layer 102 and the first layer 103.

The oxide layer 111 contains an oxide of the metal contained in the peeling layer 102. The oxide layer 111 preferably contains tungsten oxide.

Tungsten oxide is generally represented by $WO_{(3-x)}$ and is a non-stoichiometric compound which can have a variety of compositions, typically $WO_3$, $W_2O_5$, $W_4O_{11}$, and $WO_2$. Titanium oxide $TiO_{(2-x)}$ and molybdenum oxide $MoO_{(3-x)}$ are also non-stoichiometric compounds.

The oxide layer 111 at this stage preferably contains a large amount of oxygen. For example, in the case where tungsten is used for the peeling layer 102, the oxide layer 111 is preferably a tungsten oxide layer containing $WO_3$ as its main component.

The oxide layer 111 can also be formed over the surface of peeling layer 102 in advance by performing plasma treatment on the surface of the peeling layer 102 in an atmosphere containing a dinitrogen monoxide gas before the formation of the first layer 103. When such a method is employed, the thickness of the oxide layer 111 can vary depending on the conditions for the plasma treatment and the thickness of the oxide layer 111 can be controlled more effectively than in the case where plasma treatment is not performed.

The thickness of the oxide layer 111 is, for example, greater than or equal to 0.1 nm and less than or equal to 100 nm, preferably greater than or equal to 0.5 nm and less than or equal to 20 nm. Note that the oxide layer 111 with an extremely small thickness cannot be observed in a cross-sectional image in some cases.

<Heat Treatment>

Next, heat treatment is performed to change the quality of the oxide layer 111.

By the heat treatment, hydrogen is released from the first layer 103 and the second layer 104 to be supplied to the oxide layer 111. In addition, nitrogen is released from the first layer 103 to be supplied to the oxide layer 111. At this time, the second layer 104 blocks the release of nitrogen; thus, nitrogen can be efficiently supplied to the oxide layer 111.

The heat treatment may be performed at a temperature higher than or equal to the temperature at which nitrogen and hydrogen are released from the first layer 103 and lower than or equal to the temperature at which the support substrate 101 is softened. Further, the heat treatment is preferably performed at a temperature higher than or equal to the temperature at which a reduction reaction between hydrogen and the metal oxide in the oxide layer 111 occurs. For example, in the case where tungsten is used for the peeling layer 102, the heating temperature is higher than or equal to 420° C., higher than or equal to 450° C., higher than or equal to 600° C., or higher than or equal to 650° C.

The higher the temperature of the heat treatment is, the more the amount of nitrogen released from the first layer 103 and hydrogen released from the first layer 103 and the second layer 104 can be, leading to improved peelability. However, even when the heating temperature is reduced in consideration of the heat resistance of the support substrate 101 and the productivity, high peelability can be achieved by forming the oxide layer 111 in advance by performing plasma treatment on the peeling layer 102 as described above.

Although the atmosphere in which the heat treatment is performed is not particularly limited and may be an air atmosphere, it is preferably performed in an inert gas atmosphere such as a nitrogen atmosphere or a rare gas atmosphere.

Hydrogen and nitrogen released from the layer 110 to be peeled by the heat treatment are trapped between the first layer 103 and the peeling layer 102. Consequently, a region with a high hydrogen concentration and a region with a high nitrogen concentration are formed in the oxide layer 111 between the first layer 103 and the peeling layer 102.

For example, a region in which the hydrogen concentration measured by SIMS is higher than that of the first layer 103 is formed in the oxide layer 111. In addition, a region in which the nitrogen concentration measured by SIMS is higher than that of the first layer 103 is formed in the oxide layer 111.

The metal oxide in the oxide layer 111 is reduced by hydrogen supplied to the oxide layer 111, so that a plurality of regions with different proportions of oxygen are mixed in the oxide layer 111. For example, in the case where tungsten is used for the peeling layer 102, $WO_3$ in the oxide layer 111 is reduced to generate an oxide with proportion of oxygen lower than that of $WO_3$ (e.g., $WO_2$), resulting in a state where $WO_3$ and the oxide with the lower proportion of oxygen are mixed. The crystal structure of such a metal oxide depends on the proportion of oxygen; thus, when a plurality of regions with different proportions of oxygen are provided in the oxide layer 111, the mechanical strength of the oxide layer 111 is reduced. As a result, the oxide layer 111 is likely to be damaged inside, so that the peelability in a later peeling step can be increased.

In addition, since nitrogen is supplied to the oxide layer 111, a compound containing nitrogen and the metal in the oxide layer 111 is also generated. For example, in the case where tungsten is used for the peeling layer 102, a compound having a W—N bond is generated in the oxide layer 111.

The compound having a W—N bond contained in the oxide layer 111 subjected to the heat treatment can be confirmed by analysis using, for example, X-ray photoelectron spectroscopy (XPS) performed on a surface of part of the oxide layer 111 which remains after peeling.

The compound containing the metal and nitrogen in the oxide layer 111 enables the mechanical strength of the oxide layer 111 to be further reduced and the peelability to be improved.

A significant difference can be seen between cross-sectional shapes of the oxide layer 111 before and after the heat treatment. Described below are the cross-sectional shapes of the oxide layer 111 before and after the heat treatment.

Figure 2A:
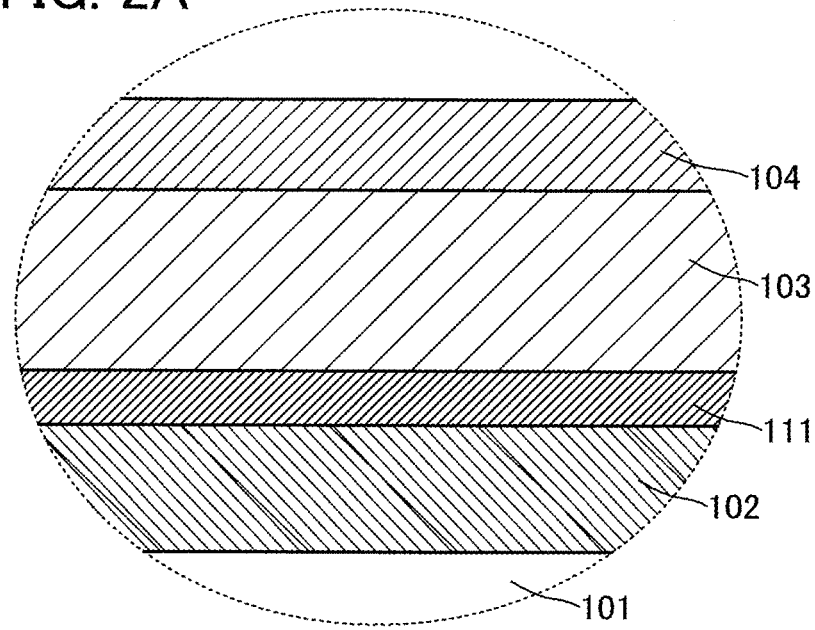
FIGS. 2A and 2B illustrate a peeling method of an embodiment.
Figure 2B:
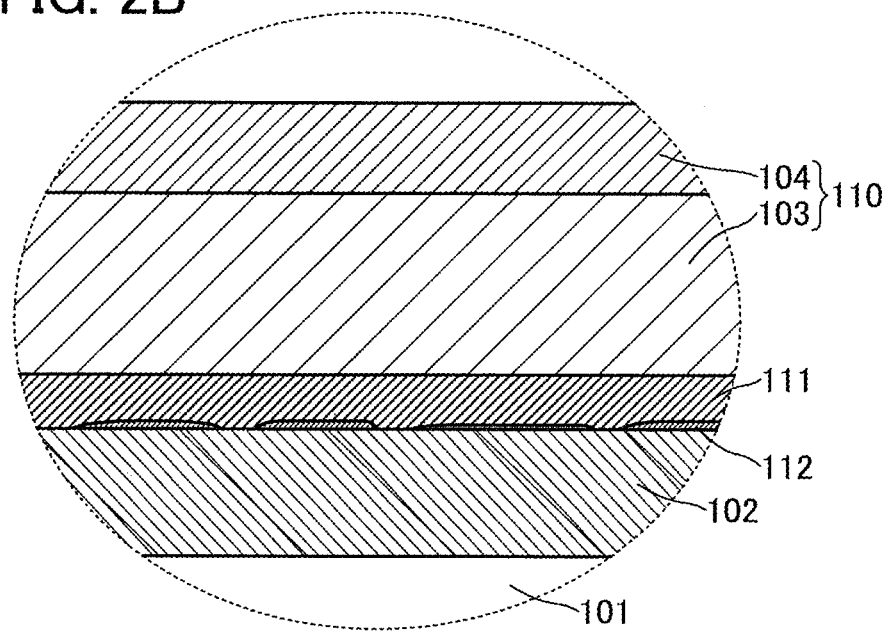

FIGS. 2A and 2B illustrate magnified schematic cross sections of regions surrounded by a dashed line in FIG. 1B before and after the heat treatment, respectively.

Before the heat treatment, the oxide layer 111 is observed between the peeling layer 102 and the first layer 103 in the cross section as illustrated in FIG. 2A.

Meanwhile, in a cross-sectional observation of the peeling layer 102 and the oxide layer 111 after the heat treatment, a region 112 with a gray level different from those of the peeling layer 102 and the oxide layer 111 can be observed in the vicinity of an interface therebetween as illustrated in FIG. 2B. The region 112 with the different gray level can be observed with a transmission electron microscope (TEM).

The region 112 is probably a cavity which is formed when the peeling layer 102 and the oxide layer 111 are partly separated from each other. Alternatively, the region 112 might be a region which contains the element included in the oxide layer 111 and has density lower than that of the oxide layer 111. Further alternatively, the region 112 might be a layer which contains some of the constituent elements in each of the peeling layer 102, the oxide layer 111, and the layer 110 to be peeled or a region in which nitrogen, oxygen, hydrogen, or the like released from the oxide layer 111 exists in a gaseous state.

For example, in the case where only the first layer 103 or only the second layer 104 is used as the layer 110 to be peeled, the region 112 is not formed even when heat treatment is performed. Furthermore, the region 112 cannot be observed when the order of the first layer 103 and the second layer 104 is inverted. The above indicates that an element such as nitrogen, hydrogen, or oxygen released from the oxide layer 111 is involved in the formation of the region 112.

The external force required for peeling in a later peeling process differs significantly between the cases where heat treatment is performed and heat treatment is not performed, that is, between the presence and absence of the region 112. Peeling can be performed with weaker force when the region 112 is formed by the heat treatment. This indicates that the region 112 greatly contributes to an improvement in the peelability.

For example, when the region 112 is a cavity or is filled with a gas, it is expected that the contact area between the oxide layer 111 and the peeling layer 102 is reduced to lower the adhesion, resulting in improved peelability. Further, when the region 112 has a composition different from those of the peeling layer 102 and the oxide layer 111 or when the region 112 has a low density, the peelability is expected to be improved because of a difference between the adhesion between the oxide layer 111 and the peeling layer 102 and the adhesion between the region 112 and the peeling layer 102.

<Bonding>

Figure 1C:
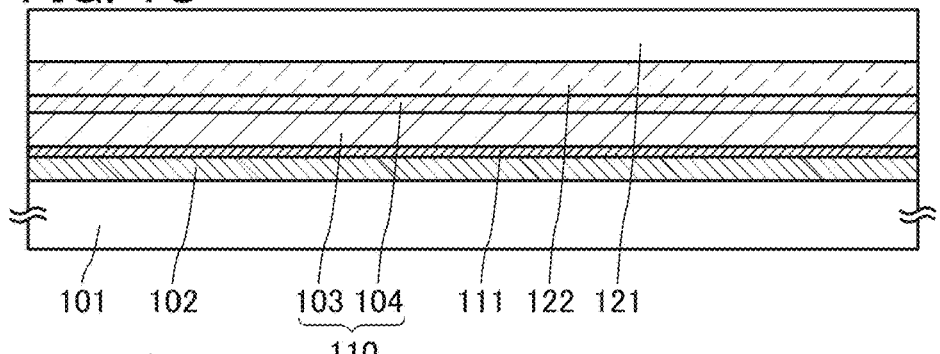

Next, the support substrate 101 and a substrate 121 are bonded to each other by a bonding layer 122 (FIG. 1C).

A flexible substrate is preferably used as the substrate 121. For example, a metal substrate or a glass substrate which is thin enough to have flexibility can be used as well as a resin such as polyethylene terephthalate (PET) or polyethylene naphthalate (PEN). A composite material in which two or more of a metal, glass, and a resin are stacked can also be used.

The substrate 121 does not necessarily have flexibility; in this case, the same material as the support substrate 101 can be used as the substrate 121. A substrate over which a semiconductor element such as a transistor, a light-emitting element such as an organic electroluminescence (EL) element, or an optical element such as a liquid crystal element is formed can also be used as the substrate 121.

A thermosetting resin or an ultraviolet curable resin can be used for the bonding layer 122 as long as the resin can firmly bond surfaces to be bonded. For example, an acrylic resin, a urethane resin, an epoxy resin, or a resin having a siloxane bond can be used. In the case where the substrate 121 is removed later, a water-soluble resin, a resin soluble in an organic solvent, or the like can be used.

<Peeling>

Figure 1D:
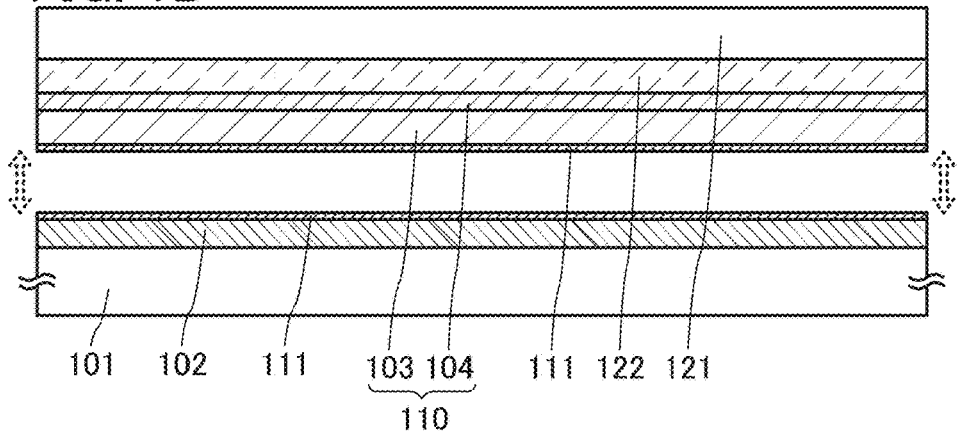

Next, the peeling layer 102 is peeled from the layer 110 to be peeled at the oxide layer 111 (FIG. 1D).

For the peeling, for example, the support substrate 101 or the substrate 121 is fixed to a suction stage and a peeling starting point is formed between the peeling layer 102 and the layer 110 to be peeled. The peeling starting point may be formed by, for example, inserting a sharp instrument such as a knife between the layers. Alternatively, the peeling starting point may be formed by irradiating part of the peeling layer 102 with laser light to melt the part of the peeling layer 102. Further alternatively, the peeling starting point may be formed by dripping liquid (e.g., alcohol, water, or water containing carbon dioxide) onto an end portion of, for example, the peeling layer 102 or the layer 110 to be peeled so that the liquid penetrates into an interface between the peeling layer 102 and the layer 110 to be peeled by using capillary action.

Then, physical force is gently applied to the area where the peeling starting point is formed in a direction substantially perpendicular to the bonded surfaces, so that peeling can be caused without damage to the layer 110 to be peeled. At this time, peeling may be caused by attaching tape or the like to the support substrate 101 or the substrate 121 and pulling the tape in the aforementioned direction, or peeling may be caused by pulling an end portion of the support substrate 101 or the substrate 121 with a hook-like member. Alternatively, peeling may be caused by pulling an adhesive member or a member capable of vacuum suction attached to the back side of the support substrate 101 or the substrate 121.

Here, peeling is performed in such a manner that liquid containing water such as water or an aqueous solution is added to the peeling interface and the liquid penetrates into the peeling interface, so that the peelability can be improved. The reason why the peelability is improved in the case where liquid is added is described in detail in another embodiment.

The peeling is mainly caused inside the oxide layer 111 and at the interface between the oxide layer 111 and the peeling layer 102. Thus, as illustrated in FIG. 1D, part of the oxide layer 111 is attached to each of the surfaces of the peeling layer 102 and the first layer 103 after the peeling in some cases. Note that the thickness of the oxide layer 111 on the surface of the peeling layer 102 may be different from that on the surface of the first layer 103. Since peeling is easily caused at the interface between the oxide layer 111 and the peeling layer 102, the thickness of the oxide layer 111 on the first layer 103 side is larger than that on the peeling layer 102 side in many cases.

In the above-described manner, the peeling layer 102 and the layer 110 to be peeled can be separated from each other with a high yield.

<Bonding>

Figure 1E:
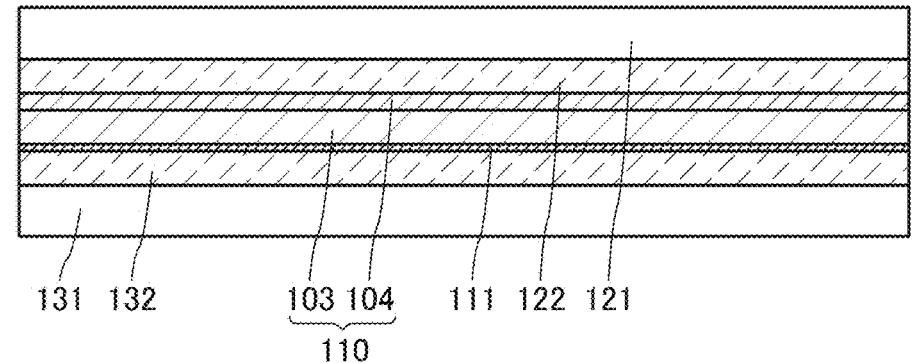

Then, as illustrated in FIG. 1E, a substrate 131 may be bonded to the peeled surface of the layer 110 to be peeled with a bonding layer 132 interposed therebetween. The descriptions of the bonding layer 122 and the substrate 121 can be referred to for the bonding layer 132 and the substrate 131, respectively.

By using flexible substrates as the substrates 121 and 131, a flexible stack can be formed.

Application Example

The peeling method described in the Example of Manufacturing Method can be applied to a variety of flexible devices.

In the case where the peeling method is applied to, for example, a flexible device including a transistor, the transistor may be formed after the layer 110 to be peeled is formed.

For example, in the case where a bottom-gate transistor is manufactured, a gate electrode, a gate insulating layer, a semiconductor layer, and a source and drain electrodes are formed in this order over the layer 110 to be peeled. After that, a step of bonding the substrate 121, a peeling step, and a step of bonding the substrate 131 are performed. In such a manner, a flexible device including the transistor can be manufactured.

Note that a forward staggered transistor, an inverted staggered transistor, or the like may be used. In addition, a top-gate transistor or a bottom-gate transistor may be used. In addition, a channel-etched transistor or a channel protective transistor may be used. In the case of a channel protective transistor, a channel protective film may be provided only over a channel region. Alternatively, an opening may be formed only in an portion where a source and drain electrodes are in contact with a semiconductor layer and a channel protective film may be provided in an area other than the opening.

As a semiconductor applicable to a semiconductor layer in which a channel of a transistor is formed, for example, a semiconductor material such as silicon or germanium, a compound semiconductor material, an organic semiconductor material, or an oxide semiconductor material may be used.

Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

For example, in the case of using silicon as the semiconductor, amorphous silicon, microcrystalline silicon, polycrystalline silicon, single crystal silicon, or the like can be used.

In the case of using an oxide semiconductor as the semiconductor, an oxide semiconductor containing at least one of indium, gallium, and zinc is preferably used. Typically, an In—Ga—Zn-based metal oxide can be given. An oxide semiconductor having a wider band gap and a lower carrier density than silicon is preferably used, in which case off-state leakage current can be reduced.

In the peeling method of one embodiment of the present invention, peeling is performed after an element is formed over a support substrate, so that flexibility can be obtained; thus, there is almost no limitation on the temperature in element formation steps. Thus, a semiconductor element with extremely high reliability which is manufactured through a high-temperature process can be manufactured over a flexible substrate with poor heat resistance with a high yield.

A light-emitting element in which a layer containing a light-emitting organic compound is interposed between a pair of electrodes is formed over the layer 110 to be peeled, so that a flexible light-emitting device can be manufactured. For example, a flexible lighting device (or a light source) including a light-emitting element can be manufactured, or an image display device may be manufactured by forming a plurality of pixels including transistors and display elements such as light-emitting elements and liquid crystal elements over the layer 110 to be peeled. Examples of the flexible image display device are described in another embodiment.

Note that this embodiment can be combined with any of the other embodiments and the examples described in this specification as appropriate.

Embodiment 2

In this embodiment, a flexible device which can be manufactured by the peeling method of one embodiment of the present invention is described with reference to drawings. Light-emitting devices such as an image display device (hereinafter, a display device) including an organic EL element and a lighting device are described as examples of the flexible device.

Note that a light-emitting device in this specification refers to an image display device or a light source (including a lighting device). In addition, the light-emitting device may include any of the following modules in its category: a module in which a connector such as a flexible printed circuit (FPC) or a tape carrier package (TCP) is attached to a light-emitting device; a module having a TCP provided with a printed wiring board at the end thereof; a module having an integrated circuit (IC) directly mounted over a substrate over which a light-emitting element is formed by a chip on glass (COG) method; a module in which a touch sensor is mounted.

The "semiconductor device" in this specification and the like means all devices which can operate by utilizing semiconductor characteristics. A transistor, a semiconductor circuit, a memory device, an imaging device, an electro-optical device, a power generation device (e.g., a thin film solar cell and an organic thin film solar cell), an electronic appliance, and the like each may be included in a semiconductor device or may include a semiconductor device.

Therefore, among the light-emitting devices described below, a light-emitting device including an element having semiconductor characteristics (e.g., a transistor) is also one embodiment of the semiconductor device. In other words, such a light-emitting device includes a light-emitting element and a semiconductor device.

[Structure Example 1 of Display Device]

FIG. 3A is a schematic top view of a display device 200 with a top emission structure.

The display device 200 includes, on a top surface of a flexible substrate 254, a display portion 201, a scan line driver circuit 202, and a signal line driver circuit 203. The display device 200 also includes a sealing layer 252 covering the display portion 201 and a flexible substrate 253 over the sealing layer 252. In the display device 200, an external connection terminal 204 which is electrically connected to the scan line driver circuit 202 and the signal line driver circuit 203 is provided over the flexible substrate 254. Power supply potentials and signals, such as driving signals, for driving the scan line driver circuit 202, the signal line driver circuit 203, and the like can be input from the outside through an FPC 205 which is electrically connected to the external connection terminal 204.

FIG. 3B is a schematic cross-sectional view taken along the line A-B and the line C-D which cut regions including the external connection terminal 204, the scan line driver circuit 202, and the display portion 201 illustrated in FIG. 3A.

In the display device 200, the layer 110 to be peeled including the first layer 103 and the second layer 104 is provided over the flexible substrate 254 with the bonding layer 132 interposed therebetween. In addition, a light-emitting element 240, the scan line driver circuit 202 (and the signal line driver circuit 203), and the external connection terminal 204 are provided over the second layer 104.

The external connection terminal 204 is formed using the same material as a conductive layer included in transistors or a light-emitting element in the display device 200. In this structure example, a layer formed using the same material as a conductive layer forming gate electrodes of the transistors and a layer formed using the same material as a conductive layer forming source and drain electrodes of the transistors are stacked. The external connection terminal 204 preferably includes such a stack including a plurality of layers, in which case the mechanical strength can be increased and electric resistance can be reduced. A connector 206 is provided in contact with the external connection terminal 204. The FPC 205 is electrically connected to the external connection terminal 204 through the connector 206. The connector 206 can be formed using a paste-like material in which conductive particles are mixed with a thermosetting resin and which exhibits anisotropic conductivity by thermocompression bonding or a sheet-like material in which conductive particles are contained inside a thermosetting resin and which exhibits anisotropic conductivity by thermocompression bonding. Examples of the conductive particles are nickel particles coated with metal and a resin coated with metal.

In FIG. 3B, the scan line driver circuit 202 partly includes a circuit in which an n-channel transistor 211 and an n-channel transistor 212 are combined, for example. Note that the scan line driver circuit 202 is not limited to the circuit in which the n-channel transistors are combined and may include a variety of circuits such as a CMOS circuit in which an n-channel transistor and a p-channel transistor are combined or a circuit in which p-channel transistor are combined. Note that the same applies to the signal line driver circuit 203. Although a driver-integrated structure in which the scan line driver circuit 202 and the signal line driver circuit 203 are formed over an insulating surface over which the display portion 201 is formed is described in this structure example, a driver circuit IC used as one or both of the scan line driver circuit 202 and the signal line driver circuit 203 may be mounted by a COG method, or a flexible substrate (FPC) mounted with a driver circuit IC by a COF method may be mounted, for example.

FIG. 3B illustrates a cross-sectional structure of one pixel as an example of the display portion 201. The pixel includes a switching transistor 213, a current control transistor 214, and a first electrode 233 electrically connected to an electrode (a source electrode or a drain electrode) of the current control transistor 214. An insulating layer 219 is provided to cover an end portion of the first electrode 233.

The light-emitting element 240 has a stacked structure in which the first electrode 233, an EL layer 235, and a second electrode 237 are sequentially stacked over an insulating layer 217. Since the display device 200 described in this structure example is a top emission display device, a light-transmitting material is used for the second electrode 237. A reflective material is preferably used for the first electrode 233. The EL layer 235 contains at least a light-emitting organic compound. When voltage is applied between the first electrode 233 and the second electrode 237 between which the EL layer 235 is interposed so that current flows to the EL layer 235, the light-emitting element 240 can emit light.

A layer 245 to be peeled including a first layer 243 and a second layer 244 is provided on the side of a surface of the flexible substrate 253 which faces the substrate 254, with a bonding layer 242 interposed therebetween. In addition, a color filter 221 is provided on part of the second layer 244 which overlaps the light-emitting element 240 and a black matrix 222 is provided on a position overlapping the insulating layer 219. The first layer 243 and the second layer 244 are formed using the same materials as the first layer 103 and the second layer 104. Note that a transparent conductive film may be formed over a surface of the substrate 253 which does not face the substrate 254, so that a touch sensor is formed.

The second layer 104 and the second layer 244 have functions of inhibiting the diffusion of impurities contained in the substrate 254 and the substrate 253, respectively. It is preferable that an insulating layer 216 and an insulating layer 218 which are in contact with semiconductor layers of the transistors inhibit the diffusion of impurities into the semiconductor layers. These insulating layers can be formed using, for example, an oxide or a nitride of a semiconductor such as silicon or a metal such as aluminum. Alternatively, a stack including such inorganic insulating materials or a stack including such an inorganic insulating material and an organic insulating material may be used.

As the inorganic insulating material, for example, a single layer of or a stack including one or more materials selected from aluminum nitride, aluminum oxide, aluminum nitride oxide, aluminum oxynitride, magnesium oxide, gallium oxide, silicon nitride, silicon oxide, silicon nitride oxide, silicon oxynitride, germanium oxide, zirconium oxide, lanthanum oxide, neodymium oxide, and tantalum oxide. In this specification, the nitride oxide refers to a material containing a larger amount of nitrogen than oxygen, and the oxynitride refers to a material containing a larger amount of oxygen than nitrogen. The element content can be measured by, for example, RBS.

As the inorganic insulating material, a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide may be used.

The layer 110 to be peeled can be formed by performing peeling by the peeling method described in Embodiment 1. The transistors and the light-emitting element 240 are formed over the layer 110 to be peeled, peeling is performed, and then the substrate 254 is bonded to the back side of the layer 110 to be peeled with the bonding layer 132 interposed therebetween, so that the structure illustrated in FIG. 3B can be obtained. The layer 245 to be peeled can also be formed by performing peeling by the peeling method described in Embodiment 1. The color filter 221 and the black matrix 222 are formed over the layer 245 to be peeled, peeling is performed, and then the substrate 253 is bonded to the back side of the layer 245 to be peeled with the bonding layer 242 interposed therebetween, so that the structure illustrated in FIG. 3B can be obtained.

As illustrated in FIG. 3B, the oxide layer 111 may be provided between the first layer 103 and the bonding layer 132, or an oxide layer 241 may be provided between the first layer 243 and the bonding layer 242. The oxide layer 111 and the oxide layer 241 are extremely thin and have light-transmitting properties, and thus hardly decrease emission efficiency even when provided on the side where light emitted from the light-emitting element 240 is extracted.

It is preferable that the layer 110 to be peeled provided with the transistors and the like and the layer 245 to be peeled provided with the color filter 221 and the like be bonded to each other with the sealing layer 252 while the layers 110 and 245 to be peeled are provided with the respective support substrates, and after the bonding, the layers 110 and 245 to be peeled be peeled from the respective support substrates. In the case where the color filter 221 and pixels need to be aligned with high accuracy particularly as in the display device including the high-definition display portion 201, the layers to be peeled are bonded while being fixed to support substrates such as glass substrates, whereby the color filter 221 and the pixels can be aligned with high accuracy. By the above-described method, a high-definition, flexible display device can be manufactured.

Note that although FIGS. 3A and 3B illustrate the case where the light-emitting element is used as a display element, one embodiment of the present invention is not limited thereto. It is possible to use a liquid crystal element, an electrophoretic element (electronic paper), or the like as a display element. An electrophoretic element is preferable as one embodiment of a flexible display device because a backlight is not needed.

[Structure Example 2 of Display Device]

In this structure example, a display device with a bottom-emission structure is described. Note that the same parts as those in Structure Example 1 are not described here.

Figure 4:
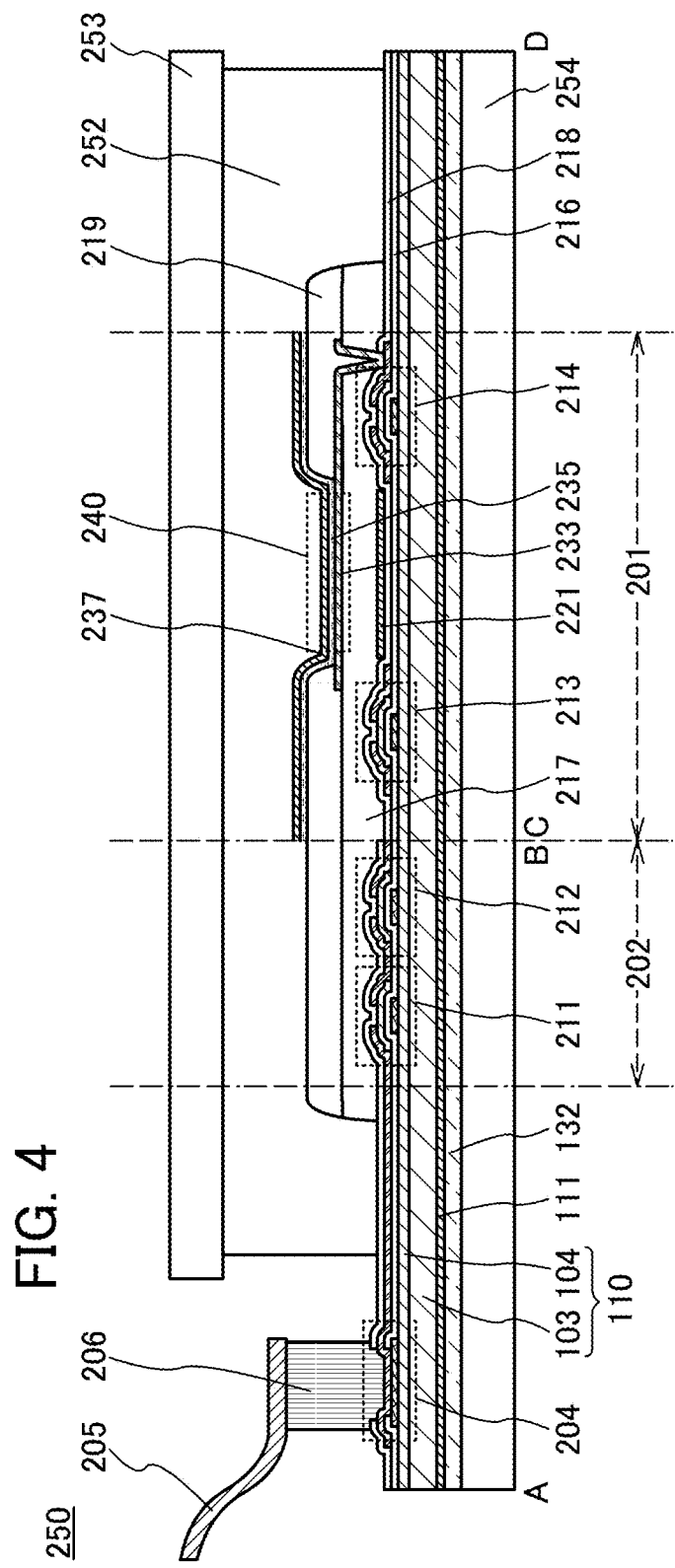
FIG. 4 illustrates a structure example of a display device of an embodiment.

FIG. 4 is a schematic cross-sectional view of a display device 250 described in this structure example.

The display device 250 is different from the display device 200 described in Structure Example 1 mainly in the following points. In the display device 250, a color filter is provided between the substrate 254 and the light-emitting element 240. In addition, the flexible substrate 253 is in direct contact with the sealing layer 252, and the layer 245 to be peeled, the bonding layer 242, and the like, which are provided in the display device 200, are not provided.

In the light-emitting element 240, a light-transmitting material is used for the first electrode 233, and a reflective material is used for the second electrode 237. Thus, light emission from the EL layer 235 is transmitted through the substrate 254.

Further, the color filter 221 is provided at the position over the insulating layer 218 covering transistors which overlaps with the light-emitting element 240. The insulating layer 217 is provided to cover the color filter 221.

A material which is not permeable to an impurity such as water from the outside of the substrate 253 is preferably used as the substrate 253. Alternatively, a film formed of an insulating material, which has a function of inhibiting the diffusion of such an impurity, is preferably provided on a surface of the substrate 253 which is in contact with the sealing layer 252. As such a material, the inorganic insulating material that can be used for the second layers 104 and 244 can be used.

[Materials and Formation Methods]

Materials and formation methods which can be used for each component described above are described below.

<Flexible Substrate>

As a material for the flexible substrate, an organic resin, a glass substrate thin enough to have flexibility, or the like can be used.

Examples of such materials are polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low, for example, lower than or equal to $30 \times 10^{-6}$/K is preferable, and a polyamide imide resin, a polyimide resin, or PET can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As an example of the glass fiber, a glass fiber using E glass, S glass, D glass, Q glass, or the like can be given. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

A material capable of transmitting light emitted from the EL layer 235 is used for the flexible substrate through which light emitted from the light-emitting element 240 is transmitted. To improve the outcoupling efficiency of the material provided on the light extraction side, the refractive index of the flexible, light-transmitting material is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferably used, in which case such a filler can maintain optical transparency.

Since the substrate provided on the side opposite to the side through which light is transmitted does not need to have a light-transmitting property, a metal substrate or the like can be used as well as the above substrates. To obtain flexibility and bendability, the thickness of a metal substrate is preferably greater than or equal to 10 µm and less than or equal to 200 µm, more preferably greater than or equal to 20 µm and less than or equal to 50 µm. Although there is no particular limitation on a material of the metal substrate, it is preferable to use, for example, aluminum, copper, nickel, a metal alloy such as an aluminum alloy or stainless steel. A conductive substrate containing a metal or an alloy material is preferably used as the flexible substrate provided on the side through which light is not transmitted, in which case heat dissipation of heat generated from the light-emitting element 240 can be increased.

In the case where a conductive substrate is used, it is preferable to use a substrate subjected to insulation treatment in such a manner that a surface of the substrate is oxidized or an insulating film is formed over the surface of the substrate. For example, an insulating film may be formed over the surface of the conductive substrate by an electrode-position method, a coating method such as a spin-coating method or a dip method, a printing method such as a screen printing method, or a deposition method such as an evaporation method or a sputtering method. Alternatively, the surface of the substrate may be oxidized by being exposed to an oxygen atmosphere or heated in an oxygen atmosphere or by an anodic oxidation method.

In the case where the flexible substrate has an uneven surface, a planarization layer may be provided to cover the uneven surface so that a flat insulating surface is formed. An insulating material can be used for the planarization layer; an organic material or an inorganic material can be used. The planarization layer can be formed by a deposition method such as a sputtering method, a coating method such as a spin-coating method or a dip method, a discharging method such as an ink-jet method or a dispensing method, a printing method such as a screen printing method, or the like.

As the flexible substrate, a material in which a plurality of layers are stacked can also be used. For example, a material in which two or more kinds of layers formed of an organic resin are stacked, a material in which a layer formed of an organic resin and a layer formed of an inorganic material are stacked, or a material in which two or more kinds of layers formed of an inorganic material are stacked is used. With a layer formed of an inorganic material, moisture and the like are prevented from entering the inside, resulting in improved reliability of the light-emitting device.

As the inorganic material, an oxide material, a nitride material, or an oxynitride material of a metal or a semiconductor, or the like can be used. For example, silicon oxide, silicon nitride, silicon oxynitride, aluminum oxide, aluminum nitride, or aluminum oxynitride may be used.

For example, in the case where a layer formed of an organic resin and a layer formed of an inorganic material are stacked, the layer formed of an inorganic material can be formed over or under the layer formed of an organic resin by a sputtering method, a CVD method, a coating method, or the like.

As the flexible substrate, a glass substrate thin enough to have flexibility may also be used. Specifically, it is preferable to use a sheet in which an organic resin layer, a bonding layer, and a glass layer are sequentially stacked from the side close to the light-emitting element 240. The thickness of the glass layer is greater than or equal to 20 µm and less than or equal to 200 µm, preferably greater than or equal to 25 µm and less than or equal to 100 µm. Such a thickness allows the glass layer to have both high flexibility and a high barrier property against water and oxygen. The thickness of the organic resin layer is greater than or equal to 10 µm and less than or equal to 200 µm, preferably greater than or equal to 20 µm and less than or equal to 50 µm. With such an organic resin layer in contact with the glass layer, breakage or a crack of the glass layer can be inhibited, resulting in increased mechanical strength. Forming the flexible substrate by using such a composite material of a glass material and an organic resin makes it possible to obtain a flexible light-emitting device with extremely high reliability.

<Light-Emitting Element>

In the light-emitting element 240, a light-transmitting material capable of transmitting light emitted from the EL layer 235 is used for an electrode provided on the side through which light is transmitted.

As the light-transmitting material, indium oxide, indium oxide-tin oxide, indium oxide-zinc oxide, zinc oxide, and zinc oxide to which gallium is added can be used. Graphene may also be used. Other examples are a metal material such as gold, silver, platinum, magnesium, nickel, tungsten, chromium, molybdenum, iron, cobalt, copper, palladium, and titanium; and an alloy material containing any of these metal materials. A nitride of the metal material (e.g., titanium nitride) or the like may also be used. In the case of using the metal material (or the nitride thereof), the thickness is set small enough to be able to transmit light. Alternatively, a stack including any of the above materials can also be used as the conductive layer. For example, a stacked film including a silver-magnesium alloy and indium oxide-tin oxide is preferably used, in which case electrical conductivity can be increased.

Such an electrode is formed by an evaporation method, a sputtering method, or the like. A discharging method such as an ink-jet method, a printing method such as a screen printing method, or a plating method may be used.

Note that when the above conductive oxide having a light-transmitting property is formed by a sputtering method, the use of a deposition atmosphere containing argon and oxygen allows the light-transmitting property to be increased.

Further, in the case where the conductive oxide film is formed over the EL layer, a first conductive oxide film formed under an atmosphere containing argon with a reduced oxygen concentration and a second conductive oxide film formed under an atmosphere containing argon and oxygen are preferably stacked, in which case film formation damage to the EL layer can be reduced. In this case, in the formation of the first conductive oxide film, it is preferable to use an argon gas with high purity, for example, an argon gas whose dew point is lower than or equal to $-70°$ C., more preferably lower than or equal to $-100°$ C.

A material capable of reflecting light emitted from the EL layer 235 is preferably used for the electrode provided on the side opposite to the side through which light is transmitted.

As the light-reflecting material, for example, a metal such as aluminum, gold, platinum, silver, nickel, tungsten, chromium, molybdenum, iron, cobalt, copper, or palladium or an alloy containing any of these metals can be used. Alternatively, lanthanum, neodymium, germanium, or the like may be added to a metal or an alloy containing the metal material. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper, an alloy of silver, palladium, and copper, and an alloy of silver and magnesium. An alloy of silver and copper is preferable because of its high heat resistance. Further, by stacking a metal film or a metal oxide film in contact with an aluminum alloy film, oxidation of the aluminum alloy film can be suppressed. Examples of a material for the metal film or the metal oxide film are titanium and titanium oxide. Further alternatively, a stack including a film containing any of the above light-transmitting materials and a film containing any of the above metal materials may be used. For example, a stacked film including silver and indium oxide-tin oxide, a stacked film including a silver-magnesium alloy and indium oxide-tin oxide, or the like can be used.

Such an electrode is formed by an evaporation method, a sputtering method, or the like. A discharging method such as an ink-jet method, a printing method such as a screen printing method, or a plating method may be used.

The EL layer 235 includes at least a layer containing a light-emitting organic compound (hereinafter also called a light-emitting layer), and may be either a single layer or a stack including a plurality of layers. One example of the structure in which a plurality of layers is stacked is a structure in which a hole-injection layer, a hole-transport layer, a light-emitting layer, an electron-transport layer, and an electron-injection layer are stacked in this order from an anode side. Note that not all of these layers except the light-emitting layer are necessarily provided in the EL layer 235. Further, each of these layers may be provided in duplicate or more. Specifically, in the EL layer 235, a plurality of light-emitting layers may overlap each other or another hole-injection layer may overlap the electron-injection layer. Furthermore, another component such as an electron-relay layer may be added as appropriate as an intermediate layer, in addition to the charge generation layer. Alternatively, a plurality of light-emitting layers exhibiting different colors may be stacked. For example, a white emission can be obtained by stacking two or more layers emitting light of complementary colors.

The EL layer 235 can be formed by a vacuum evaporation method, a discharging method such as an ink-jet method or a dispensing method, a coating method such as a spin-coating method.

<Bonding Layer and Sealing Layer>

As the bonding layer and the sealing layer, it is possible to use, for example, a gel or a curable material such as a two-component-mixture type resin which is curable at room temperature, a thermosetting resin, or a light curable resin. For example, an epoxy resin, an acrylic resin, a silicone resin, a phenol resin, polyimide, polyvinyl chloride (PVC), polyvinyl butyral (PVB), or ethylene vinyl acetate (EVA) can be used. In particular, a material with low moisture permeability, such as an epoxy resin, is preferable.

A drying agent may be contained in the bonding layer and the sealing layer. For example, a substance that absorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used as the drying agent. In the case where the drying agent is applied to a lighting device, when a granular drying agent is employed, light emitted from the light-emitting element 240 is diffusely reflected by the drying agent; thus, a highly reliable light-emitting device with improved viewing angle dependence, which is particularly useful for lighting and the like, can be achieved.

<Transistor>

There is no particular limitation on the structures of the transistors included in the display portion 201, the scan line driver circuit 202, and the signal line driver circuit 203. For example, a forward staggered transistor or an inverted staggered transistor may be used. Further, a top-gate transistor or a bottom-gate transistor may be used. As a semiconductor material used for the transistors, for example, a semiconductor material such as silicon, germanium or an oxide semiconductor containing at least one of indium, gallium, and zinc, or an organic semiconductor may be used. A typical example of the oxide semiconductor containing at least one of indium, gallium, and zinc is an In—Ga—Zn-based metal oxide. An oxide semiconductor having a wider band gap and a lower carrier density than silicon is preferably used, in which case a transistor with low off-state current can be obtained and off-state leakage current of the light-emitting element formed later can be reduced. Further, there is no particular limitation on the crystallinity of a semiconductor used for the transistors, and an amorphous semiconductor or a semiconductor having crystallinity (a microcrystalline semiconductor, a polycrystalline semiconductor, or a semiconductor partly including crystal regions) may be used. A semiconductor having crystallinity is preferably used, in which case deterioration of transistor characteristics can be reduced.

<Color Filter and Black Matrix>

The color filter 221 is provided in order to adjust the color of light emitted from the light-emitting element 240 to increase the color purity. For example, in a full-color display device using white light-emitting elements, a plurality of pixels provided with color filters of different colors are used. In that case, the color filters may be those of three colors of red (R), green (G), and blue (B) or four colors (yellow (Y) in addition to these three colors). Further, a white (W) pixel may be added to R, G, and B pixels (and a Y pixel). That is, color filters of four colors (or five colors) may be used.

The black matrix 222 is provided between the adjacent color filters 221. The black matrix 222 shields a pixel from light emitted from the light-emitting element 240 in an adjacent pixel, thereby preventing color mixture between the adjacent pixels. When the color filter 221 is provided so that its end portion overlaps the black matrix 222, light leakage can be reduced. The black matrix 222 can be formed using a material that blocks light emitted from the light-emitting element 240, for example, a metal or an organic resin containing a pigment. Note that the black matrix 222 may be provided in a region other than the display portion 201, for example, in the scan line driver circuit 202.

An overcoat may be formed to cover the color filter 221 and the black matrix 222. The overcoat protects the color filter 221 and the black matrix 222 and suppresses the diffusion of impurities included in the color filter 221 and the black matrix 222. The overcoat is formed using a material that transmits light emitted from the light-emitting element 240, and can be formed using, for example, an inorganic insulating film or an organic insulating film.

[Structure Example of Lighting Device]

A structure example of a lighting device including an organic EL element is described below as another example of the light-emitting device of one embodiment of the present invention. Note that the same parts as those described above are not described here.

Figure 5A:
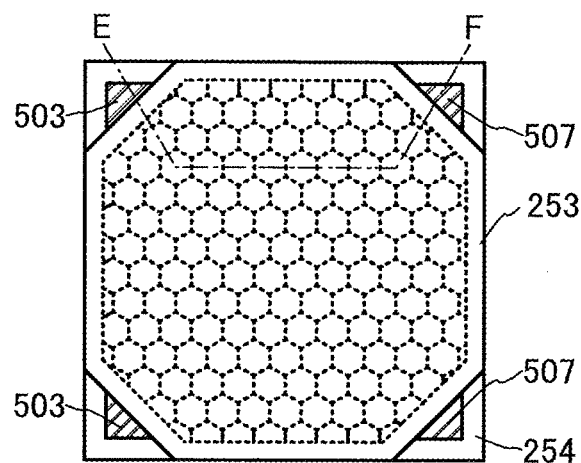
FIGS. 5A and 5B illustrate a structure example of a light-emitting device of an embodiment.
Figure 5B:
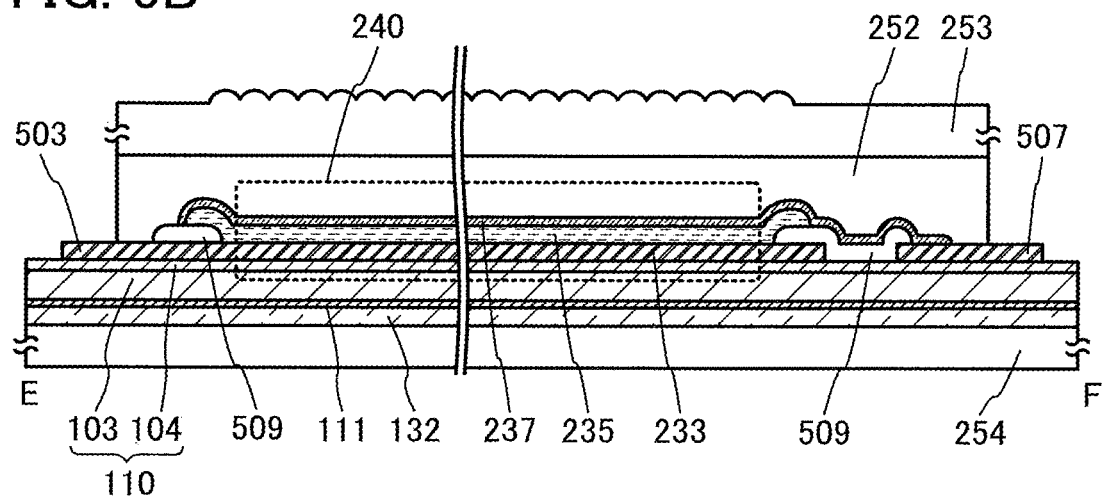

FIG. 5A is a schematic top view of a light-emitting device 500 described in this structure example. FIG. 5B is a schematic cross-sectional view taken along the cutting line E-F in FIG. 5A. The light-emitting device 500 is a lighting device with a top-emission structure. The lighting device may have a bottom-emission structure like the one illustrated in FIG. 4.

In the light-emitting device 500, the layer 110 to be peeled including the first layer 103 and the second layer 104 is provided over the flexible substrate 254 with the bonding layer 132 interposed therebetween. In addition, the light-emitting element 240 is provided over the second layer 104. In addition, the flexible substrate 253 is provided over the light-emitting element 240 with the sealing layer 252 interposed therebetween.

An extraction electrode 503 electrically connected to the first electrode 233 in the light-emitting element 240 and an extraction electrode 507 electrically connected to the second electrode 237 are provided at the positions over the second layer 104 which do not overlap the substrate 253.

In FIG. 5B, the extraction electrodes 503 and 507 are formed on the same surface and formed by processing the same conductive film as the first electrode 233. In addition, in FIG. 5B, part of the first electrode 233 forms the extraction electrode 503.

The second electrode 237 is extended beyond an insulating layer 509 covering end portions of the first electrode 233 and the extraction electrode 507 to be in contact with the extraction electrode 507, whereby the second electrode 237 is electrically connected to the extraction electrode 507.

Note that the extraction electrodes 503 and 507 may be formed using a conductive film different from the conductive film of the first electrode 233 in a different step. At this time, the conductive film preferably contains copper, in which case the conductivity can be increased.

The insulating layer 509 covers the end portion of the first electrode 233 in order to avoid a short circuit between the second electrode 237 and the first electrode 233. An upper end portion or a lower end portion of the insulating layer 509 preferably has a curved surface with a curvature radius of, for example, 0.2 µm or more and 3 µm or less in order to be adequately covered with the second electrode 237 formed over the insulating layer 509. As a material of the insulating layer 509, an organic compound such as a negative photosensitive resin or a positive photosensitive resin, or an inorganic compound such as silicon oxide or silicon oxynitride can be used.

As illustrated in FIGS. 5A and 5B, lens-shaped projections are preferably formed on a surface of the substrate 253 which does not face the light-emitting element 240. The projections are formed in order to suppress the occurrence of total reflection of light emitted from the light-emitting element 240 at an interface between the substrate 253 and the outside (the air). A lens array, a microlens array, a diffusion sheet, or a diffusion film which is formed of a high refractive index material, or the like can be provided on the surface of the substrate 253. In particular, with the use of a microlens array, the outcoupling efficiency can be efficiently improved and the viewing angle dependence can also be improved; thus, a lighting device with uniform light emission luminance can be achieved.

As a method for forming the projections on the surface of the substrate 253, a photolithography method, a nano-imprinting method, a sandblasting method, or the like can be employed.

Here, it is preferable that the refractive index of the substrate 253 be higher than or equal to the refractive index of the sealing layer 252. That is, it is preferable that the reflective index be set such that a material positioned further from the light-emitting element 240 has a higher refractive index. This structure prevents the occurrence of total reflection at each interface of layers, resulting in extraction of substantially all light emitted from the light-emitting element 240.

The above is the description of this structure example.

The display devices described in this embodiment have both high flexibility and high reliability.

Note that this embodiment can be combined with any of the other embodiments and the examples described in this specification as appropriate.

Embodiment 3

In this embodiment, a peeling mechanism relating to the peeling method of one embodiment of the present invention is described.

[Consideration of Peeling Area]

In the peeling method of one embodiment of the present invention, peeling occurs in an oxide layer interposed between a peeling layer and a layer to be peeled. At this time, it is important, in examining the peeling mechanism, to examine in which of the following three areas a bond is most likely to be cut: an interface between the peeling layer and the oxide layer, an interface between the oxide layer and the layer to be peeled, and the inside of the oxide layer. The bond energy in each of the three areas was estimated to examine in which of the areas peeling is likely to be generated.

In this embodiment, the peeling layer and the layer to be peeled are assumed to be a tungsten (W) film and a silicon oxide ($SiO_2$) film, respectively. Since W tends to have two states of $WO_2$ that is an oxide of quadrivalent W and $WO_3$ that is an oxide of hexavalent W, the oxide layer is assumed to be an oxide having the two kinds of states.

Figure 6A:
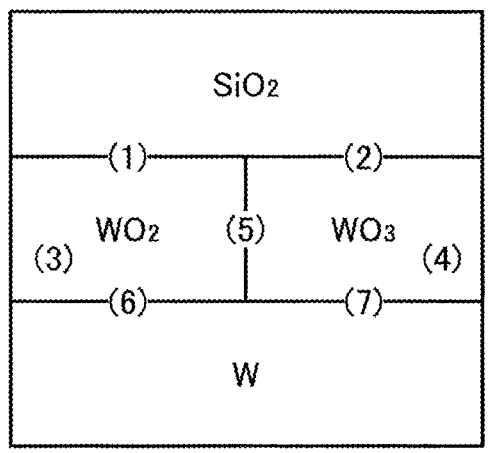
FIGS. 6A and 6B illustrate a model used for calculation of an embodiment.

FIG. 6A shows peeling areas used in calculation. In the structure shown in FIG. 6A, $WO_2$ that is an oxide of quadrivalent tungsten and $WO_3$ that is an oxide of hexavalent tungsten are included between W and $SiO_2$.

In FIG. 6A, there can be seven areas where the bond can be cut because of peeling: (1) $SiO_2/WO_2$ interface, (2) $SiO_2/WO_3$ interface, (3) inside of $WO_2$, (4) inside of $WO_3$, (5) $WO_2/WO_3$ interface, (6) $WO_2/W$ interface, and (7) $WO_3/W$ interface. The bond energy of each area was calculated as described below.

Figure 6B:
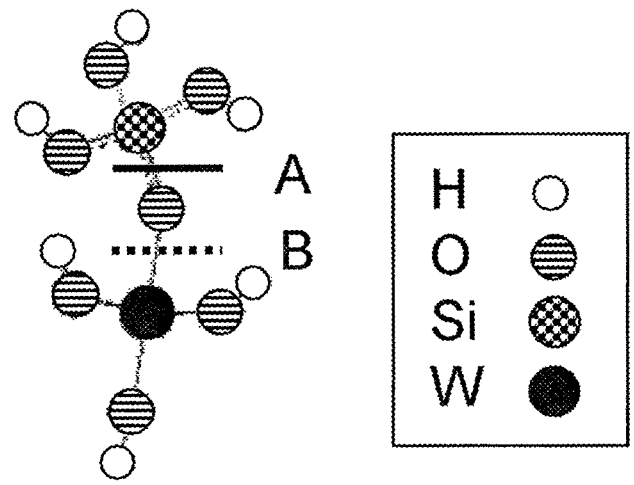

A cluster model was used as a calculation model. FIG. 6B shows an example of the cluster model. FIG. 6B shows a cluster model used for the calculation of the bond energy between $SiO_2$ and $WO_2$. In the cluster model shown in FIG. 6B, oxygen atoms bonded to Si and W are terminated with hydrogen atoms (H). The bond energy of two areas, in the cluster model, of the Si atom side (A) and the W atom side (B), between which an oxygen atom cross-linking Si and W is interposed, is calculated.

For the calculation of the bond energy, structure optimization and vibration analysis were performed using density functional theory. As a functional, B3LYP was used. The electric charge was 0, and a singlet state, a doublet state, and a quintet state were considered for the spin multiplicities. In addition, LanL2DZ was adopted as a basis function for all atoms. Note that Gaussian 09 was used as the quantum chemistry computational program. A high performance computer (Altix 4700, manufactured by SGI Japan, Ltd.) was used for the calculations. The zero point correction was added to the calculated bond energy.

Note that in the cluster model, atoms other than the cross-linking oxygen atom have a high degree of freedom of movement and are positioned to stabilize the energy. In fact, however, these atoms cannot move freely because of the adjacent atoms. Therefore, it needs to be noted that there might be a slight difference in energy value between the cluster model and an actual system because of their different degrees of freedom of movement.

Figure 7:
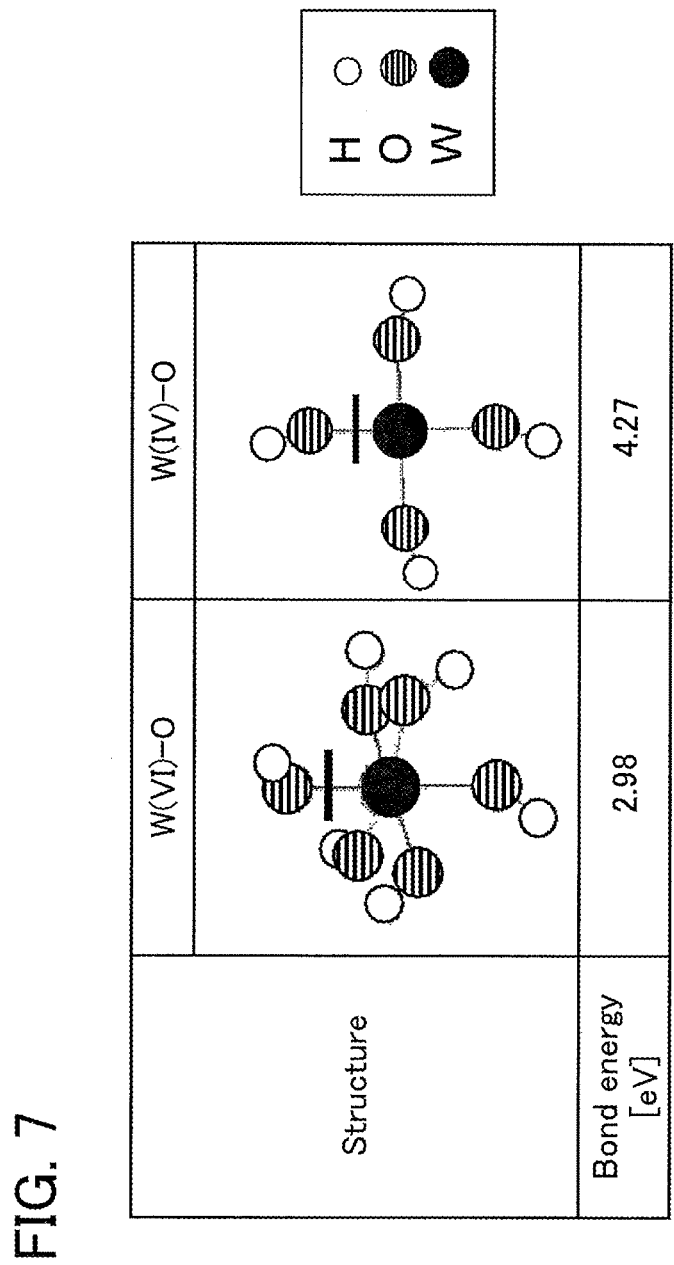
FIG. 7 shows calculation results of bond energies of an embodiment.

FIG. 7 shows calculated bond energy between a W atom and an O atom in each of $WO_3$ having a hexavalent W atom and $WO_2$ having a quadrivalent W atom. A cluster model in which a dangling bond of an O atom is terminated with an H atom is used in the following description unless otherwise specified.

According to FIG. 7, the bond energy of the W—O bond in the oxide of the hexavalent W atom is lower than that of the W—O bond in the oxide of the quadrivalent W atom. This means that the W—O bond in the oxide of the hexavalent W atom is easily cut.

Figure 8:
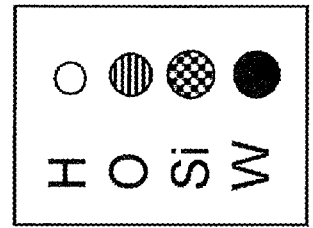
FIG. 8 shows calculation results of bond energies of an embodiment.

FIG. 8 shows the bond energy calculated in consideration of the areas shown in FIG. 6A.

According to FIG. 8, the following are indicated: the Si—O bond (A) energy is lower than the W—O bond (B) energy in (1) $SiO_2/WO_2$ interface and B is lower than A in (2) $SiO_2/WO_3$ interface. The bond energy with Si in (1) is lower than that in (2), indicating that peeling occurs easily in (1).

The W—O bond (B) energy of (5) $WO_2/WO_3$ interface is 1.09 eV, which is the lowest among (3) inside of $WO_2$, (4) inside of $WO_3$, and (5). This indicates that peeling occurs easily in an oxide layer in which $WO_3$ and $WO_2$ are mixed. As for (5), the W—O bond (A) energy in the oxide of the quadrivalent W atom is higher than that shown in FIG. 7 and the W—O bond (A) energy in the oxide of the hexavalent W atom is lower than that shown in FIG. 7. This is probably because electrons are attracted to the oxide of the quadrivalent W atom. Thus, the bond between the O atom and the hexavalent W atom is cut more easily than the bond between the O atom and the quadrivalent W atom.

The W—O bond energy of (6) $WO_2/W$ interface is 1.46 eV, which is lower than that of (7) $WO_3/W$ interface. This indicates that peeling occurs easily at (6).

The above results demonstrate that the W—O—W bond in which W atoms are cross-linked by an O atom is cut easily in the case where a quadrivalent W atom is included in an oxide layer. This indicates that peeling occurs easily at the $WO_2/WO_3$ interface and the $WO_2/W$ interface. In other words, peeling occurs easily when an oxide layer includes a large amount of $WO_2$.

Therefore, in order to improve peelability, it is important that $WO_3$ be reduced to $WO_2$ so that the $WO_2$ content in an oxide layer is increased.

In the peeling method of one embodiment of the present invention, the layer to be peeled over the oxide layer is formed of the first layer and the second layer from which hydrogen is released by heat treatment. In addition, $WO_3$ in the oxide layer can be reduced by hydrogen released from the layer to be peeled by heat treatment, so that the oxide layer can have a high $WO_2$ content. Consequently, peelability can be improved.

[Effect of Nitrogen (N) Atom]

As described above, the W—O bond is cut most easily at the time of peeling. In view of this, the bond energy at the time when the O atom cross-linking the W atoms is replaced with an N atom is analyzed.

Here, the bond energy of a W—N bond at the time when an NH group is introduced instead of the O atom cross-linking W atoms was calculated.

A cluster model in which one O atom is replaced with an NH group in $WO_3$ having a hexavalent W atom and a cluster model in which one O atom is replaced with an NH group in $WO_2$ having a quadrivalent W atom are shown in the upper part of FIG. 9. The W—O bond energy and the W—N bond energy of each of $WO_2$ and $WO_3$ were calculated.

According to FIG. 9, the bond energy of the W—N bond is lower than that of the W—O bond regardless of the valence. In addition, the W—O bond energy is lower than that of the model in FIG. 7 in which an N atom is not introduced. Thus, it is indicated that not only the W—N bond but also the W—O bond is cut easily by introducing the N atom.

Next, the calculated W—N bond energy in cluster models assuming (3) inside of $WO_2$, (4) inside of $WO_3$, and (5) $WO_2/WO_3$ interface shown in FIG. 6A, in each of which a cross-linking O atom is replaced with an NH group, is shown in the lower part of FIG. 9.

Even when the W atoms are cross-linked by the NH group, the magnitude relationship of the W—O bond energy shown in FIG. 9 is the same as that shown in FIG. 8. As for (4), the bond energy at the time when the W atoms are cross-linked by the NH group is lower than that at the time when the W atoms are cross-linked by the O atom. In particular, as for (5), the W—N bond (B) in an oxide having a hexavalent W atom has an extremely low bond energy of 0.42 eV.

The above results demonstrate that the bonds tend to be cut more easily by replacing the O atom cross-linking the W atoms with the N atom. This indicates that peeling occurs more easily by supplying nitrogen to the oxide layer.

Therefore, in order to improve peelability, it is important to supply a larger number of nitrogen atoms to the oxide layer.

In the peeling method of one embodiment of the present invention, the first layer from which nitrogen is released by heating and the second layer over the first layer which inhibits the release of nitrogen to the outside (i.e., blocks the release of nitrogen) are provided as the layer to be peeled provided over the oxide layer. In addition, a large amount of nitrogen released from the layer to be peeled by heat treatment is supplied to the oxide layer, so that the oxide layer can contain a large amount of nitrogen. Consequently, peelability can be improved.

[Consideration of Improvement in Peelability at the Time of Water Injection]

As described in Embodiment 1, liquid containing water is added to a peeling interface at the time of peeling and the liquid penetrates into the peeling interface, so that peelability is improved. The function of water in peeling is described below.

<Relationship between Liquid Type and Peelability>

Examination was performed to check whether the force required for peeling varies depending on the type of liquid injected at the time of peeling, and examination results are described.

Figure 10:
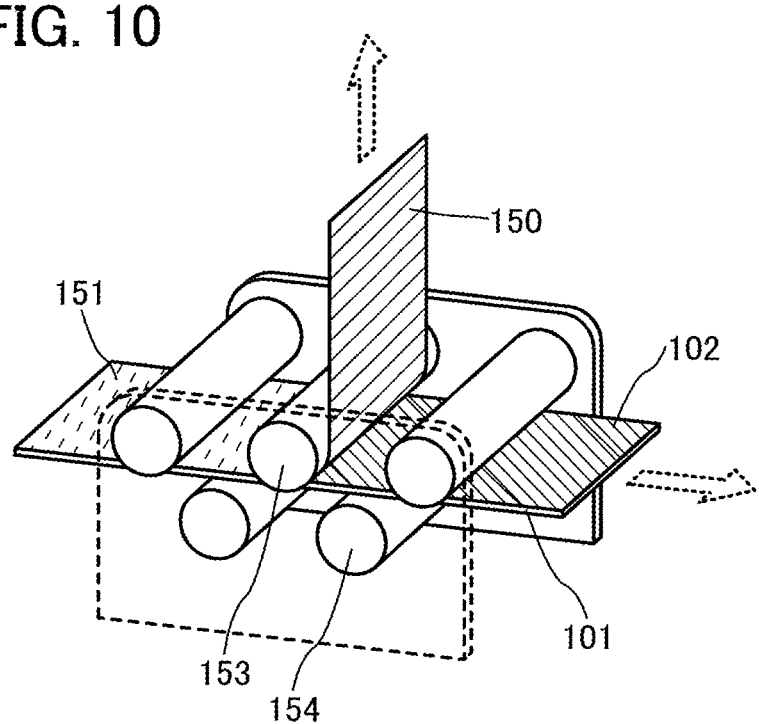
FIG. 10 illustrates a structure example of an apparatus used for a peeling test of an embodiment.

The force required for peeling was examined with a jig illustrated in FIG. 10. The jig illustrated in FIG. 10 includes a plurality of guide rollers 154 and a plurality of support rollers 153. A tape 151 is attached onto a layer 150 including a layer to be peeled which is formed over the support substrate 101 and an end portion of the tape 151 is partly peeled in advance. Then, the support substrate 101 is fixed to the jig so that the tape 151 is held by the support rollers 153, and the tape 151 and the layer 150 including the layer to be peeled are positioned perpendicular to the support substrate 101. The force required for peeling can be measured as follows: when the tape 151 is pulled perpendicular to the support substrate 101 to peel the layer 150 including the layer to be peeled from the support substrate 101, the force required for the pulling in the perpendicular direction is measured. During the peeling, the support substrate 101 moves in the plane direction along the guide rollers 154 with the peeling layer 102 exposed. The support rollers 153 and the guide rollers 154 are rotatable so that the layer 150 including the layer to be peeled and the support substrate 101 are not affected by friction during the move.

A sample used was manufactured as follows. First, an approximately 100-nm-thick silicon oxynitride film was formed over a glass substrate by a plasma CVD method, and then an approximately 50-nm-thick W film was formed as a peeling layer by a sputtering method. After that, an approximately 600-nm-thick silicon oxynitride film was formed as a first layer and an approximately 50-nm-thick silicon nitride oxide film was formed as a second layer, and over the silicon nitride oxide film, an approximately 100-nm-thick silicon oxynitride film and an approximately 66-nm-thick silicon film were formed. After that, heat treatment was performed at 650° C. for 6 minutes. Next, the silicon film was irradiated with laser light to form polysilicon, and then a gate insulating film, a gate electrode, an interlayer insulating layer, a source and drain electrodes, and an interlayer insulating layer, an electrode, and the like are formed to manufacture a transistor. In a process after the heat treatment performed at 650° C. for 6 minutes, a step at temperatures of 650° C. or higher is not performed.

As described above, the sample in which the peeling layer and the layer to be peeled were provided over the glass substrate is manufactured.

Next, the support substrate was cut into a size of 20 mm×126.6 mm, and a UV film (UHP-0810MC produced by DENKI KAGAKU KOGYO KABUSHIKI KAISHA) was attached as the tape 151 to the cut support substrate by a tape mounter. After that, an approximately 20 mm of an end portion of the UV film was peeled, and the sample was fixed to the jig.

For a peeling test, a compact table-top universal tester (EZ-TEST EZ-S-50N) manufactured by Shimadzu Corporation was used. For the peeling test, an adhesive tape/adhesive sheet testing method based on standard number JIS Z0237 of Japanese Industrial Standards (JIS) was employed. Note that liquid was dripped into a portion to be peeled after the sample is fixed to the jig.

Figure 11:
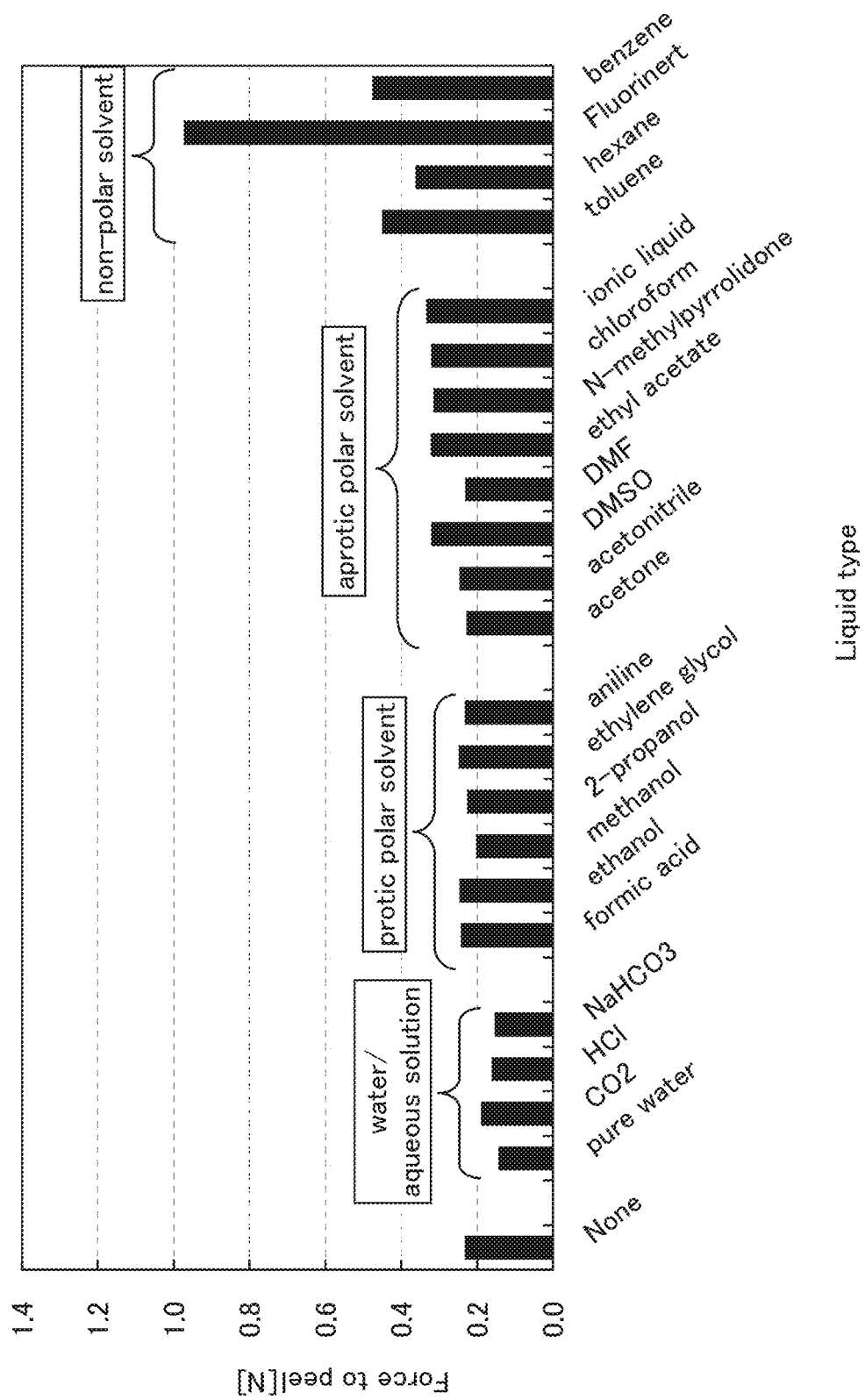
FIG. 11 shows the relationship between the peelability and the types of liquid used for separation of an embodiment.

FIG. 11 shows the force required for peeling which was measured by changing the types of liquid supplied at the time of peeling.

The liquid used for the measurement is broadly classified into four types: water/aqueous solution, a protic polar solvent, an aprotic polar solvent, and a non-polar solvent. As the water/aqueous solution, pure water, a $CO_2$ aqueous solution, an HCl aqueous solution, and an $NaHCO_3$ aqueous solution were used. As the protic polar solvent, formic acid, ethanol, methanol, 2-propanol, ethylene glycol, and aniline were used. As the aprotic polar solvent, acetone, acetonitrile, DMSO, DMF, ethyl acetate, N-methylpyrrolidone, chloroform, and N-methyl-N-n-pentylpyrrolidinium bis(trifluoromethylsulfonyl)imide that is ionic liquid were used. As the non-polar solvent, toluene, hexane, Fluorinert™, and benzene were used. In addition, the force required for peeling without liquid injection was measured for comparison.

According to the results shown in FIG. 11, the force required for peeling in the case of using the water/aqueous solution that is liquid containing water tends to be lower, that is, peelability tends to be higher than that in the case of not using liquid. On the other hand, the force required for peeling tends to increase in the order of the protic polar solvent, the aprotic polar solvent, and the non-polar solvent. In particular, the use of the non-polar solvent has an adverse effect on the peelability.

These results indicate that the existence of hydrogen ions is involved when peelability is improved by the injection of liquid to a peeling surface. The existence of hydrogen ions might work more effectively particularly when water or an aqueous system liquid is selected.

<Effect of Water Molecule>

Analysis results of the relationship between a water molecule and peelability, which are obtained by examining a peeling process at the time when a water molecule is injected, is described below.

As described above, peeling might be less likely to occur at the interface with $WO_3$ than at the interface with $WO_2$. Thus, calculation was performed focusing on the W—O bond energy in $WO_3$ which is higher than that in $WO_2$.

Figure 12A:
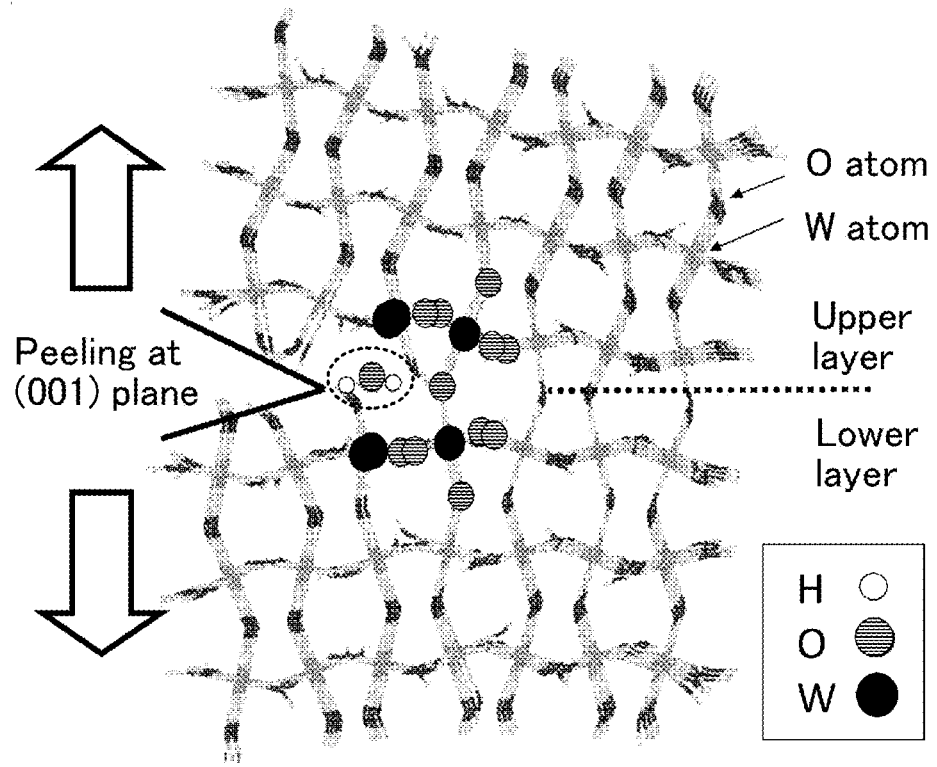
FIGS. 12A to 12C show models used for calculation of an embodiment.

FIG. 12A shows a model used for the calculation. Peeling occurs at a (001) plane in a $WO_3$ crystal structure. Here, a case is considered where peeling occurs at an O atom to which attention is paid and which cross-links two W atoms and proceeds from the left side of FIG. 12A. On the left side of the O atom in FIG. 12A, there are separated upper and lower layers, while on the right side including the O atom in FIG. 12A, the upper and lower layers are connected. Here, a water molecule surrounded by a dashed line is positioned close to the O atom to which attention is paid.

Figure 12B:
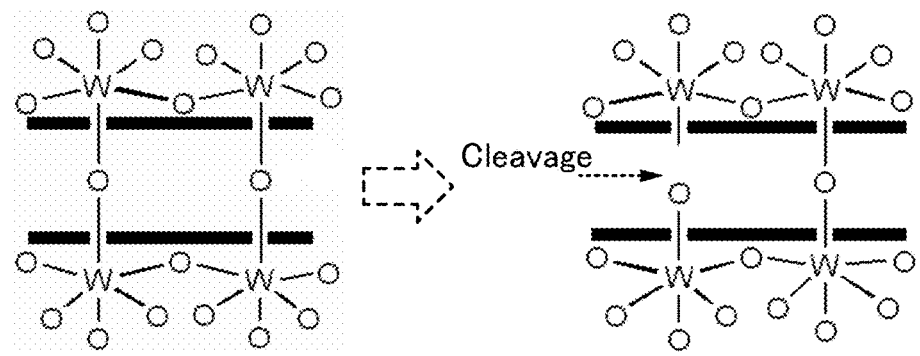

Next, the examined peeling process is described. In the case where a water molecule does not exist, the W—O bond in which an O atom cross-links W atoms is cleaved at the time of peeling as shown in FIG. 12B. Although the W atoms and the O atom have dangling bonds after the cleavage, atoms terminating the dangling bonds do not exist.

Figure 12C:
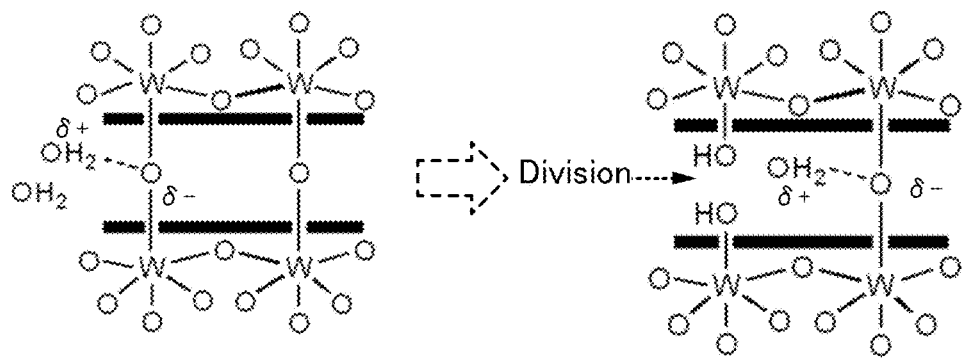

In contrast, in the case where a water molecule exists as shown in FIG. 12C, the water molecule probably forms a hydrogen bond with an O atom cross-linking W atoms before peeling. By the formation of the hydrogen bond, the cross-linking O atom is more negatively charged than that at the time when a hydrogen bond is not formed, and one of the H atoms which is involved in the hydrogen bond is more positively charged than the other H atom. As a result, the O atom and the H atom electrostatically work on each other to cause a moderating effect, which might lead to a weak W—O bond. In addition, the W—O bond is cleaved with peeling and the W atom and the O atom have dangling bonds; however, the dangling bonds are probably terminated with an H group and an OH group derived from the water molecule. A steric effect of two OH groups occurs because of the termination, which might lead to a weak W—O bond which is to be cleaved.

As described above, as functions of the water molecule in peeling, the moderating effect due to the electrostatic interaction before peeling, the steric effect of the OH groups after peeling, and the like can be given. In the following description, the assumption that peeling occurs easily because of these effects is verified.

An ONIOM method that is one of the quantum mechanics/molecular mechanics methods was used for the calculation. For a QM region in which atoms are represented as circles in the calculation model in FIG. 12A, the density functional theory was used, B3LYP was used as a functional, and LanL2DZ was used as a basis function. For an MM region in which atoms are represented as poles, a universal force field was used as a force field. The electric charge was 0, and a singlet state was considered for spin multiplicities.

Figure 13A:
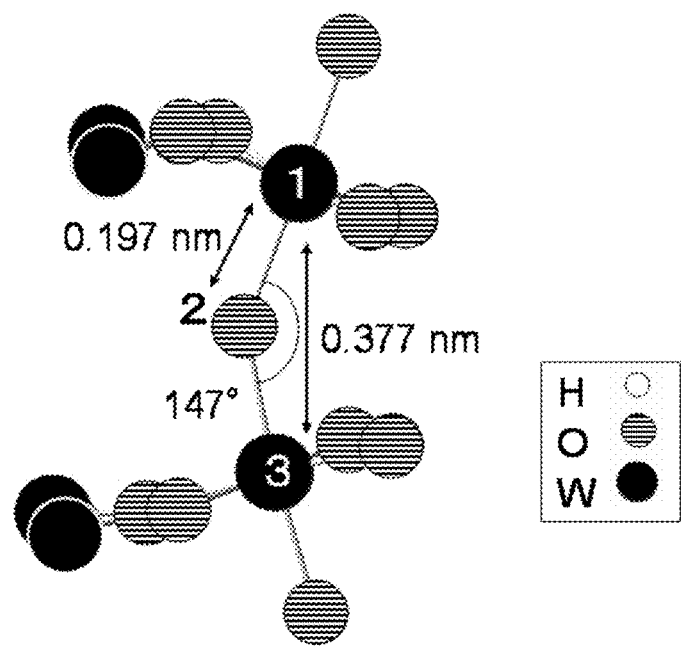
FIGS. 13A and 13B show calculation results of a cross-link structure of an embodiment.
Figure 13B:
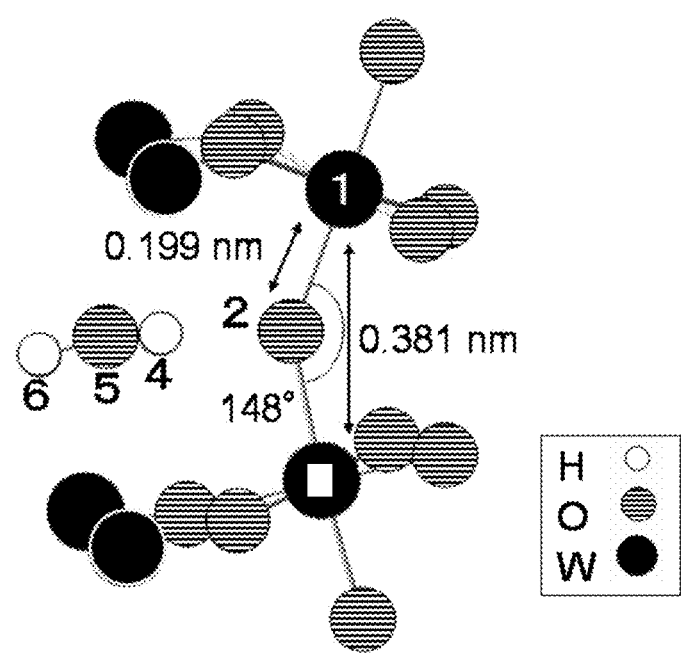

First, electric charge distributions and changes in structure at the time when a water molecule exists and when a water molecule does not exist were analyzed. FIGS. 13A and 13B show cross-linked structures at the time when a water molecule does not exist and when a water molecule exists, respectively. Table 1 shows the electric charge (Mulliken charge) distribution in numbered atoms in FIGS. 13A and 13B.

TABLE 1

| | Electric Charge (Mulliken Charge) Distribution | |
| --- | --- | --- |
| Atom | Without water molecule | With water molecule |
| 1W | 2.12 | 2.10 |
| 2O | −0.81 | −0.90 |
| 3W | 2.09 | 2.08 |
| 4H | — | 0.48 |
| 5O | — | −0.69 |
| 6H | — | 0.34 |

According to Table 1, in the cross-linked structure before peeling, the charge of a cross-linking atom represented by 2 (hereinafter, 2O) shifts in the negative direction because of the water molecule. This indicates that a hydrogen bond is formed between the water molecule and the cross-linking O atom and an electron is attracted to the 2O atom. In addition, as for the bond length between an atom represented by 1 (hereinafter, 1 W) and 2O in the cross-linked structure, the bond length at the time when the water molecule exists is longer than that at the time when a water molecule does not exist as shown in FIGS. 13A and 13B.

From the above results, it is presumed that an increase in the electron density of the hydrogen bond between a 4H atom in the water molecule and the cross-linking 2O atom causes a decrease in the electron density of the 1 W-2O bond, so that the 1 W-2O bond is cut easily. The results indicate that the electrostatic interaction of the water molecule causes structure relaxation, so that peeling occurs easily.

Figure 14A:
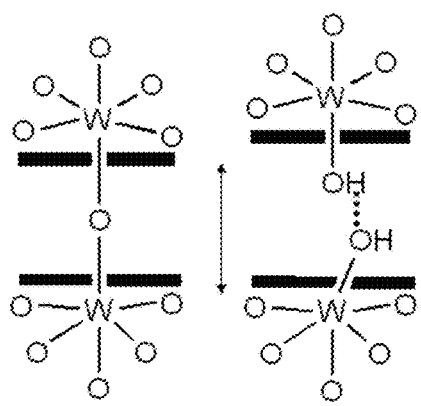
FIGS. 14A and 14B show calculation results of a cross-link structure of an embodiment.

Next, the steric effect of OH groups was examined. Assuming that dangling bonds are terminated with an H group and an OH group from a water molecule, as shown in FIG. 14A, the distance between an upper and lower layers is estimated to be long because of the steric repulsion (i.e., steric effect) of the OH groups of the case where the dangling bonds of the W atoms are terminated with the OH groups (the right drawing) as compared to the case where W atoms are cross-linked with an O atom (the left drawing).

Figure 14B:
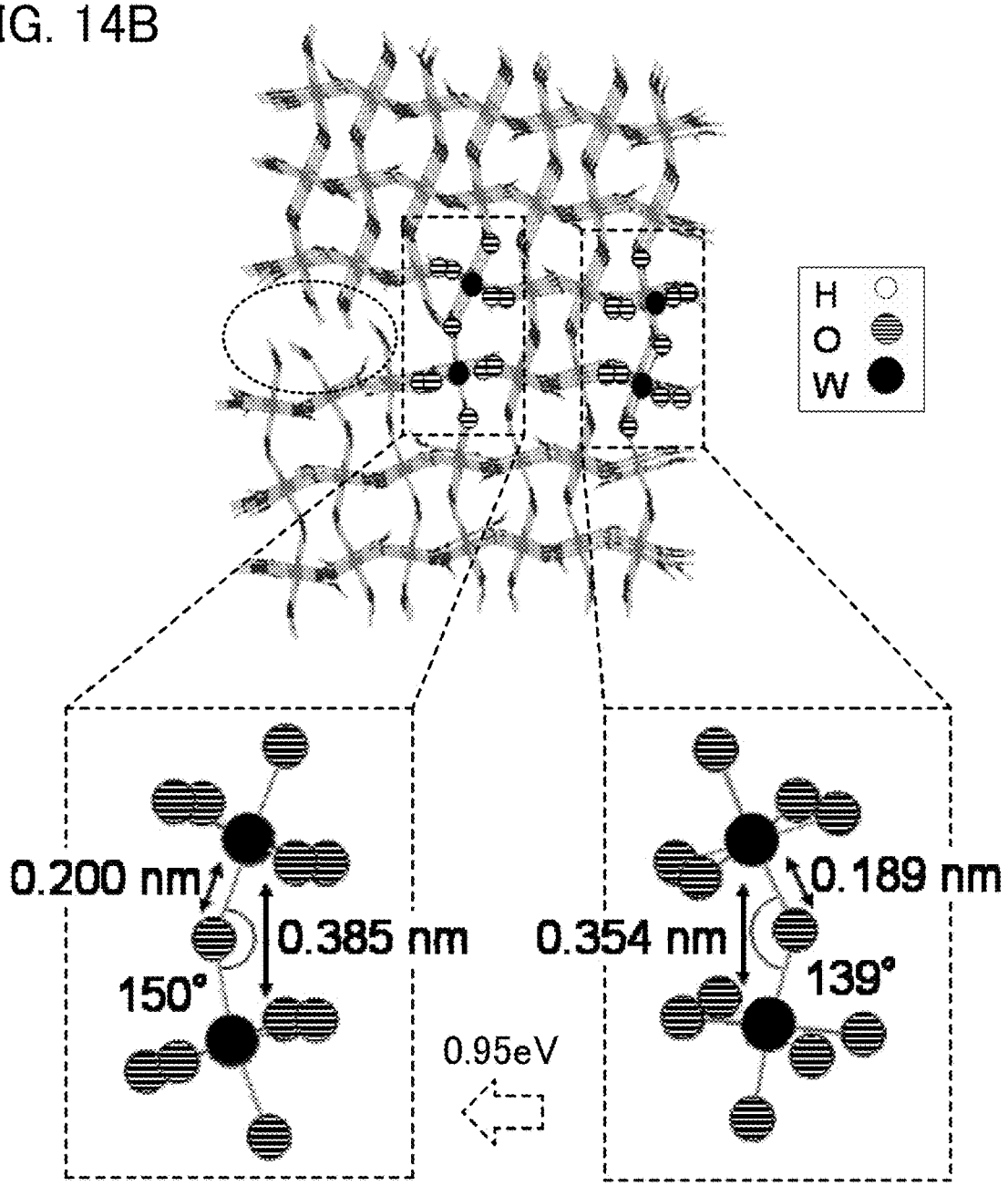

FIG. 14B shows an analyzed structure and an energy change. A region surrounded by an ellipse in FIG. 14B has steric effects of OH groups. In the bottom part of FIG. 14B, enlarged cross-linked structures in an area adjacent to the region with the steric effects and an area sufficiently away from the region are shown.

A comparison between the cross-linked structures of the two areas reveals that the steric effect of the OH groups increases both the W—W bond length by approximately 0.031 nm and the W—O bond length by approximately 0.011 nm. This means that the W—O bond is weak and is cut easily. In addition, in the cross-linked structure in the area adjacent to the region with the steric effects, an upper and lower layers are extended in the opposite directions because of the steric effects, so that the energy of the system is activated by approximately 0.95 eV; thus, the W—O bond is cleaved easily.

The above results indicate that peeling occurs easily because of the steric effects of the OH groups which are caused when the dangling bonds are terminated with the OH groups.

Next, the assumption that the dangling bonds are terminated with the OH groups were examined. Here, how dissociation of a water molecule occurs in a peeling process at the time when the water molecule exists was considered. An analyzed reaction path and an energy diagram are shown in FIG. 15.

Figure 15:
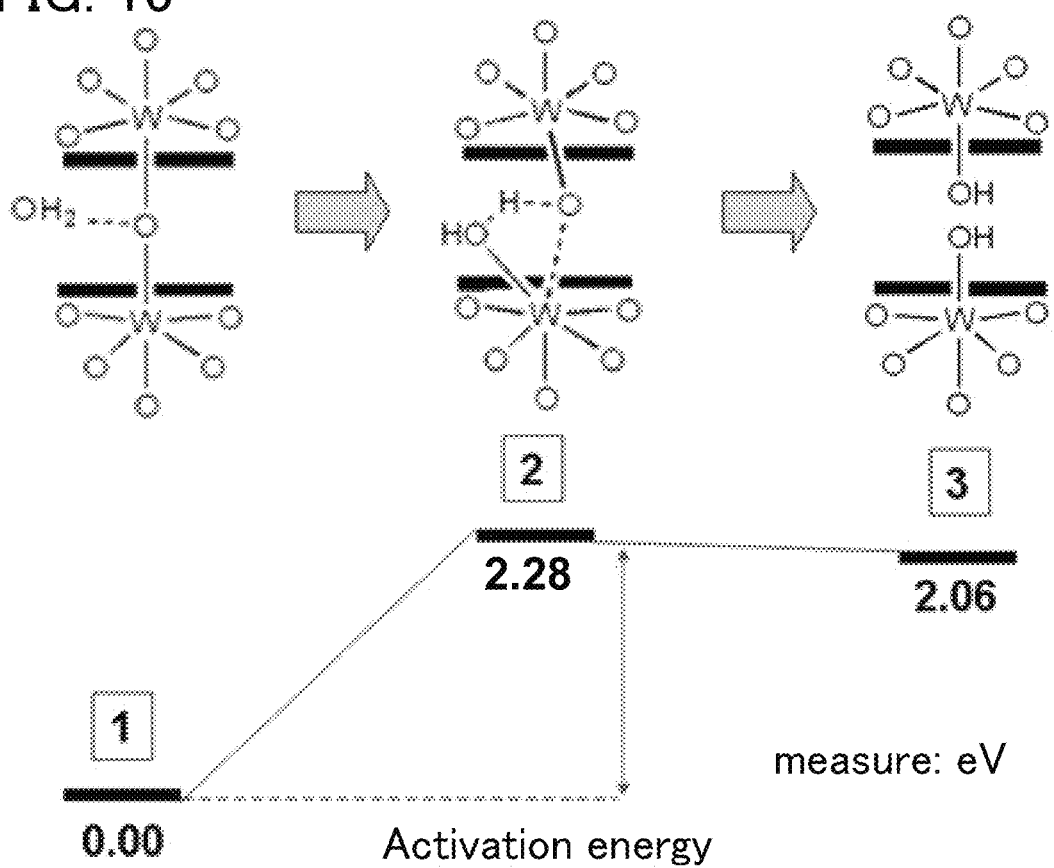
FIG. 15 shows calculation results of an energy diagram of an embodiment.

As the reaction path, a process in FIG. 15 in which a reaction proceeds from State 1 to State 3 through State 2 was considered. In State 1, a cross-linking O atom and a water molecule have a weak interaction. State 2 is a transition state in which the O atom in the water molecule forms a bond with the W atom and an H atom derived from the water molecule moves close to the cross-linking O atom. In State 3, the W—O bond has been cleaved and dangling bonds of the W atoms are terminated with OH groups.

In the energy diagram shown in the bottom part of FIG. 15, State 1 is used as a reference. In State 2 that is the transition state in which the peeling and termination with the OH groups occur at the same time, the activation energy is 2.28 eV. The activation energy is lower than the peeling energy at the time when a water molecule does not exist (3.61 eV); this indicates that peeling occurs easily because of the water molecule.

In State 3 after the transition, the relative energy is 2.06 eV, which means that State 3 is not as stable as State 1. This is probably because of a steric effect of the OH groups.

The above results reveal that performing peeling and termination of dangling bonds with OH groups at the same time is advantageous in terms of energy. Peelability is improved in a peeling process probably because of the above-described function of the water molecule.

Note that this embodiment can be combined with any of the other embodiments and the examples described in this specification as appropriate.

Embodiment 4

In this embodiment, a peeling apparatus to which the peeling method of one embodiment of the present invention can be applied is described with reference to drawings.

[Structure Example of Peeling Apparatus]

In mass production of flexible devices, thin-film integrated circuits are formed using a large support substrate and the circuits are automatically peeled from the support substrate, so that the following effects can be obtained: a reduction in working hours, an improvement in manufacturing yields of products, and a reduction in manufacturing costs.

When a layer to be peeled including thin-film integrated circuits is peeled from a support substrate, a carrier tape which has been attached to the layer to be peeled in advance is pulled. The carrier tape is not needed after peeling and thus is removed.

When force is applied to the carrier tape because of the pulling and removal of the carrier tape, defective peeling and a crack in the thin-film integrated circuit might be caused depending on the speed of the carrier tape or the direction in which the carrier tape is sent.

Figure 16:
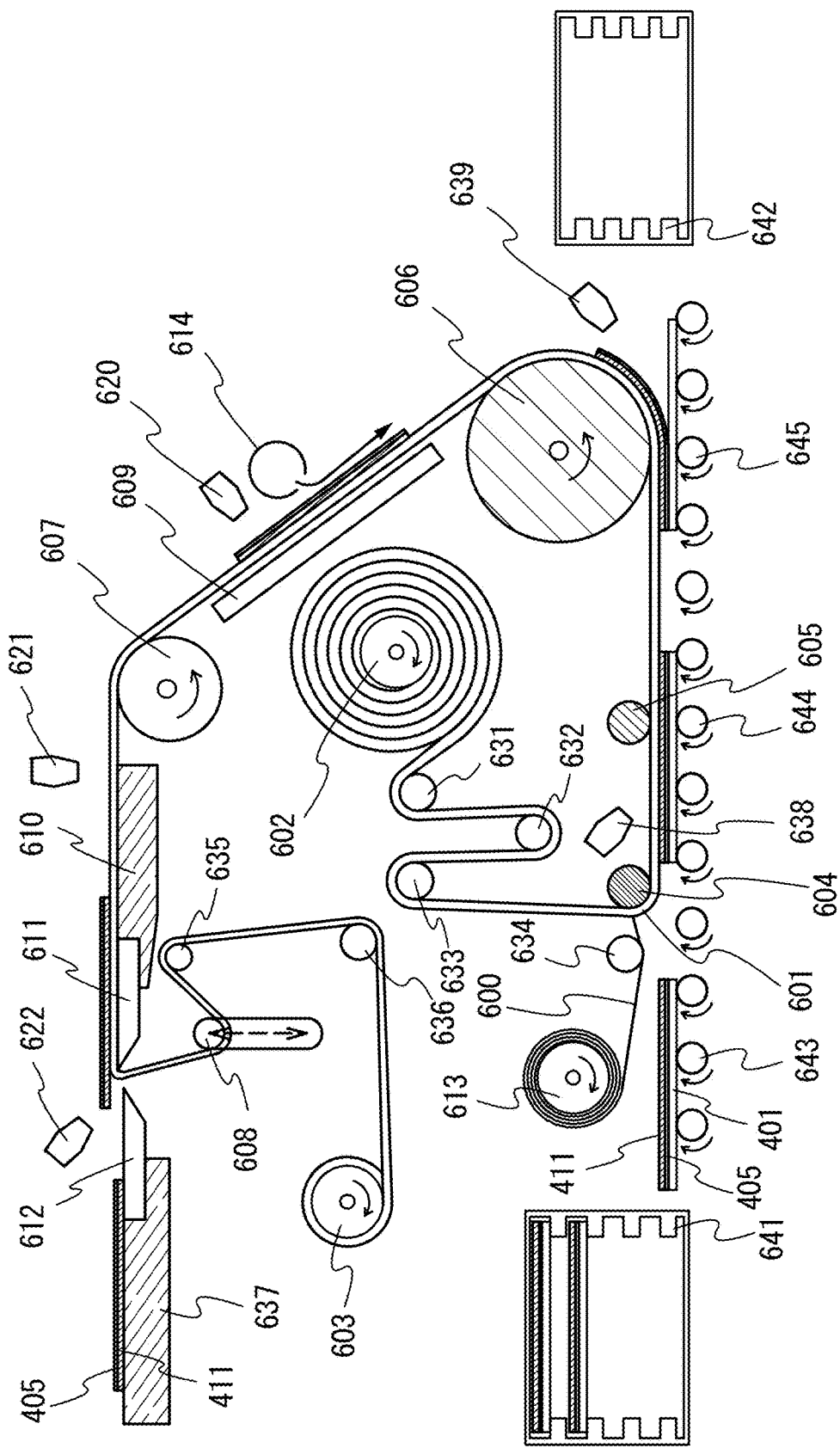
FIG. 16 illustrates a structure example of a peeling apparatus of an embodiment.

A process in which the carrier tape is attached to the layer to be peeled and a process in which the carrier tape is peeled are automated utilizing a peeling apparatus in which the force applied to the carrier tape, the speed of the carrier tape, and the direction in which the carrier tape is sent are adjusted. FIG. 16 illustrates an example of the peeling apparatus capable of automating these processes.

The peeling apparatus illustrated in FIG. 16 includes at least a plurality of transfer rollers transferring a support substrate, a tape reel 602 sending a carrier tape 601, a first wind-up reel 603 winding the carrier tape 601, a plurality of guide rollers (e.g., guide rollers 631, 632, and 633) guiding the carrier tape 601 to the first wind-up reel 603, and a first press roller 606 peeling a layer to be peeled including thin-film integrated circuits from a support substrate.

In the peeling apparatus illustrated in FIG. 16, a separation tape (also called separate film) 600 of the carrier tape 601 is pulled by a second wind-up reel 613 to be peeled in order to expose a bonding surface of the carrier tape 601.

The bonding surface of the carrier tape 601 which is exposed by peeling the separation tape 600 is pressed against a support substrate by a second press roller 605 and a transfer roller 644.

When a layer to be peeled including thin-film integrated circuits is peeled from a support substrate, the following factors are important in order to inhibit crack generation in the thin-film integrated circuits: the angle between the direction in which a board is transferred by the transfer roller 644 (i.e., the horizontal direction) and the direction in which the carrier tape 601 is sent, which is changed by the first press roller 606, the diameter of the first press roller 606, the material of the first press roller 606, the speed of the carrier tape 601, and the like.

The peeling apparatus illustrated in FIG. 16 also includes a roller 607 changing the direction in which the carrier tape 601 is sent into the horizontal direction, a tension roller 608 pulling the carrier tape 601 in the direction in which the carrier tape 601 is turned back, and a first wedge member 611 placed at the position where the carrier tape 601 is turned back.

When a layer to be peeled including thin-film integrated circuits is peeled from the carrier tape 601, the following factors are important in order to inhibit crack generation in the thin-film integrated circuits: an acute angle at which the carrier tape 601 is turned back, the angle of a tip of the first wedge member 611 which is in contact with the carrier tape 601, the speed at which the carrier tape 601 is wound up on the first wind-up reel 603, and the like.

In the peeling apparatus illustrated in FIG. 16, when a layer to be peeled including thin-film integrated circuits is peeled from a support substrate, the exposed surface of the layer to be peeled faces upward, and the layer to be peeled including thin-film integrated circuits is transferred so that the layer is not in contact with a table 637 and then placed on the table 637.

A first carrier plate 610 is placed between the table 637 and the roller 607 changing the direction in which the carrier tape 601 is sent into the horizontal direction. The first wedge member 611 is fixed to the carrier plate 610. A second wedge member 612 is fixed to the table 637. The carrier tape 601 passes through a space between the first wedge member 611 and the second wedge member 612 to be wound up on the first wind-up reel 603.

Peeling can be performed manually by a practitioner; however, it is time-consuming and skills are required for quick peeling. For these reasons, peeling needs to be automated by the peeling apparatus illustrated in FIG. 16. The automation by the peeling apparatus illustrated in FIG. 16 makes it possible to transfer a substrate and perform peeling at a constant speed, to apply uniform force to the carrier tape 601, and to inhibit defective peeling and crack generation in thin-film integrated circuits.

In other words, one embodiment of the present invention is a peeling apparatus which includes at least a tape reel which sends a carrier tape one surface of which is provided with a separation tape, a first wind-up reel winding up the carrier tape, a second wind-up reel between the tape reel and the first wind-up reel, which pulls the separation tape to peel it so that a bonding surface of the carrier tape is exposed, a transfer unit which transfers a support substrate one surface of which is provided with a layer to be peeled including thin-film integrated circuits, and a first press roller which separates the layer to be peeled including thin-film integrated circuits from the support substrate.

In the above structure, as the transfer unit transferring a support substrate, a transfer roller, a belt conveyor, a transfer robot, or the like can be used.

In addition, in the above structure, a second press roller which bonds a support substrate to a bonding surface of the carrier tape is provided between the tape reel and the first press roller. Uniform force can be applied to the carrier tape and the support substrate by the second press roller while the support substrate is transferred.

In addition, in the above structure, a roller changing the direction in which the carrier tape is sent into the horizontal direction is provided between the first press roller and the first wind-up roller. The direction in which the carrier tape is transferred between the roller changing the direction in which the carrier tape is sent into the horizontal direction and the first press roller is oblique to the horizontal direction. The carrier tape is transferred in the oblique direction, whereby a layer to be peeled including thin-film integrated circuits which is attached to the carrier tape is blow dried to remove excess moisture, so that water mark generation can be inhibited. The thin-film integrated circuit is static-sensitive. For this reason, it is preferable that the layer be peeled including thin-film integrated circuits be peeled from the support substrate with moisture supplied in advance to an interface between the support substrate and the layer to be peeled including thin-film integrated circuits. Thus, it is effective to blow dry the layer to be peeled including thin-film integrated circuits just after being peeled from the support substrate and to flow down the stream along the oblique direction of the carrier tape so that water is dripped down.

The direction in which the carrier tape is transferred between the roller changing the direction in which the carrier tape is sent into the horizontal direction and the first press roller can be perpendicular to the horizontal direction. In such a case, however, the carrier tape is unstable and shakes when transferred. Therefore, transferring the carrier tape in the oblique direction is effective.

Another embodiment of the present invention is a peeling apparatus which includes at least a tape reel which sends a carrier tape one surface of which is provided with a separation tape, a first wind-up reel winding up the carrier tape, a roller which changes the direction in which the carrier tape is sent into the horizontal direction between the tape reel and the first wind-up reel, a roller which pulls the carrier tape in the direction in which the carrier tape is turned back, and a first wedge member placed at the position where the carrier tape is turned back.

In addition, in the above structure, a table with a flat surface and a second wedge member fixed to the table are provided. The carrier tape passes through a space between the first wedge member and the second wedge member to be wound up on the first wind-up reel. Note that a layer to be peeled including thin-film integrated circuits which is peeled from the carrier tape is placed on the table with a flat surface.

In the above structure, the direction in which the carrier tape is turned back is determined by an angle between a first flat surface of the carrier plate to which the first wedge member is fixed and a tapered portion of the first wedge member. The angle is acute. In addition, a table with a second flat surface and the second wedge member fixed to the table are provided. The first flat surface is positioned at the higher level than the second flat surface. The carrier tape passes through a space between the first wedge member and the second wedge member to be wound up on the first wind-up reel. Note that "the first flat surface is positioned at the higher level than the second flat surface" means that the first flat surface and the second flat surface do not lie in the same plane in a cross section and a step is formed therebetween. The first wedge member and the second wedge member may or may not overlap each other when seen from the above as long as a step is formed therebetween. In the case where the first wedge member and the second overlap each other, a tip of the second wedge member is positioned below the first wedge member.

In addition, in the above structure, the following are provided between the tape reel and the first wind-up reel: a second wind-up reel which pulls the separation tape to peel it so that a bonding surface of the carrier tape is exposed, a transfer unit which transfers a support substrate one surface of which is provided with a layer to be peeled including thin-film integrated circuits, and a second press roller which bonds the layer to be peeled including thin-film integrated circuits to the support substrate.

In the above-described peeling apparatus, a glass substrate which is a board can be automatically peeled and removed using a carrier tape, and then the carrier tape is separated automatically from a layer to be peeled including thin-film integrated circuits, so that working hours can be reduced and manufacturing yields of products can be improved.

[Process Example]

A process in which a layer to be peeled is separated from a support substrate with the use of the peeling apparatus of one embodiment of the present invention is described below.

First, a large glass substrate 401 is prepared as a support substrate. When a substrate is large, the number of products per substrate is also large, resulting in reduced manufacturing costs. Although there is no particular limitation on the size of the glass substrate 401, a glass substrate with a size of, for example, 600 mm×720 mm is used. Further, the support substrate is not limited to the glass substrate, and a semiconductor wafer, a copper plate, a resin substrate, or the like can be used.

Next, an insulating layer 402 is formed over the glass substrate by the method described in Embodiment 1. The insulating layer 402 prevents the glass substrate 401 from being etched when a peeling layer 403 formed later is etched and can have a layered structure including one or more of a silicon nitride film, a silicon oxide film, a silicon nitride oxide film, and a silicon oxynitride film.

Figure 17A:
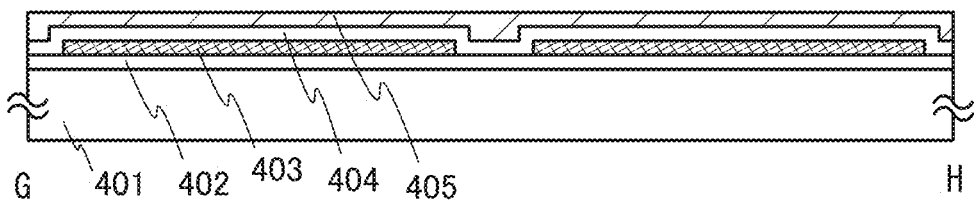
FIGS. 17A to 17E illustrate a peeling method of an embodiment.
Figure 18A:
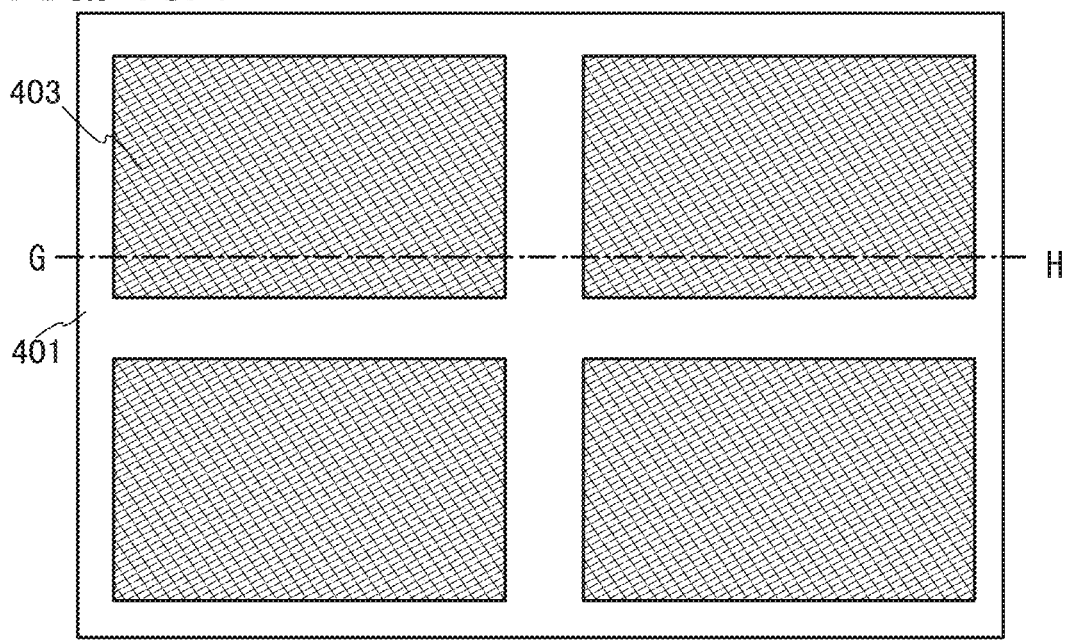
FIGS. 18A to 18C illustrate a peeling method of an embodiment.

After the peeling layer 403 is formed, it is selectively etched to remove at least part of the peeling layer 403 which is at the edge of the substrate. Then, a layer 404 to be peeled is formed, and a layer 405 including thin-film integrated circuits is formed thereover. FIG. 17A is a schematic cross-sectional view at this stage. FIG. 18A is a schematic plane view of the glass substrate 401. FIG. 17A is a cross-sectional view taken along the dashed-dotted line G-H in FIG. 18A.

Since an example in which the glass substrate 401 is divided into four parts in a later step is described in this embodiment, four peeling layers 403 are formed as illustrated in FIG. 18A.

The peeling apparatus of one embodiment of the present invention can be applied a peeling method other than the peeling method described in Embodiment 1.

Next, the glass substrate 401 is divided into four parts with a scriber or a breaker. After that, a first flexible substrate 406 is placed so that the layer 405 including thin-film integrated circuits is positioned between the glass substrate 401 and the first flexible substrate 406. Note that the case where a prepreg sheet which can be bonded by hot press (thermocompression) is used as the first flexible substrate 406 is described here. Note that the first flexible substrate 406 can be replaced with the flexible substrate provided with the bonding layer, which is described in Embodiment 1.

The first flexible substrate 406 is subjected to vacuum hot press performed, for example, at 195° C. for 2 hours (including a heatup time of 30 minutes) in order to be fixed to the layer 405 including thin-film integrated circuits. Note that the vacuum hot press is preferably performed with the first flexible substrate 406 interposed between buffers in order to prevent the first flexible substrate 406 from being bonded to a press plate.

Figure 17B:
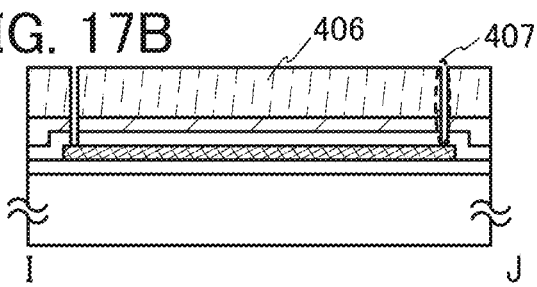
Figure 18B:
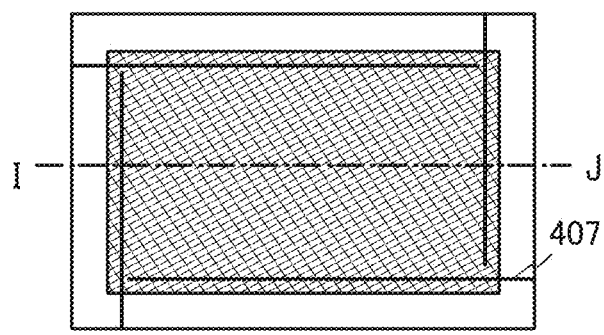

Next, a groove 407 at which peeling starts is formed. Here, the groove 407 is formed with a $CO_2$ laser (wavelength: 266 nm) apparatus. The groove 407 where the peeling layer 403 is exposed is formed by the laser light. In the case where irradiation with the laser light with a wavelength of 266 nm is performed, a metal film is not removed but an insulating film and the like over the metal film can be removed selectively. FIG. 18B is a schematic top view at this stage and FIG. 17B is a schematic cross-sectional view taken along the dashed-dotted line I-J in FIG. 18B.

It is important to provide areas where the grooves 407 are not formed at the four corners of the peeling layer 403 as illustrated in FIG. 18B, not to form a groove by emitting laser light all around the edge of the peeling layer 403. Here, two adjacent grooves preferably have a distance of, for example, 1 cm or more and 2 cm or less therebetween. When a groove is formed by emitting laser light all around the edge of the peeling layer 403, peeling might start immediately after that, causing the region surrounded by the groove to be peeled completely. In addition, if part of the region surrounded by the groove is peeled at the time of the formation of the groove by emitting laser light all around the edge of the peeling layer 403, a support film might be difficult to attach in a later step.

Figure 17C:
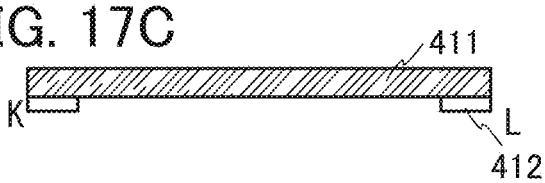
Figure 17D:
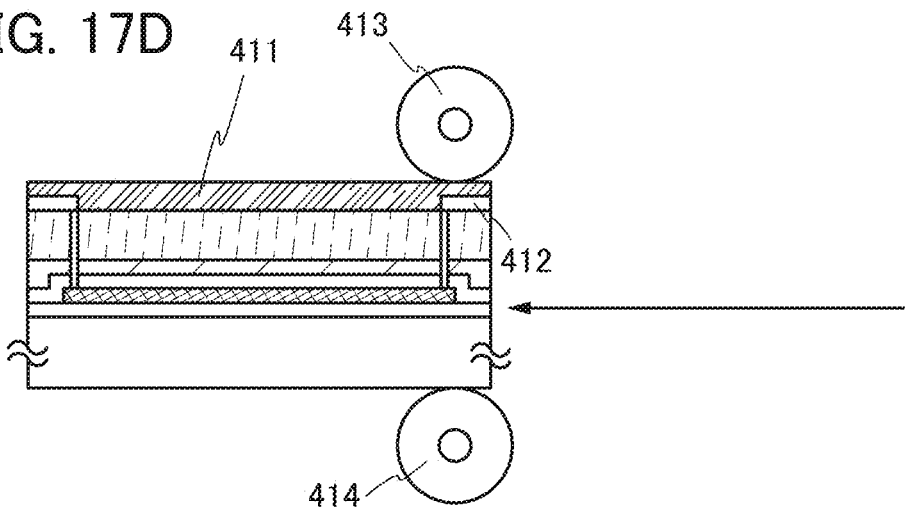
Figure 18C:
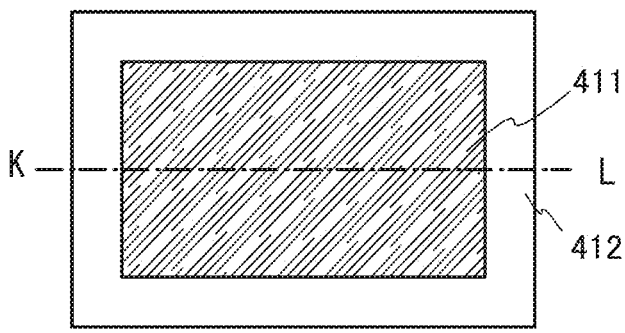

Next, a support film 411 is attached to the first flexible substrate 406. One surface of the support film 411 is provided with a protective sheet. The protective sheet is peeled to expose an adhesion surface of the support film 411. In this embodiment, a protective sheet 412 remains around the edge of the support film 411 so that the center of the support film 411 is exposed as illustrated in FIG. 18C. FIG. 17C illustrates a cross section taken along the chain line K-L in FIG. 18C that is a plane view. Note that the protective sheet 412 is preferably attached so as to overlap the groove 407. As illustrated in FIG. 17D, the support film 411 can be uniformly attached to the first flexible substrate 406 by being passed through between a pair of rollers 413 and 414.

Note that the support film 411 is not particularly limited as long as it is a pressure sensitive one-side adhesive tape, and can be a film made of polyethylene or the like (e.g., a PET film), a polypropylene film, or the like. The support film 411 not only prevents electrostatic breakdown but also functions as a support of the layer 405 including thin-film integrated circuits.

Figure 17E:
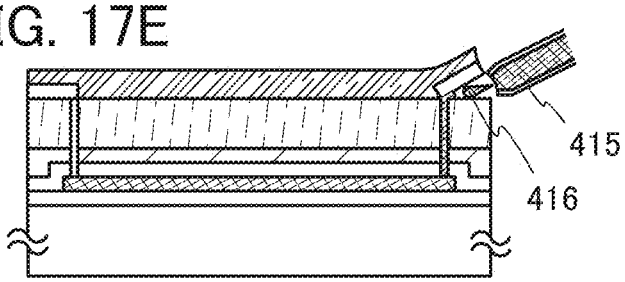

Next, as illustrated in FIG. 17E, a water droplet 416 is injected to the groove 407 with an injector 415 which is in the form of a dropper or a syringe. Note that even when the amount of the water droplet 416 to be supplied is small, static electricity generation in a later peeling process can be inhibited. Portions which are overlapped with the support film 411 with the protective sheet 412 interposed therebetween (i.e., portion overlapping the groove 407 and a region outside thereof) are not bonded to the first flexible substrate 406. The water droplet 416 is injected to a space between the protective sheet 412 and the first flexible substrate 406 with the injector 415. Note that pure water is preferably used as the water droplet 416, in which case the peelability can be improved. However, other solutions such as an acid solution and an alkaline solution can be used when the primary purpose is to prevent electrostatic breakdown.

In addition, if necessary, pretreatment in which pressure is applied along the groove 407 with a sharp tool such as a knife may be performed before the injection of the water droplet 416 into the groove 407 for the purpose of smooth peeling.

Next, the glass substrate 401 provided with the support film 411 is set in a substrate load cassette 641 in the peeling apparatus illustrated in FIG. 16. After that, the glass substrate 401 is placed on a first transfer roller 643 with the use of a substrate transfer unit which is not illustrated in FIG. 16. The glass substrate 401 on the first transfer roller 643 is transferred to a substrate unload cassette 642 through the second transfer roller 644 and a third transfer roller 645.

The first transfer roller 643, the second transfer roller 644, and the third transfer roller 645, each of which is one of the arranged transfer rollers, are provided at predetermined intervals and rotate in the clockwise direction as indicated by solid arrows which is the direction in which the glass substrate 401 is sent. The plurality of arranged transfer rollers are each rotated by a driving portion (e.g., a motor) which is not illustrated. Note that a belt conveyor may be used without limitation to the transfer rollers.

Figure 19A:
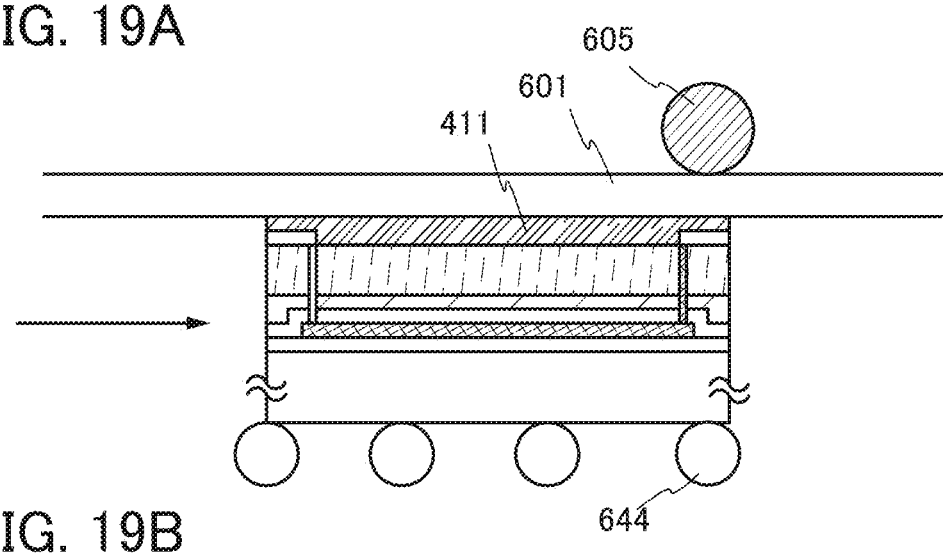
FIGS. 19A and 19B illustrate a peeling method of an embodiment.

While the glass substrate 401 is transferred by the second transfer roller 644, the carrier tape 601 is bonded to the support film 411 as illustrated in FIG. 19A. The carrier tape 601 is unwound from the tape reel 602 and is guided to the first wind-up reel 603 by the plurality of guide rollers 631, 632, and 633, and the like.

The separation tape 600 (also called a separate film) is peeled from the carrier tape 601 unwound from the tape reel 602 to expose a bonding surface of the carrier tape 601, and then the carrier tape 601 is attached to the support film 411. The separation tape 600 is peeled by being pulled by the second wind-up reel 613 through a guide roller 634. Further, the carrier tape 601 whose bonding surface is exposed is turned back, and is pulled by the first press roller 606 rotated by a driving portion (e.g., a motor) which is not illustrated to be moved by a direction conversion roller 604 in substantially the same direction as the transfer direction of the glass substrate 401.

As illustrated in FIG. 19A, the bonding surface of the carrier tape 601 which is exposed by peeling the separation tape 600 is pressed against the support film 411 by the second press roller 605 and the second transfer roller 644.

The glass substrate 401 to which the support film 411 is attached is transferred to the position where the first press roller 606 overlaps the groove 407 with water by the plurality of transfer rollers. The first press roller 606 rotates while pressing the glass substrate 401, so that the layer 405 including thin-film integrated circuits is peeled from the glass substrate 401 because of a difference between the bond strength between the glass substrate 401 and the peeling layer 403 and the bond strength between the carrier tape 601 and the support film 411.

Note that the bond strength between the support film 411 and the layer 405 including thin-film integrated circuits is stronger than that between the carrier tape 601 and the support film 411. However, the peeling process does not depend on the adhesive strength of the carrier tape 601.

The diameter of the first press roller 606 is larger than that of the second press roller 605 and may be, for example, 30 cm. In the case where the first press roller 606 with a diameter of less than 15 cm is used, a crack might be formed in the layer 405 including thin-film integrated circuits. In addition, the first press roller 606 applies pressure at which the glass substrate 401 is not broken. In this embodiment, the thickness of the glass substrate 401 which is a support substrate is 0.7 mm and the thickness of the carrier tape 601 is 0.1 mm. Setting the distance between the second press roller 605 and the second transfer roller 644 to less than 0.75 mm might cause the breakage of the glass substrate 401.

A rubber member is used for the first press roller 606 and the second press roller 605 in order to prevent the breakage of the glass substrate 401. The use of rubber enables more uniform pressure application than the use of a metal.

Figure 19B:
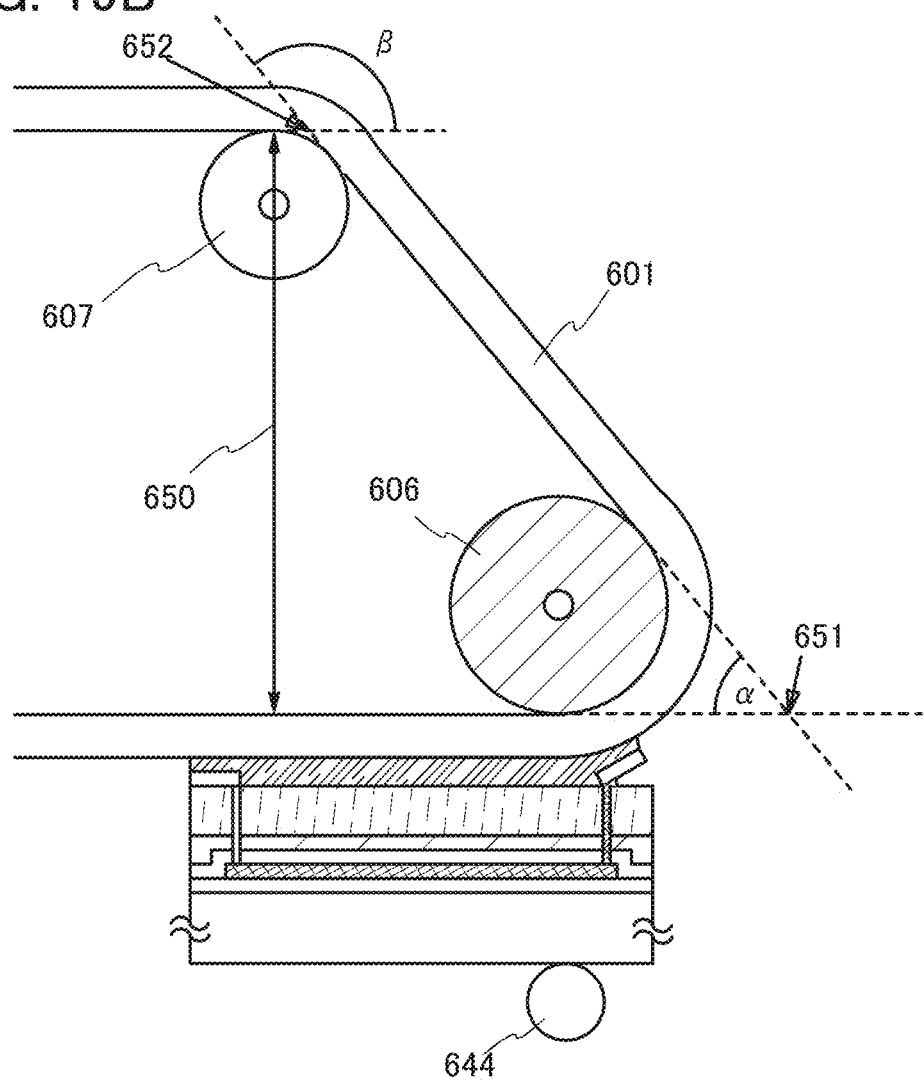

The angle α at which the carrier tape 601 is turned back by the first press roller 606 is 45° or more and 60° or less. In this embodiment, the angle α is set to approximately 49°. As illustrated in FIG. 19B, the angle α is an angle between a surface of the carrier tape 601 which is in contact with the first press roller 606 (the horizontal plane indicated by one virtual dotted line) and a surface of the carrier tape 601 after being turned back (indicated by the other virtual dotted line). Note that a first intersection 651 of the two virtual dotted lines is shown in FIG. 19B.

In the peeling process, liquid (preferably pure water) stored in the groove penetrates into an interface between the peeling layer 403 and the layer 404 to be peeled because of capillary action at the same time as the transfer of the carrier tape 601, so that the area to be peeled is enlarged. The liquid stored in the groove also has a function of inhibiting static electricity generated in a portion from which peeling starts.

When separation from the glass substrate 401 is completed after peeling, the liquid remains on the layer 405 including thin-film integrated circuits. For this reason, the layer 405 including thin-film integrated circuits is blow-dried from one direction while being held oblique to the horizontal plane, preferably at an angle of approximately 60° so that the liquid is dripped down. In FIG. 16, an example in which the carrier tape 601 moves in the oblique direction between a drying unit 614 performing blow-dry and a carrier plate 609 is illustrated. The carrier plate 609 is provided to prevent the carrier tape 601 from being warped. Since a water mark might be formed if the liquid remaining on the layer 405 is vaporized, the liquid is preferably removed immediately after the peeling.

After the blow-dry, the moving direction of the carrier tape 601 is changed from the oblique direction to the horizontal direction by the roller 607 changing the direction in which the carrier tape 601 is sent into the horizontal direction. Unlike the first press roller 606 with a rubber member, the roller 607 may be made of a metal. The diameter of the roller 607 may be smaller than that of the first press roller 606 and may be, for example, approximately 20 cm. The angle β between the surface of the carrier tape 601 which is in contact with the roller 607 (the horizontal plane indicated by one virtual dotted line) and the surface of the carrier tape 601 after being turned back (indicated by the other virtual dotted line) is obtained by subtracting the angle α from 180°. The angle β is approximately 131° in this embodiment. In FIG. 19B, a second intersection 652 of the two virtual dotted lines indicating the surface of the carrier tape 601 which is in contact with the roller 607 (horizontal plane) and the surface of the carrier tape 601 after being turned back is positioned inside the carrier tape 601.

In FIG. 19B, a distance 650 between the carrier tape 601 moving in the horizontal direction before the peeling of the layer 405 from the glass substrate 401 is peeled and the carrier tape 601 moving in the horizontal direction after the peeling of the layer 405 from the glass substrate 401 is peeled may be, for example, approximately 77 cm. In addition, the distance between the first intersection 651 and the second intersection 652 may be approximately 102.07 cm, and the horizontal distance between these intersections may be approximately 67 cm.

In the peeling process, the carrier tape 601 which is in contact with the second press roller 605 with a diameter of 30 cm is moved at a relatively slow rate, so that a peeling residue or crack generation can be inhibited. Since the peeling residue or the crack generation also depends on the angle α, the angle α is preferably in the above-described range.

After the peeling process, the carrier tape 601 which moves in the horizontal direction again is made in contact with the tip of the first wedge member 611 fixed to the carrier plate 610 and the carrier tape 601 is turned back along the tip of the first wedge member 611, whereby the layer 405 including thin-film integrated circuits is separated from the carrier tape 601.

Figure 20A:
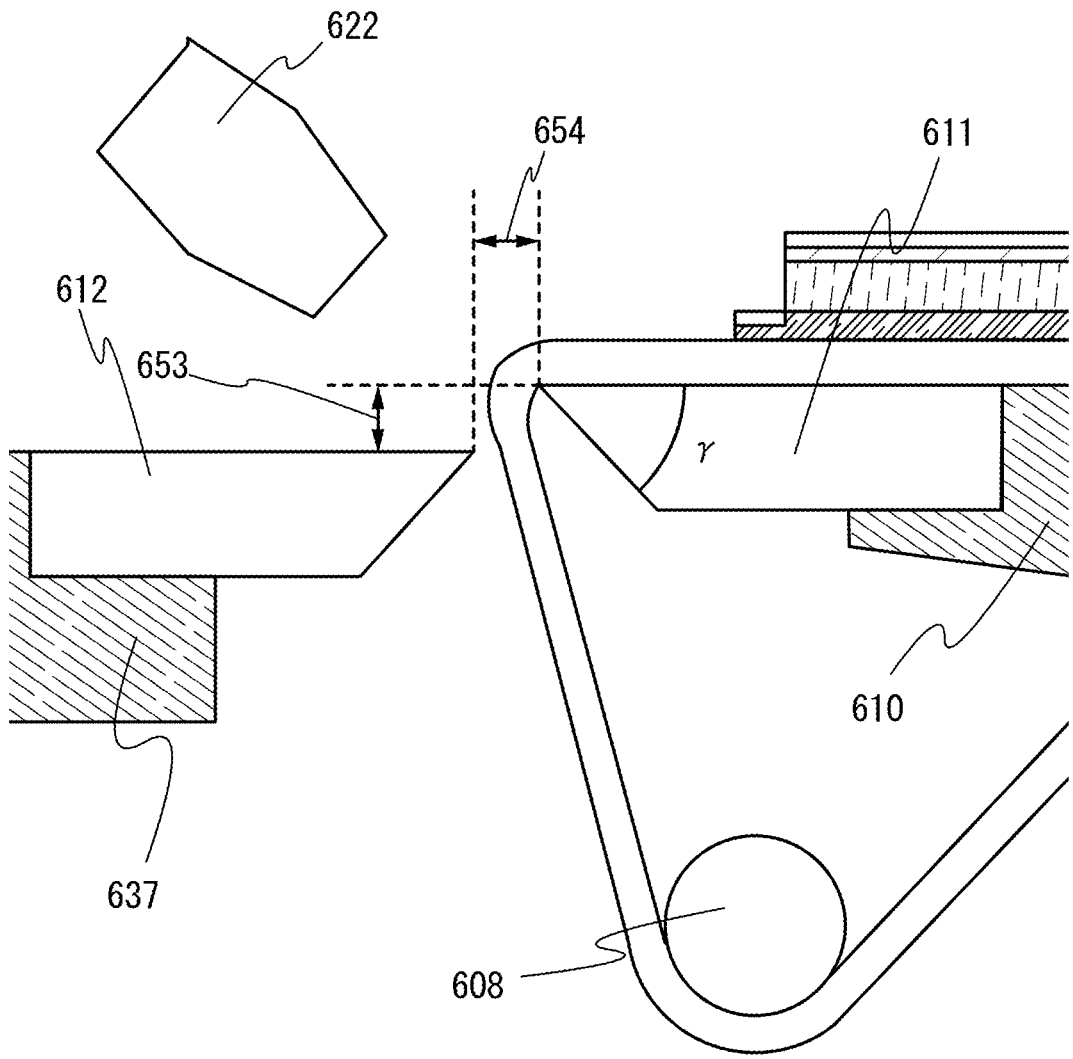
FIGS. 20A and 20B illustrate a peeling method of an embodiment.

FIG. 20A is a magnified view of the tip of the first wedge member 611 and the periphery thereof.

The angle γ of the tip of the first wedge member 611 is preferably an acute angle of less than 90° with respect to a plane which is horizontal to a flat surface of the carrier plate 610 (the plane is indicated by a virtual dotted line) illustrated in FIG. 20A. In this embodiment, the angle γ is set to 69°. The tip of the first wedge member 611 is made to be sharp or thin, so that the carrier tape 601 can be peeled without fail. Note that the carrier tape 601 is not cut by the tip of the first wedge member 611. When the angle γ of the tip of the first wedge member 611 is an obtuse angle of 90° or more, the carrier tape 601 is difficult to peel.

The tension of the carrier tape 601 is controlled by the tension roller 608. The axis of the tension roller 608 can move up and down, and the tension of the carrier tape 601 can be controlled by the position of the axis. The carrier tape 601 after being turned back along the tip of the first wedge member 611 and after the peeing of the layer 405 is guided to the first wind-up reel 603 by guide rollers 635 and 636.

The table 637 with a flat surface on which the layer 405 including thin-film integrated circuits which is peeled from the carrier tape 601 is placed is provided with the second wedge member 612. It is important that a surface parallel to the flat surface of the table 637 does not align with a surface parallel to the flat surface of the carrier plate 610, that is, the surfaces are not at the same level. When the surfaces are at the same level, the layer 405 including thin-film integrated circuits might be turned back together with the carrier tape 601 and might not be peeled from the carrier tape 601. In this embodiment, as illustrated in FIG. 20A, a step is provided between the carrier plate 610 and the table 637 so that the surface parallel to the flat surface of the table 637 is lower than the surface parallel to the flat surface of the carrier plate 610. A height 653 of a step between the surfaces is set to approximately 2 mm; however, it is not limited thereto. The height 653 of the step also relates to the thickness and material of the carrier tape 601, a distance 654 between the first wedge member 611 and the second wedge member 612, and the like, and thus is set as appropriate in consideration of these elements.

In this embodiment, the distance 654 between the first wedge member 611 and the second wedge member 612 is set to 2 mm; however, the distance 654 is not particularly limited thereto. If the first wedge member 611 and the second wedge member 612 have a difference in level, they may partly overlap each other when seen from the above.

The structure illustrated in FIG. 20A enables the carrier tape 601 to be peeled stably without overload applied to the layer 405 including thin-film integrated circuits.

Figure 20B:
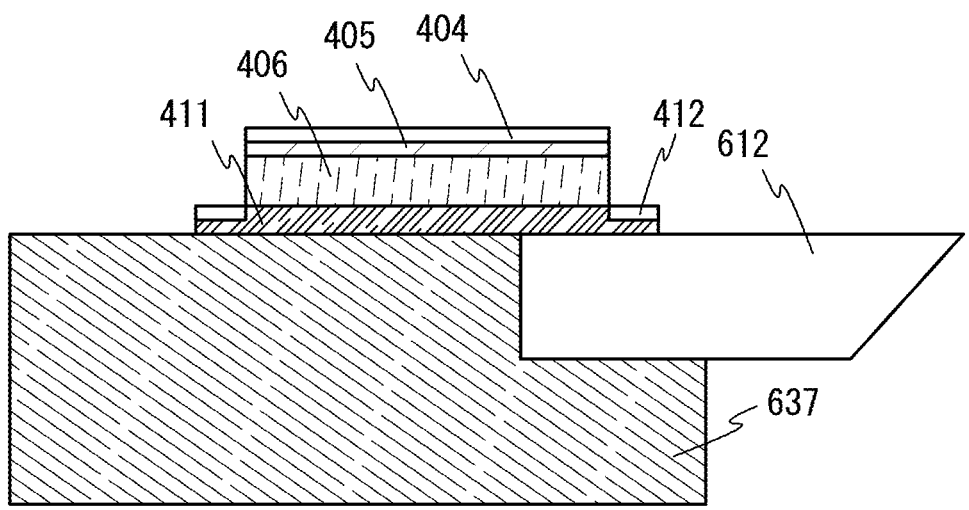

The layer 405 including thin-film integrated circuits peeled from the carrier tape 601 is placed on the table 637 so that the support film 411 is in contact with the table 637. FIG. 20B illustrates a state in which the layer 405 including thin-film integrated circuits is placed on the table 637 after being peeled from the carrier tape 601. As illustrated in FIG. 20B, a stack which includes the first flexible substrate 406, the layer 405 including thin-film integrated circuits, and the layer 404 to be peeled over the support film 411 is placed on the table 637 with a rear surface of the layer 404 to be peeled exposed. In addition, the protective sheet 412 is provided in the edge of the support film 411. The first flexible substrate 406, the layer 405 including thin-film integrated circuits, and the layer 404 to be peeled do not overlap an exposed surface of the protective sheet 412.

It is preferable that, as illustrated in FIG. 16, ionizers 638, 639, 620, 621, and 622 be provided at the positions where static electricity might be generated and that static electricity removal treatment be performed by an air jet, a nitrogen gas jet, or the like from the ionizer to the layer 405 including thin-film integrated circuits so that adverse effects of static electricity on thin-film integrated circuits are reduced.

In FIG. 16, drive rollers rotated by electric motors or the like are transfer rollers such as the first transfer roller 643, the second transfer roller 644, and the third transfer roller 645, the first press roller 606, and the second press roller 605. The moving speed and tension of the carrier tape 601 are adjusted by these drive rollers, the tape reel 602, and the first wind-up reel 603. In addition, driven rollers are the plurality of guide rollers 631, 632, 633, 634, 635, and 636, the direction conversion roller 604, the second press roller 605, and the tension roller 608.

In this embodiment, the numbers of rollers placed in the first half and the latter half of the transfer path of the carrier tape 601 are not limited to the one in FIG. 16 and may be more than that.

Note that this embodiment can be combined with any of the other embodiments and the examples described in this specification as appropriate.

Embodiment 5

In this embodiment, electronic appliances each of which includes a flexible device which can be manufactured by the peeling method of one embodiment of the present invention are described.

Examples of an electronic appliance and a lighting device each of which includes a flexible light-emitting device are particularly described here. Examples of such an electronic device include a television set (also referred to as a television or a television receiver), a monitor of a computer, electronic paper, a camera such as a digital camera or a digital video camera, a digital photo frame, a mobile phone set (also referred to as a mobile phone or a mobile phone device), a portable game machine, a portable information terminal, an audio reproducing device, and a large game machine such as a pachinko machine. In addition, a lighting device or a display device can be incorporated along a curved inside/outside wall surface of a house or a building or a curved interior/exterior surface of a car.

Figure 21A:
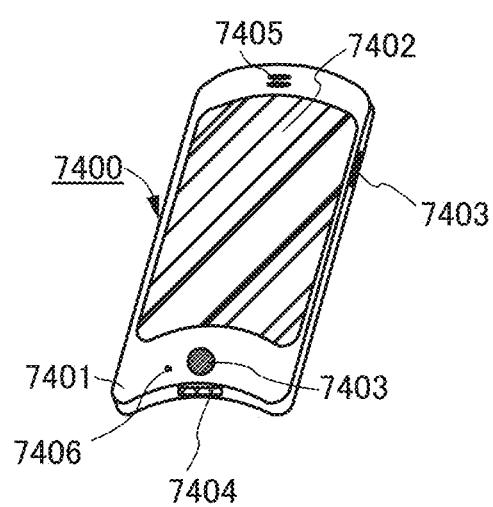
FIGS. 21A to 21E illustrate structure examples of electronic appliances of an embodiment.

FIG. 21A illustrates an example of a mobile phone. A mobile phone 7400 includes a display portion 7402 incorporated in a housing 7401, an operation button 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 21A is touched with a finger or the like, data can be input to the mobile phone 7400. Further, operations such as making a call and entering a character can be performed by touch on the display portion 7402 with a finger or the like.

The power can be turned on or off with the operation buttons 7403. In addition, types of images displayed on the display portion 7402 can be switched; for example, switching images from a mail creation screen to a main menu screen.

Here, the display portion 7402 includes the light-emitting device of one embodiment of the present invention. Thus, the mobile phone can have a curved display portion and high reliability.

Figure 21B:
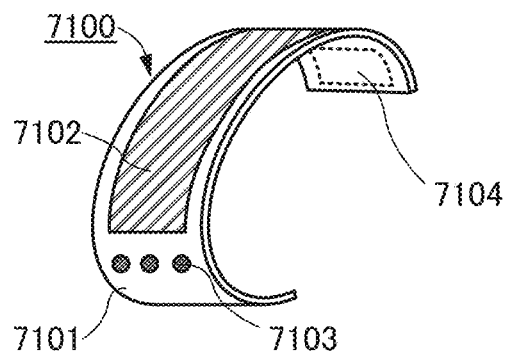

FIG. 21B is an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching of displayed videos, adjusting volume, and the like can be performed.

Here, the display portion 7102 includes the light-emitting device of one embodiment of the present invention. Thus, the portable display device can have a curved display portion and high reliability.

Figure 21C:
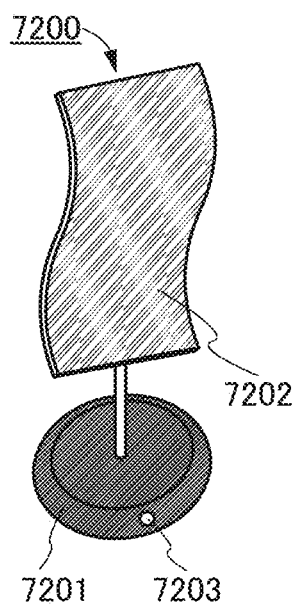
Figure 21D:
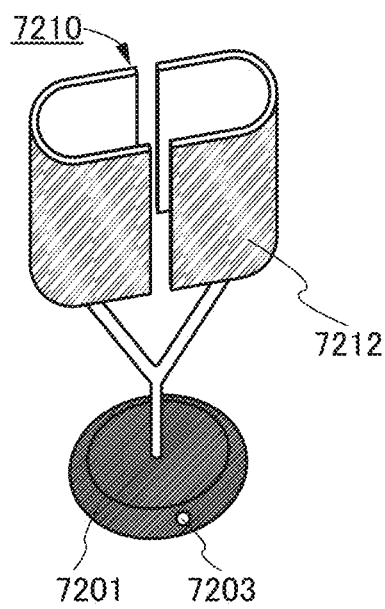
Figure 21E:
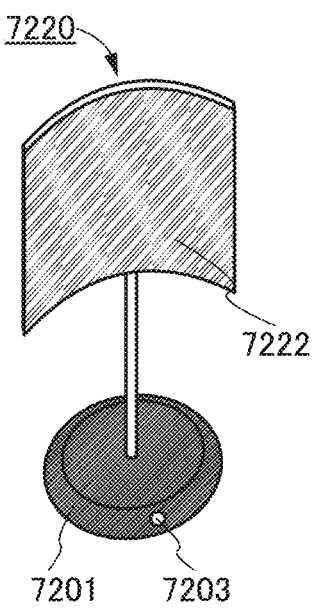

FIGS. 21C to 21E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 21C includes a light-emitting portion 7202 with a wave-shaped light-emitting surface and thus is a good-design lighting device.

A light-emitting portion 7212 included in the lighting device 7210 illustrated in FIG. 21D has two convex-curved light-emitting portions symmetrically placed. Thus, light radiates in all directions from the lighting device 7210.

The lighting device 7220 illustrated in FIG. 21E includes a concave-curved light-emitting portion 7222. This is suitable for illuminating a specific area because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular area can be brightly illuminated, or the light-emitting surface is curved to have a convex shape, whereby a whole room can be brightly illuminated.

Here, the light-emitting portions 7202, 7212, and 7222 each include the light-emitting device of one embodiment of the present invention. Thus, the lighting devices can have curved light-emitting surfaces and high reliability.

This embodiment can be combined as appropriate with any of the other embodiments disclosed in this specification.

Example 1

In this example, examination results of effects obtained with and without heat treatment after the formation of a layer to be peeled are described.

[Manufacture of Samples]

First, an approximately 200-nm-thick silicon oxynitride film was formed as a base film over a glass substrate by a plasma CVD method. Then, an approximately 30-nm-thick tungsten film was formed as a peeling layer by a sputtering method. After that, an approximately 600-nm-thick silicon oxynitride film as a first layer and an approximately 200-nm-thick silicon nitride film as a second layer were formed in this order by a plasma CVD method.

The silicon oxynitride film which is the first layer was formed under the following conditions: the flow rates of a silane gas and an $N_2O$ gas were 75 sccm and 1200 sccm, respectively; the power frequency was 13.56 MHz; the electric power was 120 W; the pressure was 70 Pa; and the substrate temperature was 330° C. In addition, $N_2O$ plasma treatment was performed at 500 W in an $N_2O$ gas atmosphere for 240 seconds immediately before the formation of the silicon oxynitride film.

The silicon nitride film which is the second layer was formed under the following conditions: the flow rates of a silane gas, an $N_2$ gas, and an $NH_3$ gas were 75 sccm, 5000 sccm, and 100 sccm, respectively; the power frequency was 13.56 MHz; the electric power was 1 kW; the pressure was 70 Pa; and the substrate temperature was 330° C.

After that, heat treatment was performed at 450° C. for 1 hour.

Through the above steps, Sample 1 was manufactured. In addition, a sample on which the last heat treatment was not performed was manufactured as Sample 2.

[Measurement of Peelability]

The force required for peeling of Sample 1 with the heat treatment and Sample 2 without the heat treatment was measured. The measurement method here was the same as the method described in Embodiment 3.

In the case where the force required for peeling here is greater than or equal to 0.14 N, a layer to be peeled remains on the support substrate side after a peeling test. In contrast, in the case where the force is less than 0.14 N, peeling can be performed favorably without a layer to be peeled remaining on the support substrate side. Therefore, peeling is possible under the condition of less than 0.14 N in the following peeling test.

Figure 22:
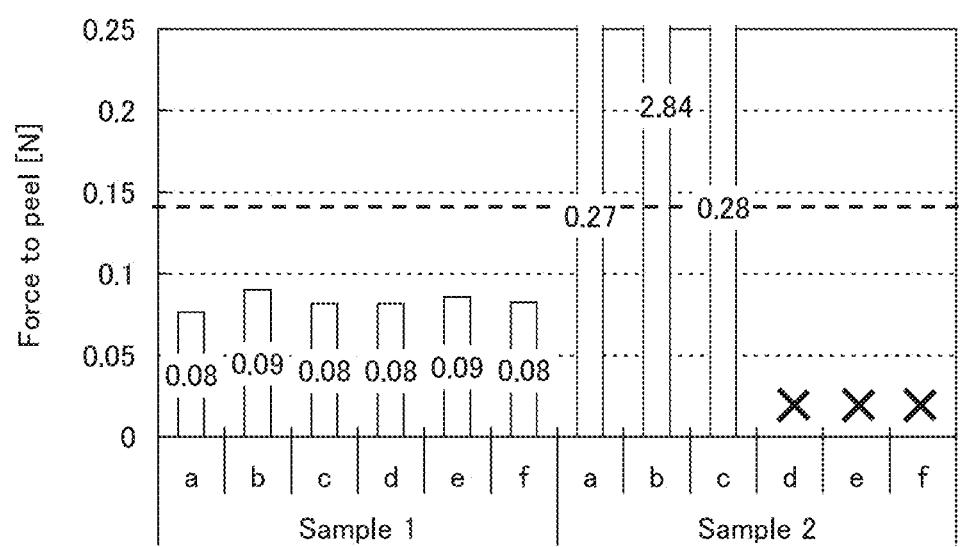
FIG. 22 shows measurement results of peelability of Example 1.

FIG. 22 shows measurement results of the force required for peeling at six points (a to f) in each sample.

In Sample 1 with the heat treatment, the force was less than or equal to 0.1 N at all the points, which indicates that Sample 1 had excellent peelability. In contrast, in Sample 2 without the heat treatment, peeling was not able to be performed at three of the six points. The force of all the three points at which the peeling was possible was greater than or equal to 0.25 N, which is greatly different from a force of less than 0.14 N that is the condition under which peeling is possible.

The above results demonstrate that the peelability can be improved by the heat treatment.

[Cross-Sectional Observation Results]

Next, observation results of cross sections of Sample 1 with the heat treatment and Sample 2 without the heat treatment are described. The cross sections were observed by scanning transmission electron microscopy (STEM).

Figure 23A:
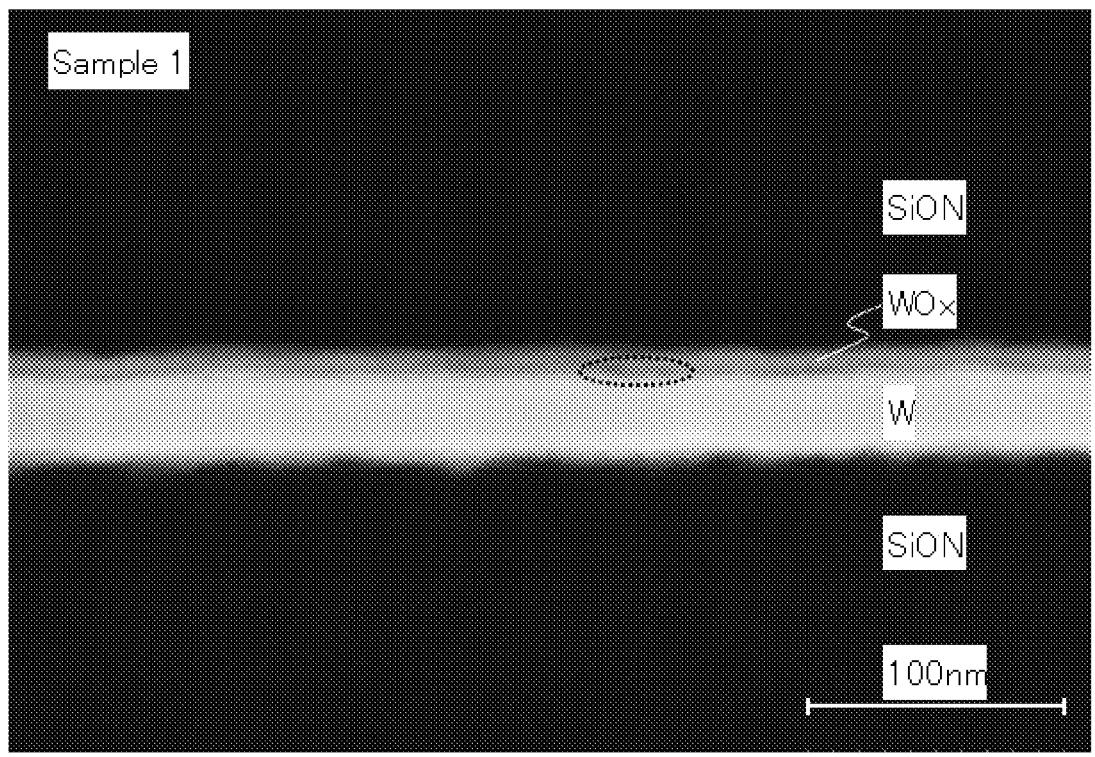
FIGS. 23A and 23B are cross-sectional images of observed samples of Example 1.

FIG. 23A shows an observed cross section of Sample 1. An approximately 10-nm-thick tungsten oxide layer can be observed between the tungsten film (peeling layer) and the silicon oxynitride film (first layer).

Figure 23B:
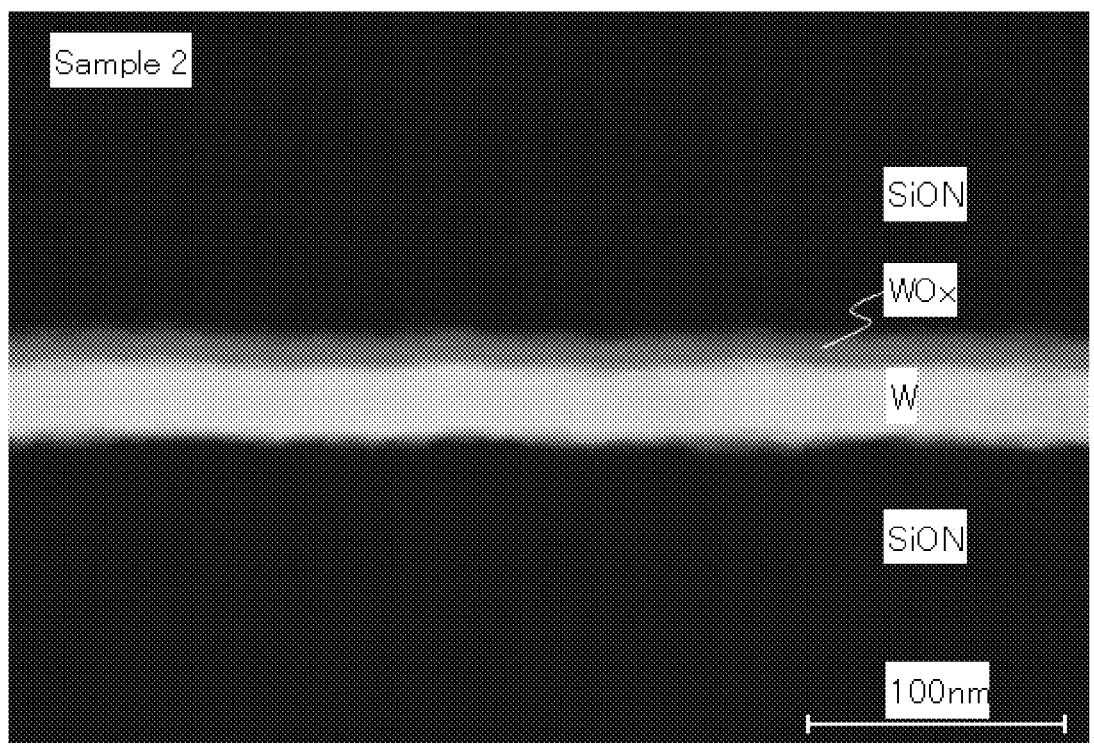

FIG. 23B shows an observed cross section of Sample 2. As in Sample 1, an approximately 10-nm-thick tungsten oxide layer can be observed between the tungsten film and the silicon oxynitride film.

In addition, in Sample 1, a region (surrounded by a dashed line in FIG. 23A) with a gray level different from those of the tungsten oxide layer and the tungsten film can be observed between the tungsten oxide layer and the tungsten film.

Figure 24:
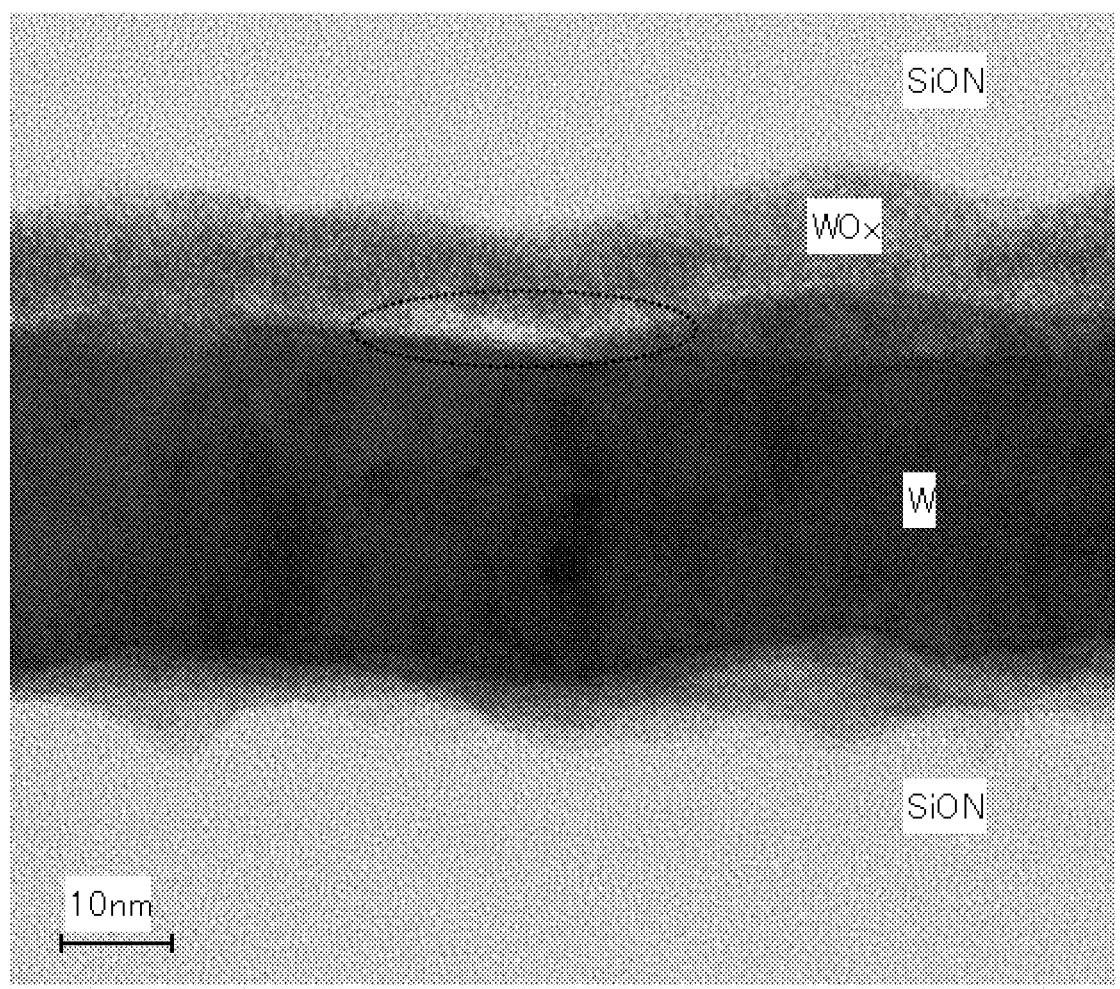
FIG. 24 is a cross-sectional image of an observed sample of Example 1.

FIG. 24 shows an observed cross section of enlarged Sample 1. A region with a low density of heavy atoms (tungsten) appears to be formed in the region with contrast surrounded by the dashed line in FIG. 24 between the tungsten oxide layer and the tungsten film.

According to the above results, it is found that the tungsten oxide layer is formed on a surface of the tungsten film by performing the $N_2O$ plasma treatment on the tungsten film. It is also found that the region with a low density is formed between the tungsten film and the tungsten oxide layer by performing the heat treatment.

The above results of the peelability demonstrate that the formation of the low-density region between the tungsten film and the tungsten oxide layer by heat treatment can improve the peelability.

[SIMS Analysis Results]

A hydrogen and nitrogen concentration profiles in the depth direction of each of Sample 1 and Sample 2, which were measured by SIMS, are described.

Figure 25A:
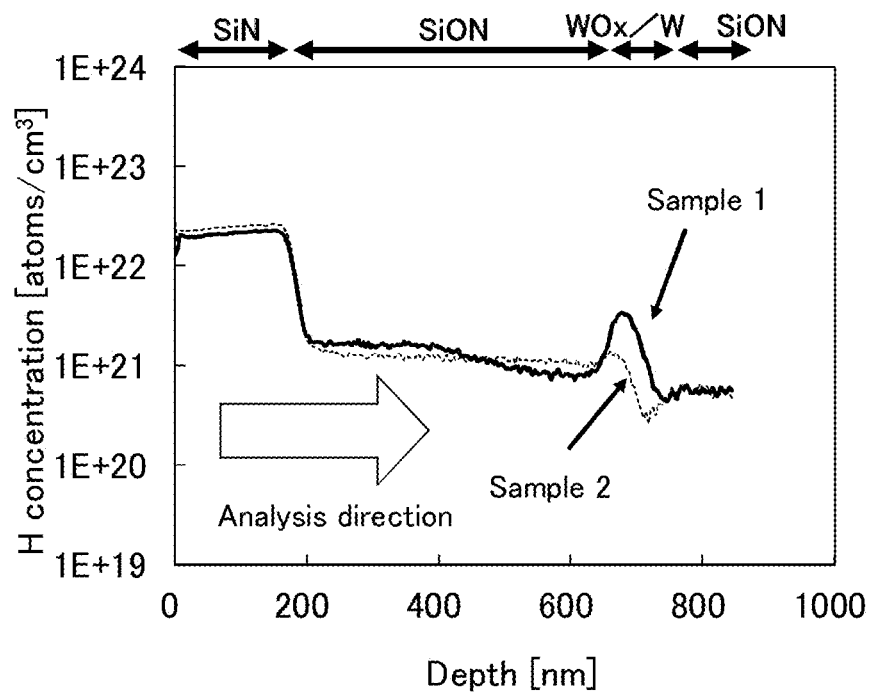
FIGS. 25A and 25B show SIMS measurement results of Example 1.
Figure 25B:
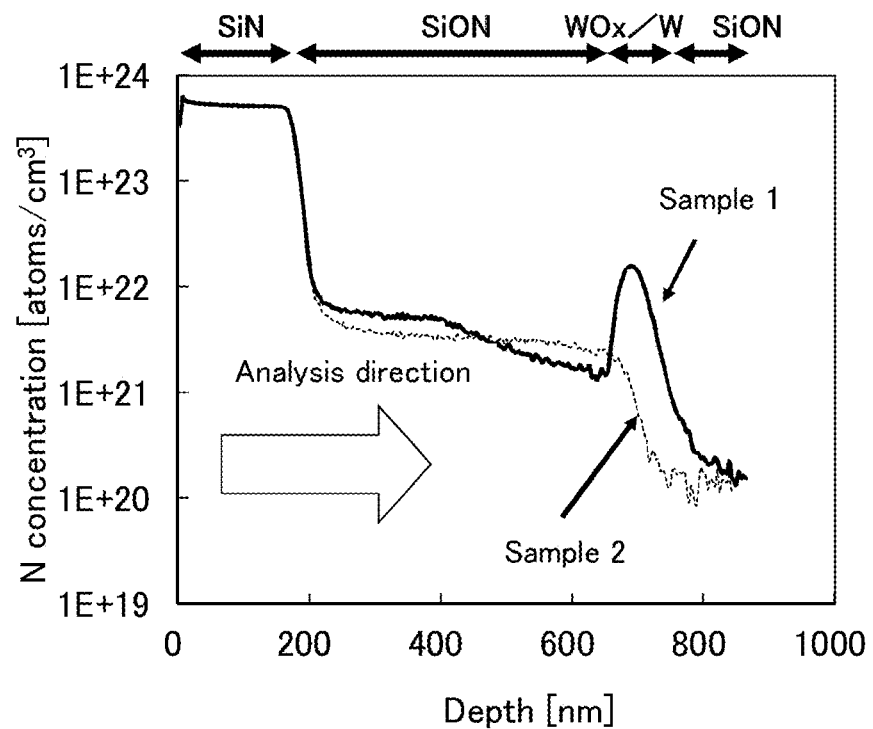

FIGS. 25A and 25B show a hydrogen concentration profile in the depth direction and a nitrogen concentration profile in the depth direction, respectively. Note that the analysis was performed from the silicon nitride (second layer) side. In each of FIGS. 25A and 25B, Sample 1 and Sample 2 are represented by a solid line and a dashed line, respectively.

As for the hydrogen concentration, the hydrogen concentration of the tungsten oxide layer in Sample 1 is higher than that in Sample 2 without the heat treatment. In addition, as for the silicon oxynitride film which is the first layer, the hydrogen concentration in Sample 1 is lower than that in Sample 2 through a region of approximately 400 nm from the interface with the tungsten film. The hydrogen concentration of the silicon nitride film in Sample 1 is also lower than that in Sample 2.

The nitrogen concentration of the tungsten oxide layer in Sample 1 is also higher than that in Sample 2 without the heat treatment. In addition, the nitrogen concentration of the silicon oxynitride film which is the first layer in Sample 1 is lower than that in Sample 2 through a region of approximately 400 nm from the interface with the tungsten film. Meanwhile, the nitrogen concentration of the silicon nitride film in Sample 1 is almost the same as that in Sample 2.

According to the above results, the regions with an extremely high hydrogen concentration and an extremely high nitrogen concentration are formed at the interface between the tungsten film and the silicon oxynitride film by the heat treatment. The above results indicate that hydrogen is supplied from the silicon nitride film and the silicon oxynitride film while nitrogen is supplied from the silicon oxynitride film. In addition, from the fact that the nitrogen concentration of the silicon nitride film hardly changes, nitrogen released from the silicon oxynitride film is probably blocked effectively by the silicon nitride film.

According to the above results of the peelability, it is found that the increase in the hydrogen concentration and nitrogen concentration of the tungsten oxide layer which is due to the heat treatment contributes to the improvement in the peelability.

[XPS Analysis Results]

Next, results of composition analysis by XPS performed on peeling surfaces of Sample 1 and Sample 2 after peeling are described.

Figure 26A:
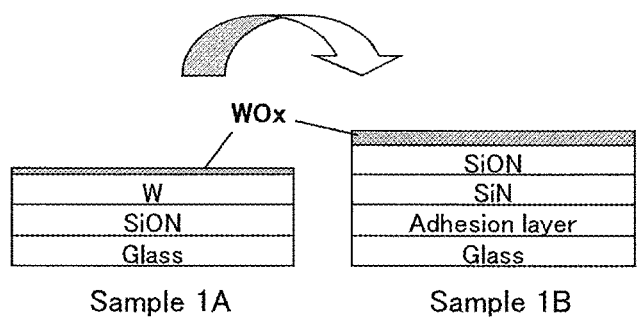
FIGS. 26A and 26B show XPS measurement results of Example 1.

First, samples are briefly described with reference to FIG. 26A. When peeling was performed between the tungsten film and the silicon oxynitride film in Sample 1, a sample on the tungsten film side is Sample 1A and a sample on the silicon oxynitride film side is Sample 1B. In the same manner, in Sample 2, a sample on the tungsten film side is Sample 2A and a sample on the silicon oxynitride film side is Sample 2B.

The tungsten oxide remaining on the tungsten film in each of Sample 1A and Sample 2A was several nanometers, which is extremely thin. This indicates that peeling occurs easily at an interface between the tungsten film and the tungsten oxide layer.

Figure 26B:
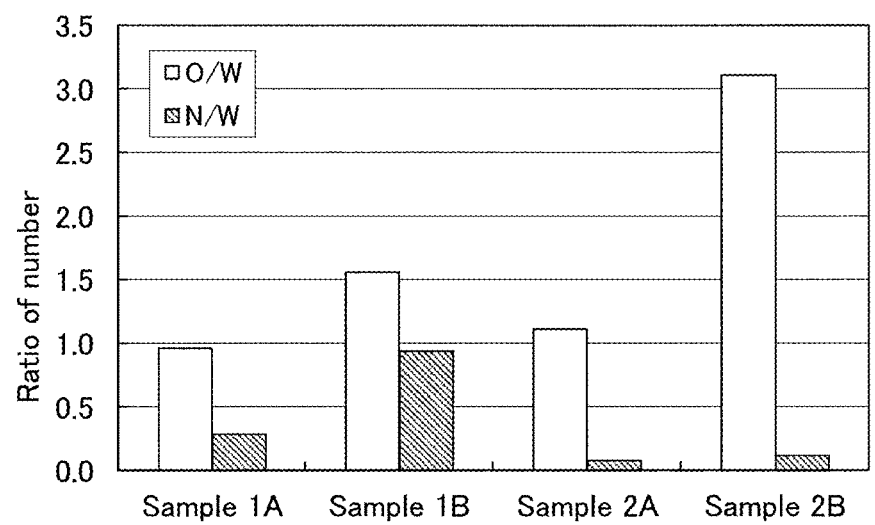

FIG. 26B shows atomic ratios of oxygen and nitrogen to tungsten which were obtained by the XPS analysis.

According to FIG. 26B, the concentration of oxygen in Sample 1A and Sample 1B with the heat treatment is lower than that in Sample 2A and Sample 2B without the heat treatment, and the concentration of nitrogen in Sample 1A and Sample 1B is higher than that in Sample 2A and Sample 2B. The nitrogen concentration is extremely low particularly in Sample 2A and Sample 2B without the heat treatment.

Next, results of high-resolution XPS measurement are described. Note that the remaining tungsten oxide layers in Sample 1A and Sample 2A were difficult to analyze because of the extremely small thicknesses; thus, results of Sample 1B and Sample 2B are described here.

Figure 27A:
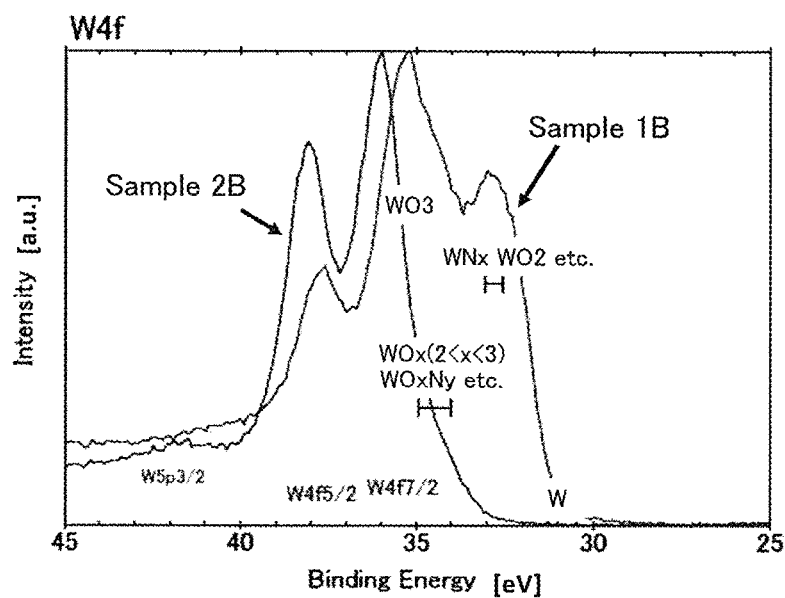
FIGS. 27A and 27B show XPS measurement results of Example 1.

FIG. 27A shows results of W4f high-resolution measurement. Sample 2B without the heat treatment has a marked peak derived from $WO_3$ and scarcely has other peaks. Meanwhile, Sample 1B with the heat treatment has peaks derived from $WO_x$ ($2<x<3$) and $WO_2$ as well as a peak derived from $WO_3$. This indicates that $WO_3$ is reduced by hydrogen supplied from the silicon oxynitride film and the silicon nitride film by the heat treatment to be an oxide with a small oxidation number.

Further, peaks derived from a compound containing nitrogen, such as tungsten nitride and tungsten oxide containing nitrogen, are observed in FIG. 27A.

Figure 27B:
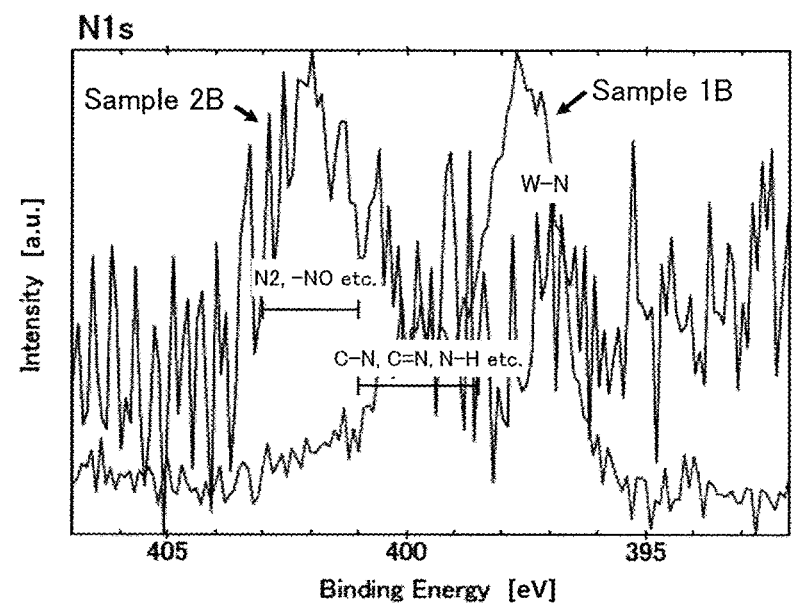

FIG. 27B shows results of N1s high-resolution measurement. Sample 2B has a lot of noise and no marked peak. Meanwhile, Sample 1B with the heat treatment has a marked peak derived from a W—N bond.

This demonstrates that nitrogen supplied from the silicon oxynitride film by the heat treatment reacts with tungsten, so that a region with a W—N bond is formed in the oxide layer. The above results of the peelability and Embodiment 3 clearly indicate that the region with a W—N bond formed in the oxide layer improves the peelability.

The above is the description of this example.

Example 2

In this example, results of TDS analysis performed on a layer to be peeled and layers which can be included in the layer to be peeled are described.

[Manufacture of Samples]

In this example, four samples were manufactured by the following method.

A sample in which an approximately 600-nm-thick silicon oxynitride film which can be used as a first layer was formed over a silicon wafer was manufactured as Sample 3. The silicon oxynitride film was formed under the following conditions: the flow rates of a silane gas and an $N_2O$ gas were 75 sccm and 1200 sccm, respectively, the power frequency was 13.56 MHz, the electric power was 120 W, the pressure was 70 Pa, the substrate temperature was 330° C.

A sample in which an approximately 200-nm-thick silicon nitride film which can be used as a second layer was formed over a silicon wafer was manufactured as Sample 4. The silicon nitride film was formed under the following conditions: the flow rates of a silane gas, an $N_2$ gas, and an $NH_3$ gas were 75 sccm, 5000 sccm, and 100 sccm, respectively, the power frequency was 13.56 MHz, the electric power was 1 kW, the pressure was 70 Pa, and the substrate temperature was 330° C.

A sample in which a silicon oxynitride film was formed over a silicon wafer and then a silicon nitride film was formed was manufactured as Sample 5. The silicon oxynitride film and the silicon nitride film were formed to the same thicknesses under the same conditions as Sample 3 and Sample 4.

A sample in which a silicon nitride film was formed over a silicon wafer and then a silicon oxynitride film was formed was manufactured as Sample 6. The silicon oxynitride film and the silicon nitride film were formed to the same thicknesses under the same conditions as Sample 3 and Sample 4.

[TDS Analysis Results]

Next, TDS analysis was performed on the four samples: Sample 3, Sample 4, Sample 5, and Sample 6.

Figure 28A:
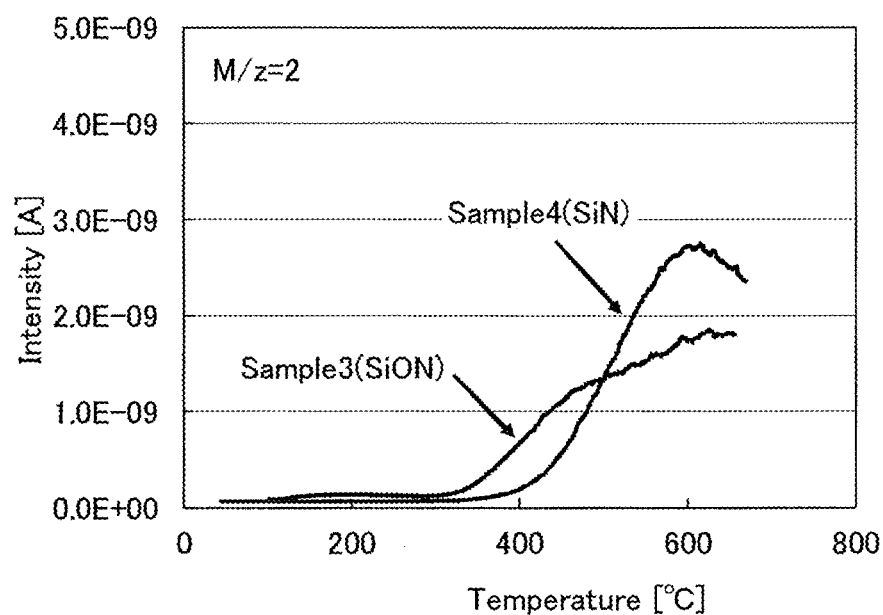
FIGS. 28A and 28B show TDS measurement results of Example 2.

FIG. 28A shows TDS measurement results of Sample 3 and Sample 4 detected at a mass-to-charge ratio (m/z) of 2. Here, all the spectra detected at a mass-to-charge ratio of 2 are supposed to be derived from hydrogen molecules.

According to FIG. 28A, nitrogen is released from the silicon oxynitride film (Sample 3) and the silicon nitride film (Sample 4) at 400° C. or higher. The number of the released hydrogen molecules in Sample 3 per unit volume, which is obtained from the spectrum in FIG. 28A, is approximately $2.53 \times 10^{20}$ molecules/cm$^3$ at temperatures ranging from 50° C. to 450° C. and is approximately $5.95 \times 10^{20}$ molecules/cm$^3$ at temperatures ranging from 50° C. to 550° C. The number of the released hydrogen molecules in Sample 4 is approximately $1.30 \times 10^{21}$ molecules/cm$^3$ at temperatures ranging from 50° C. to 450° C. and is approximately $3.52 \times 10^{21}$ molecules/cm$^3$ at temperatures ranging from 50° C. to 550° C.

Figure 28B:
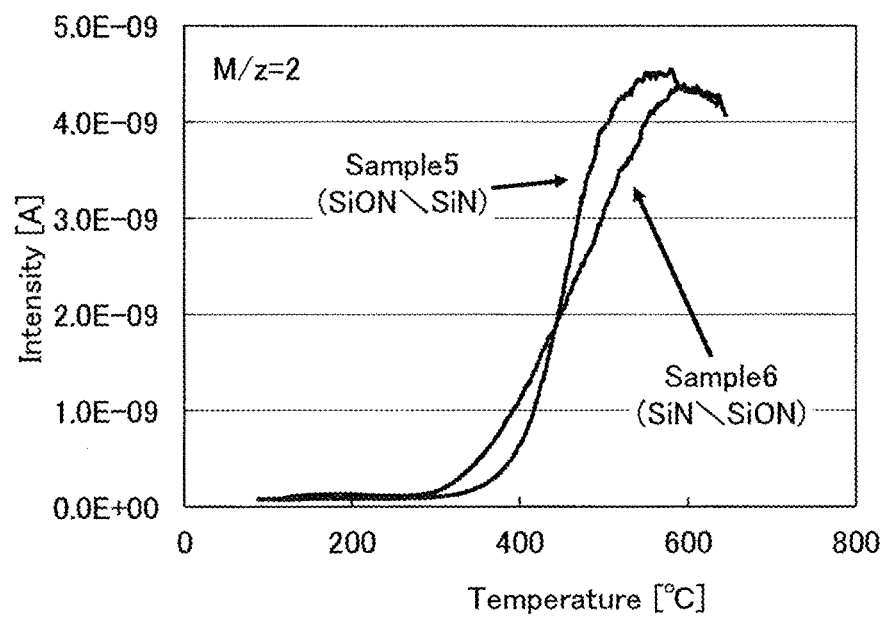

FIG. 28B shows TDS measurement results of Sample 5 and Sample 6 detected at a mass-to-charge ratio (m/z) of 2.

According to FIG. 28B, a large number of hydrogen molecules are released at around 400° C. in both samples regardless of the stack order of the silicon oxynitride film and the silicon nitride film. The number of the released hydrogen molecules in Sample 5 per unit volume, which is obtained from the spectrum in FIG. 28B, is approximately $9.50 \times 10^{19}$ molecules/cm$^3$ at temperatures ranging from 50° C. to 450° C. and is approximately $4.61 \times 10^{20}$ molecules/cm$^3$ at temperatures ranging from 50° C. to 550° C. The number of the released hydrogen molecules in Sample 6 is approximately $3.46 \times 10^{20}$ molecules/cm$^3$ at temperatures ranging from 50° C. to 450° C. and is approximately $1.02\times10^{21}$ molecules/cm$^3$ at temperatures ranging from 50° C. to 550° C.

The above results demonstrate that the stack including the silicon oxynitride film and the silicon nitride film, which can be used as the layer to be peeled, can release a large number of hydrogen molecules at 400° C. or higher.

Figure 29A:
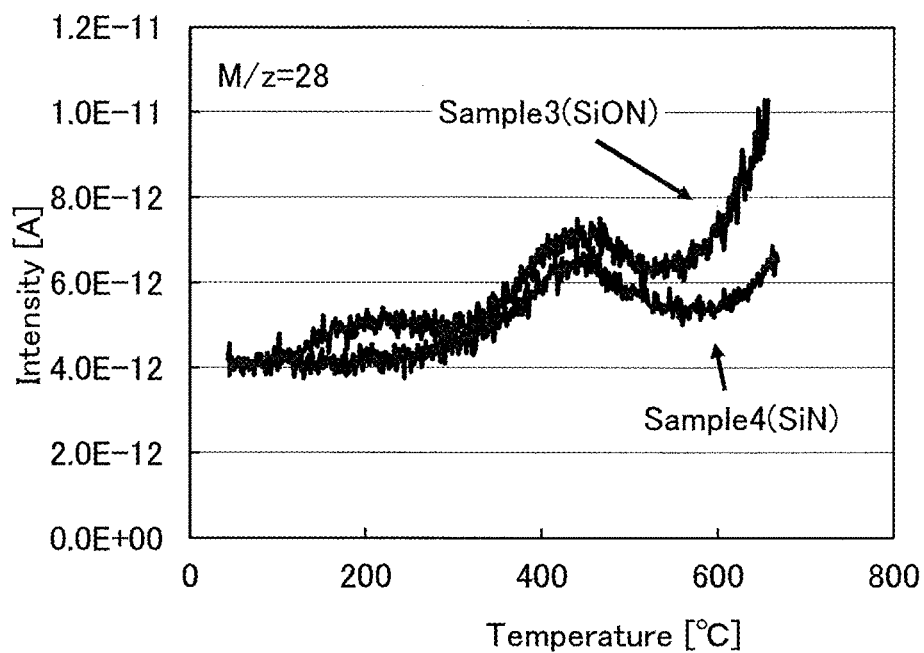
FIGS. 29A and 29B show TDS measurement results of Example 2.

FIG. 29A shows TDS measurement results of Sample 3 and Sample 4 detected at a mass-to-charge ratio (m/z) of 28. Here, all the spectra detected at a mass-to-charge ratio of 28 are supposed to be derived from nitrogen molecules.

According to FIG. 29A, the spectrum showing the release of nitrogen molecules from the silicon oxynitride film (Sample 3) has two peaks at around 200° C. and around 450° C. in a temperature range lower than 600° C. The spectrum showing the release from the silicon nitride film (Sample 4) has one peak at around 450° C. A large number of nitrogen molecules are released in a temperature range of 600° C. or higher in both samples.

The number of the released nitrogen molecules in Sample 3 per unit volume, which is obtained from the spectrum in FIG. 29A, is approximately $2.23\times10^{18}$ molecules/cm$^3$ at temperatures ranging from 50° C. to 450° C. and is approximately $2.64\times10^{18}$ molecules/cm$^3$ at temperatures ranging from 50° C. to 550° C. The number of the released nitrogen molecules in Sample 4 is approximately $6.86\times10^{18}$ molecules/cm$^3$ at temperatures ranging from 50° C. to 450° C. and is approximately $1.17\times10^{19}$ molecules/cm$^3$ at temperatures ranging from 50° C. to 550° C.

Figure 29B:
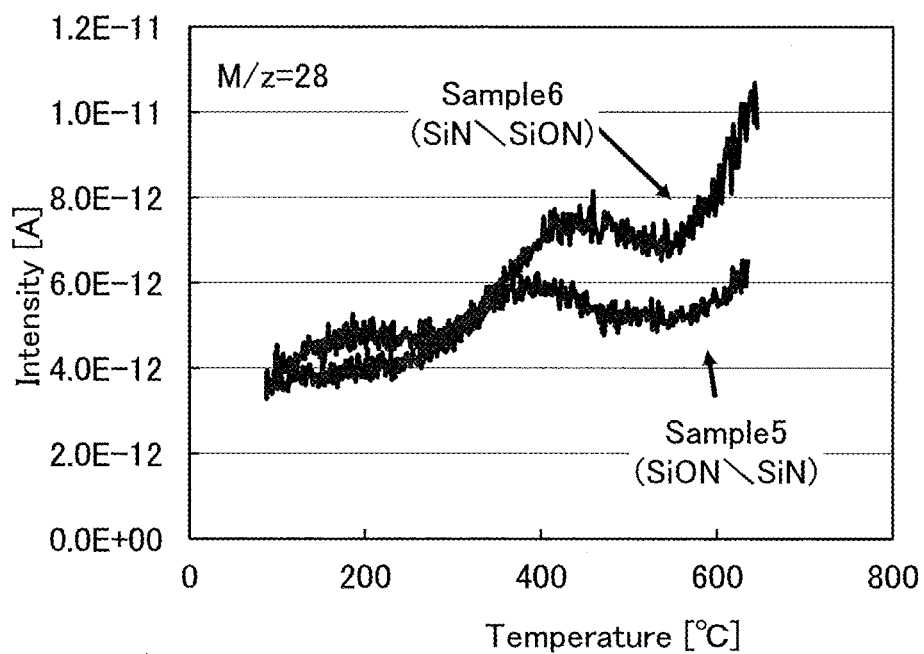

FIG. 29B shows TDS measurement results of Sample 5 and Sample 6 detected at a mass-to-charge ratio (m/z) of 28.

The spectrum showing the release of nitrogen molecules in Sample 6 has two peaks at around 200° C. and around 450° C. as in the case of Sample 3. Meanwhile, the spectrum showing the release of nitrogen molecules in Sample 5 has one peak at around 450° C. as in the case of Sample 4. These results demonstrate that the stack including the silicon oxynitride film and the silicon nitride film thereover enables the release of nitrogen molecules from the silicon oxynitride film to be blocked by the silicon nitride film.

The number of the released nitrogen molecules in Sample 5 per unit volume, which is obtained from the spectrum in FIG. 29B, is approximately $1.78\times10^{18}$ molecules/cm$^3$ at temperatures ranging from 50° C. to 450° C. and is approximately $1.91\times10^{18}$ molecules/cm$^3$ at temperatures ranging from 50° C. to 550° C. The number of the released nitrogen molecules in Sample 6 is approximately $1.61\times10^{18}$ molecules/cm$^3$ at temperatures ranging from 50° C. to 450° C. and is approximately $2.33\times10^{19}$ molecules/cm$^3$ at temperatures ranging from 50° C. to 550° C.

The above results demonstrate that a large amount of hydrogen and nitrogen can be supplied to the layer to be peeled side by forming, over the peeling layer, the stack including the silicon oxynitride film and the silicon nitride film thereover as the layer to be peeled and performing the heat treatment. In addition, the silicon nitride film which is the upper layer can inhibit the release of nitrogen molecules from the silicon oxynitride film to the outside, so that a large amount of nitrogen can be supplied efficiently to the layer to be peeled side.

The above is the description of this example.

Example 3

In this example, a description is given on the relationship between the film formation conditions of a silicon oxynitride film which can be used for a first layer and the peelability.

[Manufacture of Samples]

Here, samples were manufactured by using different flow rates of silane gases in the formation of silicon oxynitride films, and the peelability of the samples was examined.

The samples were each manufactured by the manufacturing method of Sample 1 described in Example 1 excluding the silane gas flow rate in the formation conditions of the silicon oxynitride film. Here, samples manufactured with silane gas flow rates of 50 sccm, 75 sccm, and 100 sccm are Sample 7, Sample 8, and Sample 9, respectively.

[Measurement of Peelability]

The force required for peeling in each of Sample 7, Sample 8, and Sample 9 was measured by the method described in Example 1.

Figure 30:
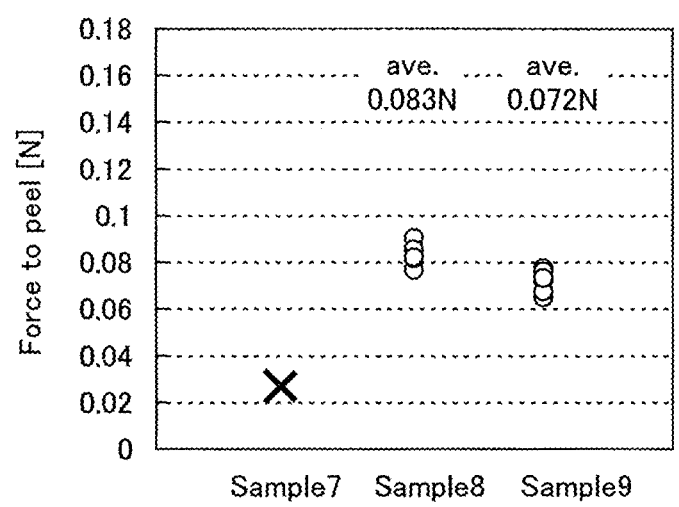
FIG. 30 shows measurement results of peelability of Example 3.

FIG. 30 shows measurement results of the force required for peeling at six points in each sample.

In Sample 7, peeling was not able to be performed at all the six points. In Sample 8, the average force required for peeling at the six points was 0.083 N, which indicates that Sample 8 had favorable peelability. In Sample 9, the force required for peeling is lower than that in Sample 8, and the average force required for peeling at the six points was 0.072 N.

The above results demonstrate that the formation conditions of the silicon oxynitride film which can be used for the first layer greatly affects the peelability. The following can be understood from the above results: by a reduction in the silane gas flow rate in the film formation, the hydrogen concentration of the silicon oxynitride film is reduced and the amount of hydrogen released from the silicon oxynitride film is reduced, resulting in the lower peelability.

The above is the description of this example.

EXPLANATION OF REFERENCE

101: support substrate, 102: peeling layer, 103: layer, 104: layer, 110: layer to be peeled, 111: oxide layer, 112: region, 121: substrate, 122: bonding layer, 131: substrate, 132: bonding layer, 150: layer, 151: tape, 153: support roller, 154: guide roller, 200: display device, 201: display portion, 202: scan line driver circuit, 203: signal line driver circuit, 204: external connection terminal, 205: FPC, 206: connector, 211: transistor, 212: transistor, 213: transistor, 214: transistor, 216: insulating layer, 217: insulating layer, 218: insulating layer, 219: insulating layer, 221: color filter, 222: black matrix, 233: electrode, 235: EL layer, 237: electrode, 240: light-emitting element, 241: oxide layer, 242: bonding layer, 243: layer, 244: layer, 245: layer to be peeled, 250: display device, 252: sealing layer, 253: substrate, 254: substrate, 401: glass substrate, 402: insulating layer, 403: peeling layer, 404: layer to be peeled, 405: layer, 406: flexible substrate, 407: groove, 411: support film, 412: protective sheet, 413: roller, 414: roller, 415: injector, 416: water droplet, 500: light-emitting device, 503: electrode, 507: electrode, 509: insulating layer, 600: separation tape, 601: carrier tape, 602: tape reel, 603: reel, 604: direction conversion roller, 605: press roller, 606: press roller, 607: roller, 608: tension roller, 609: carrier plate, 610: carrier plate, 611: wedge member, 612: wedge member, 613: reel, 614: drying unit, 620: ionizer, 621: ionizer, 622: ionizer, 631: guide roller, 632: guide roller, 633: guide roller, 634: guide roller, 635: guide roller, 636: guide roller, 637: table, 638: ionizer, 639: ionizer, 641: substrate load cassette, 642: substrate unload cassette, 643: transfer roller, 644: transfer roller, 645: transfer roller, 650: distance, 651: intersection, 652: intersection, 653: height of step, 654: distance, 7100:

mobile phone, 7101: housing, 7102: display portion, 7103: operation button, 7104: sending and receiving device, 7200: lighting device, 7201: stage, 7202: light-emitting portion, 7203: operation switch, 7210: lighting device, 7212: light-emitting portion, 7220: lighting device, 7222: light-emitting portion, 7400: mobile phone, 7401: housing, 7402: display portion, 7403: operation button, 7404: external connection port, 7405: speaker, and 7406: microphone.

This application is based on Japanese Patent Application serial no. 2013-031401 filed with the Japan Patent Office on Feb. 20, 2013, the entire contents of which are hereby incorporated by reference.

The invention claimed is:

1. A semiconductor device comprising:
 a bonding layer over a flexible substrate;
 an oxide layer over the bonding layer, the oxide layer comprising tungsten oxide;
 a first layer over the oxide layer, the first layer comprising silicon oxynitride;
 a second layer over the first layer, the second layer comprising silicon nitride; and
 a transistor over the second layer,
 wherein each of a concentration of nitrogen and a concentration of hydrogen in the first layer measured by secondary ion mass spectrometry decreases from the second layer side to the oxide layer side.

2. The semiconductor device according to claim 1, wherein the oxide layer comprises a region whose nitrogen content measured by secondary ion mass spectrometry is higher than a nitrogen content of the first layer and a region whose hydrogen content measured by secondary ion mass spectrometry is higher than a hydrogen content of the first layer.

3. The semiconductor device according to claim 1, wherein a decrease in the concentration of nitrogen and a decrease in the concentration of hydrogen on the oxide layer side are larger than those on the second layer side.

4. The semiconductor device according to claim 1, further comprising:
 a compound comprising tungsten and nitrogen in the oxide layer.

5. The semiconductor device according to claim 1, wherein the oxide layer comprises $WO_3$ and $WO_2$.

* * * * *